US012663717B2

(12) United States Patent
Yamamoto et al.

(10) Patent No.: US 12,663,717 B2
(45) Date of Patent: Jun. 23, 2026

(54) PLANARIZING AGENT FOR FORMING ORGANIC FILM, COMPOSITION FOR FORMING ORGANIC FILM, METHOD FOR FORMING ORGANIC FILM, AND PATTERNING PROCESS

(71) Applicant: SHIN-ETSU CHEMICAL CO., LTD., Tokyo (JP)

(72) Inventors: Yasuyuki Yamamoto, Joetsu (JP); Kenta Ishiwata, Joetsu (JP); Toshiharu Yano, Joetsu (JP); Tsutomu Ogihara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 425 days.

(21) Appl. No.: 18/173,344

(22) Filed: Feb. 23, 2023

(65) Prior Publication Data

US 2023/0274936 A1 Aug. 31, 2023

(30) Foreign Application Priority Data

Feb. 25, 2022 (JP) ................................. 2022-027779

(51) Int. Cl.
*G03F 7/09* (2006.01)
*C09G 1/16* (2006.01)
(Continued)

(52) U.S. Cl.
CPC ............... *G03F 7/094* (2013.01); *C09G 1/16* (2013.01); *G03F 7/0045* (2013.01);
(Continued)

(58) Field of Classification Search
CPC ......... G03F 7/0048; G03F 7/094; H10P 95/08
See application file for complete search history.

(56) References Cited

U.S. PATENT DOCUMENTS 2,956,978 A * 10/1960 Ingwalson .............. C08L 27/06 560/112
4,417,021 A * 11/1983 Nakamura .............. C08L 67/02 525/425
(Continued)

FOREIGN PATENT DOCUMENTS

JP H06-118651 A 4/1994
JP H10-148950 A 6/1998
(Continued)

OTHER PUBLICATIONS

Jul. 18, 2023 Extended Search Report issued in European Patent Application No. 23158002.8.
(Continued)

*Primary Examiner* — Sophie Hon
*Assistant Examiner* — Sow-Fun Hon
(74) *Attorney, Agent, or Firm* — Oliff PLC

(57) ABSTRACT

The present invention is a planarizing agent for forming an organic film, including an aromatic-group-containing compound having a molecular weight represented by a molecular formula of 200 to 500, wherein a blended composition that includes the planarizing agent and a preliminary composition containing an organic film-forming resin and a solvent, and having a complex viscosity of 1.0 Pa·s or more in a temperature range of 175° C. or higher has a temperature range in which a complex viscosity of the blended composition is less than 1.0 Pa·s in a temperature range of 175° C. or higher. This provides a planarizing agent for forming an organic film to yield a composition for forming an organic film having a high planarizing ability; a composition for forming an organic film containing this planarizing agent; a method for forming an organic film using this composition; and a patterning process.

14 Claims, 4 Drawing Sheets

(51) Int. Cl.

| | |
|---|---|
| ***G03F 7/004*** | (2006.01) |
| ***G03F 7/025*** | (2006.01) |
| ***H10P 50/00*** | (2026.01) |
| ***H10P 50/24*** | (2026.01) |
| ***H10P 50/26*** | (2026.01) |
| ***H10P 50/28*** | (2026.01) |
| ***H10P 76/20*** | (2026.01) |
| ***H10P 76/40*** | (2026.01) |
| ***H10P 95/00*** | (2026.01) |

(52) U.S. Cl.
CPC ............ *G03F 7/0048* (2013.01); *G03F 7/025* (2013.01); *G03F 7/091* (2013.01); *H10P 50/242* (2026.01); *H10P 50/266* (2026.01); *H10P 50/283* (2026.01); *H10P 50/287* (2026.01); *H10P 50/692* (2026.01); *H10P 50/695* (2026.01); *H10P 50/71* (2026.01); *H10P 50/73* (2026.01); *H10P 76/2042* (2026.01); *H10P 76/2043* (2026.01); *H10P 76/4085* (2026.01); *H10P 95/08* (2026.01)

(56) References Cited

U.S. PATENT DOCUMENTS

| | | | |
|---|---|---|---|
| 4,576,902 | A | 3/1986 | Saenger et al. |
| 2002/0106909 | A1 | 8/2002 | Kato et al. |
| 2005/0255712 | A1 | 11/2005 | Kato et al. |
| 2006/0019195 | A1 | 1/2006 | Hatakeyama et al. |
| 2006/0204891 | A1 | 9/2006 | Hatakeyama |
| 2007/0122740 | A1 | 5/2007 | Hatakeyama et al. |
| 2007/0275325 | A1 | 11/2007 | Hatakeyama et al. |
| 2008/0038662 | A1 | 2/2008 | Hatakeyama et al. |
| 2009/0274978 | A1 | 11/2009 | Ohashi et al. |
| 2010/0099044 | A1 | 4/2010 | Hatakeyama et al. |
| 2011/0311920 | A1 | 12/2011 | Kinsho et al. |
| 2012/0077345 | A1 | 3/2012 | Saito et al. |
| 2012/0184103 | A1 | 7/2012 | Ogihara et al. |
| 2012/0252218 | A1 | 10/2012 | Kori et al. |
| 2013/0280913 | A1 | 10/2013 | Shinjo et al. |
| 2014/0363768 | A1 | 12/2014 | Kinsho et al. |
| 2016/0160026 | A1 | 6/2016 | Li et al. |
| 2017/0183531 | A1 | 6/2017 | Kori et al. |
| 2017/0184968 | A1 | 6/2017 | Kori et al. |
| 2018/0011405 | A1 | 1/2018 | Watanabe et al. |
| 2019/0064659 | A1 | 2/2019 | Kori et al. |
| 2019/0134212 | A1 | 5/2019 | Britto et al. |
| 2021/0145717 | A1 | 5/2021 | Mentlik et al. |

FOREIGN PATENT DOCUMENTS

| | | | | | |
|---|---|---|---|---|---|
| JP | 2002-334869 | A | | 11/2002 | |
| JP | 2004-205685 | A | | 7/2004 | |
| JP | 2004-264710 | A | | 9/2004 | |
| JP | 2005-043471 | A | | 2/2005 | |
| JP | 2005-128509 | A | | 5/2005 | |
| JP | 2005-250434 | A | | 9/2005 | |
| JP | 2006-259249 | A | | 9/2006 | |
| JP | 2006-259482 | A | | 9/2006 | |
| JP | 2006-293298 | A | | 10/2006 | |
| JP | 2007-171895 | A | | 7/2007 | |
| JP | 2007-199653 | A | | 8/2007 | |
| JP | 2007-293294 | A | | 11/2007 | |
| JP | 2007-316282 | A | | 12/2007 | |
| JP | 2008-65303 | A | | 3/2008 | |
| JP | 2008-274250 | A | | 11/2008 | |
| JP | 2009-14816 | A | | 1/2009 | |
| JP | 2009-269953 | A | | 11/2009 | |
| JP | 4355943 | B2 | | 11/2009 | |
| JP | 2010-122656 | A | | 6/2010 | |
| JP | 2012-1687 | A | | 1/2012 | |
| JP | 2012-77295 | A | | 4/2012 | |
| JP | 2012-145897 | A | | 8/2012 | |
| JP | 2012-214720 | A | | 11/2012 | |
| JP | 2014-29435 | A | | 2/2014 | |
| JP | 2017-119671 | A | | 7/2017 | |
| JP | 2018-013768 | A | | 1/2018 | |
| JP | 2019-44022 | A | | 3/2019 | |
| JP | 7690417 | B2 | * | 6/2025 | .............. H10P 95/08 |
| KR | 10-2018-0006313 | A | | 1/2018 | |
| KR | 102815273 | B1 | * | 5/2025 | .............. H10P 95/08 |
| TW | I867440 | B | * | 12/2024 | .............. H10P 95/08 |
| WO | 2004066377 | A1 | | 8/2004 | |
| WO | 2010147155 | A1 | | 12/2010 | |
| WO | 2012077640 | A1 | | 6/2012 | |
| WO | 2012176767 | A1 | | 12/2012 | |

OTHER PUBLICATIONS

Dec. 3, 2024 Office Action issued in Japanese Patent Application No. 2022-027779.

Jul. 22, 2024 Office Action issued in Korean Patent Application No. 10-2023-0024328.

Dec. 9, 2025 Office Action issued in European Patent Application No. 23158002.8.

* cited by examiner

[FIG. 1]
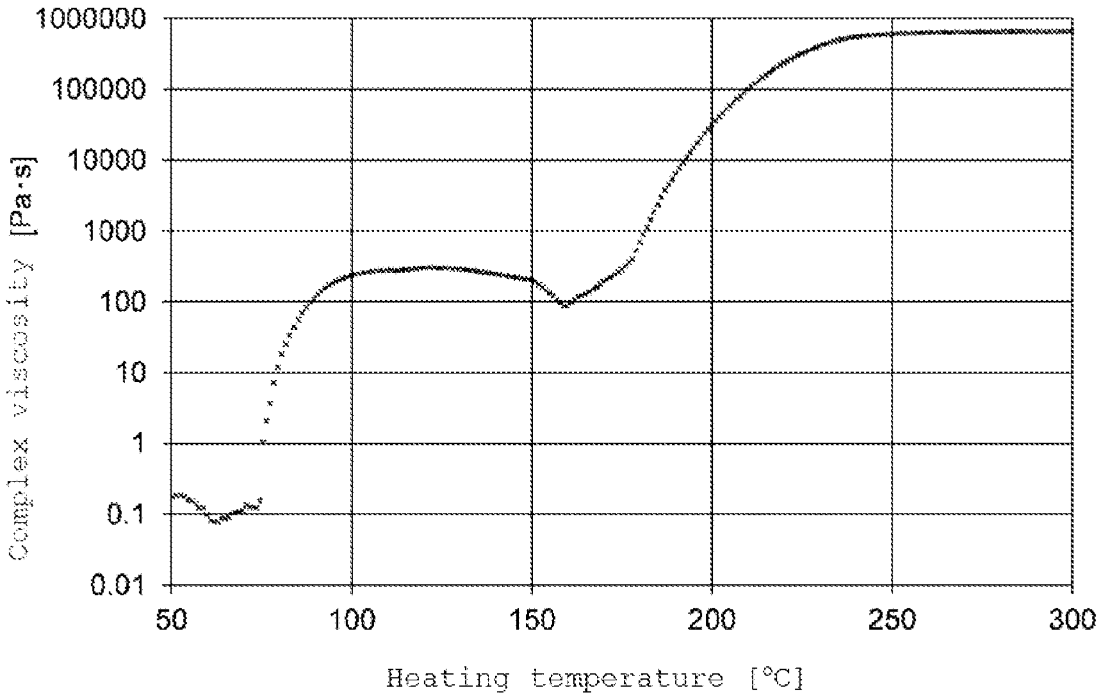
[FIG. 2]
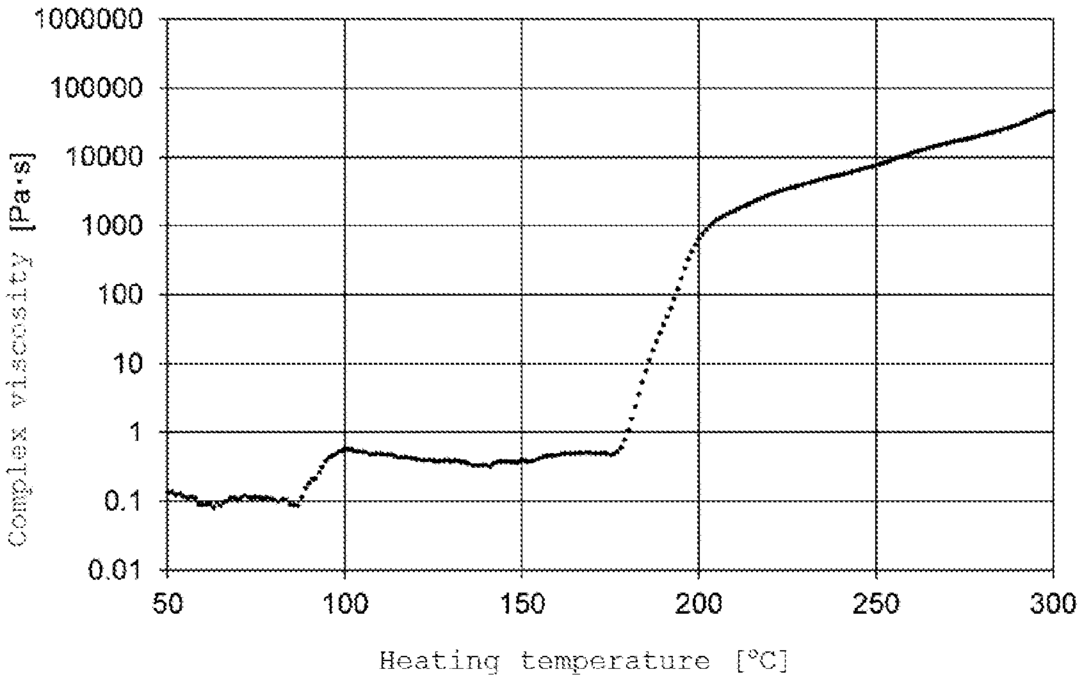

[FIG. 3]
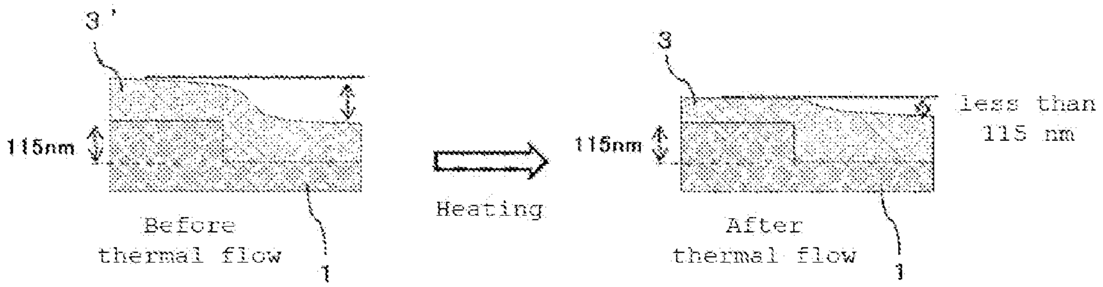
[FIG. 4]
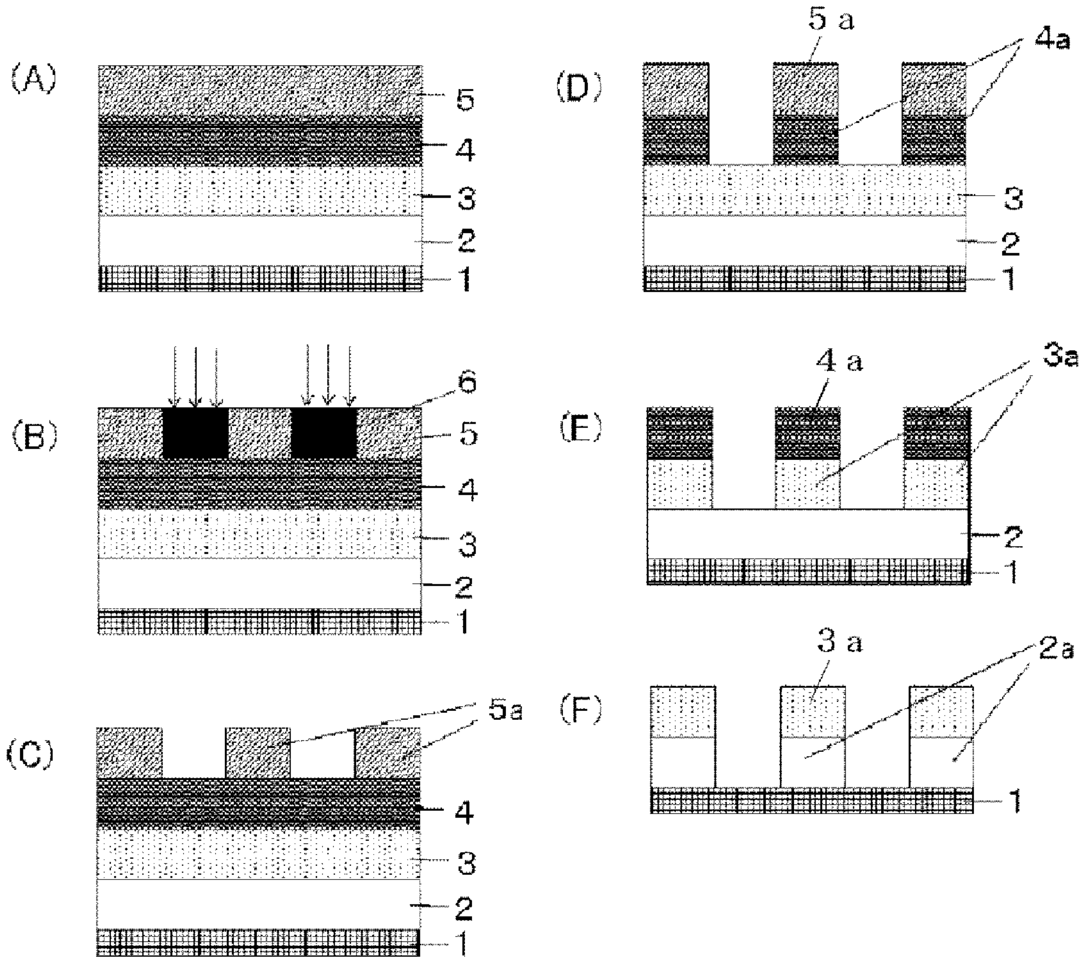

[FIG. 5]
(G)
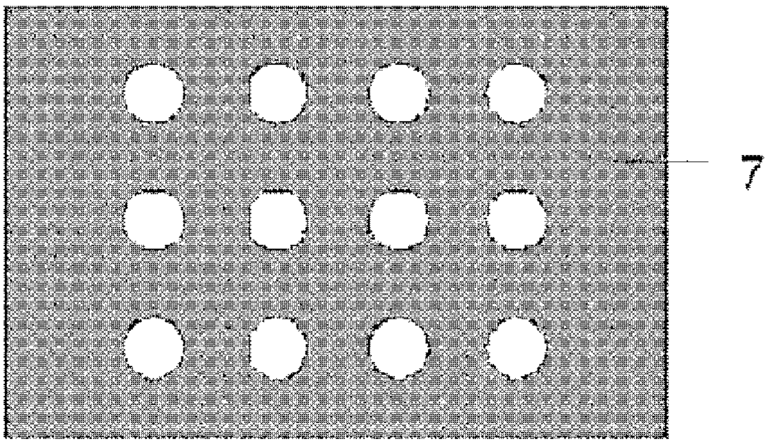
(H)
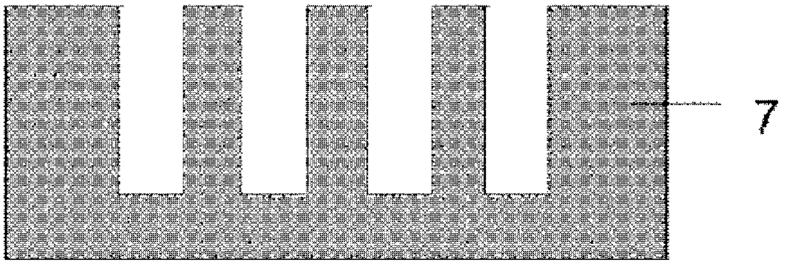
(I)
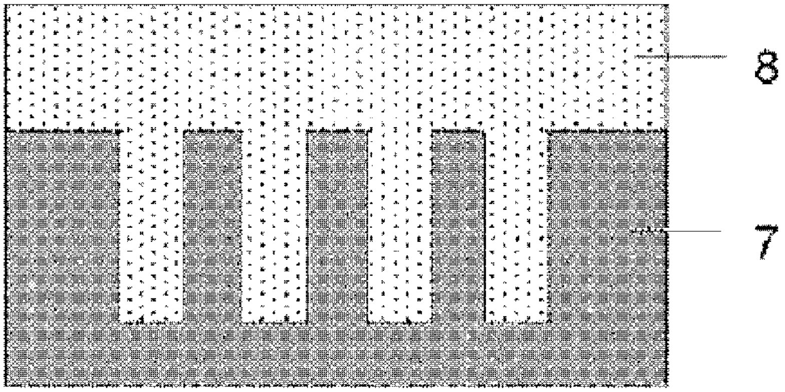

[FIG. 6]
(J)
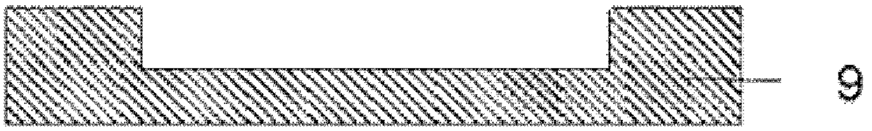
(K)
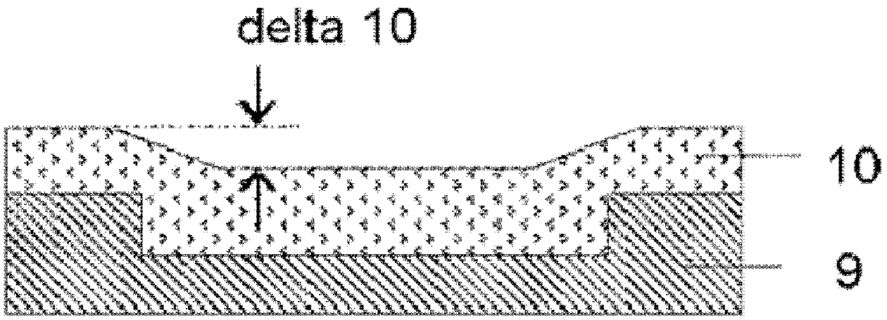

PLANARIZING AGENT FOR FORMING ORGANIC FILM, COMPOSITION FOR FORMING ORGANIC FILM, METHOD FOR FORMING ORGANIC FILM, AND PATTERNING PROCESS

TECHNICAL FIELD

The present invention relates to: a planarizing agent for forming an organic film for a multilayer resist for fine processing in semiconductor device manufacturing, etc. and an organic film for planarizing in semiconductor device manufacturing, etc.; a composition for forming an organic film comprising the compound; a method for forming an organic film using the composition; and a patterning process using the composition.

BACKGROUND ART

In recent requirement of a finer pattern rule with higher integration and higher speed of semiconductor devices, various technical developments have been made in lithography using light exposure, used as a common technology at present, about how finer and more precise pattern is processed relative to the used light source.

As the light source for lithography employed in the resist pattern formation, light exposure using a light source of g-line (436 nm) or i-line (365 nm) of a mercury lamp is widely adopted for portions having a lower integration degree. Meanwhile, lithography using KrF excimer laser (248 nm) and ArF excimer laser (193 nm), which have a shorter wavelength, has been practically used for portions having a higher integration degree requiring finer patterns. In the latest generation requiring further finer pattern, lithography with extreme ultraviolet ray (EUV, 13.5 nm) is approaching the practical use.

It is well known that in a monolayer resist method, which is typically employed as a resist patterning process, as the thinning of resist patterns progresses as described above, the ratio of a pattern height to a pattern line width (aspect ratio) is increased, and pattern collapse occurs due to the surface tension of a developer during development. In this situation, it is known that a multilayer resist method, in which a pattern is formed by laminating films having different dry etching properties, is excellent in forming a pattern with a high aspect ratio on an uneven substrate. There have been developed: a two-layer resist method in which a photoresist layer made of a silicon-containing photosensitive polymer is combined with an underlayer made of an organic polymer containing carbon, hydrogen, and oxygen as main constituent elements, for example, a novolak polymer (Patent Document 1 etc.); and a three-layer resist method in which a photoresist layer made of an organic photosensitive polymer used in a monolayer resist method is combined with an underlayer made of a silicon-based polymer or a silicon-based CVD film, and with an organic layer made of an organic polymer (Patent Document 2 etc.).

This three-layer resist method includes, for example, the following steps: an organic film made of a novolak resin or the like is formed as a resist underlayer film on a substrate to be processed; a silicon-containing resist middle layer film is formed as a resist middle layer film on the resist underlayer film; a usual organic photoresist film is formed as a resist upper layer film on the resist middle layer film. Since the organic resist upper layer film exhibits a favorable etching selectivity ratio relative to the silicon-containing resist middle layer film when dry etching is performed with fluorine-based gas plasma, the resist pattern can be transferred to the silicon-containing resist middle layer film by employing dry etching with fluorine-based gas plasma. According to this method, even if a resist composition to be used has difficulty in forming a pattern with a sufficient film thickness for directly processing the substrate to be processed or has insufficient dry etching resistance for processing the substrate, the pattern can be transferred to the silicon-containing resist middle layer film. Moreover, the subsequent dry etching with oxygen-based gas plasma enables the pattern to be transferred into the organic film made of a novolak resin or the like having a sufficient dry etching resistance for processing the substrate.

Although many techniques relating to the aforementioned organic underlayer have been known (for example, described in Patent Document 3), excellent filling ability and planarizing ability have been required in addition to the dry-etching characteristics in recent years. For example, in case where the base substrate to be processed has fine pattern structures, such as holes and trenches, filling ability for filling the pattern with the film without leaving a void is required. In case where the base substrate to be processed has steps or where a pattern-dense portion and a pattern-less region are present on one wafer, the underlayer film is required to planarize the film surface. Planarization of the underlayer film surface can inhibit change in film thickness of the intermediate layer and photoresist formed thereon and can expand focus margin of the lithography and process margin of processing the substrate to be processed thereafter.

As a method for improving the planarizing ability of the underlayer film material, proposed is a method of adding a solvent having a high boiling point (Patent Document 4). However, when a wide pattern region is present on the substrate to be processed, it is difficult to planarize steps between such a pattern region and a pattern-less region. These methods are not satisfactory.

CITATION LIST

Patent Literature

Patent document 1: JP H6-118651 A

Patent document 2: JP 4355943 B

Patent document 3: JP 2004-205685 A

Patent document 4: JP 2017-119671 A

SUMMARY OF INVENTION

Technical Problem

The present invention has been made in view of the above-described circumstances. An object of the present invention is to provide: a planarizing agent for forming an organic film to yield a composition for forming an organic film having a high planarizing ability; a composition for forming an organic film comprising this planarizing agent; a method for forming an organic film using this composition; and a patterning process.

Solution to Problem

To solve the above problem, the present invention provides a planarizing agent for forming an organic film, comprising an aromatic-group-containing compound having a molecular weight represented by a molecular formula of 200 to 500, wherein when the planarizing agent for forming an organic film is blended in a preliminary composition containing a resin for forming an organic film and a solvent, the preliminary composition having a complex viscosity of 1.0 Pa·s or more in a temperature range of 175° C. or higher, the blended composition has a temperature range in which a complex viscosity of the blended composition is less than 1.0 Pa·s in a temperature range of 175° C. or higher.

Such a planarizing agent for forming an organic film has good thermal flowability during the heating film formation. Thus, the film can be highly planarized. Since being an aromatic-group-containing compound, such a planarizing agent hardly causes formation failure on the organic film.

The planarizing agent for forming an organic film preferably has a weight reduction rate from 30° C. to 190° C. of less than 15%, and has a weight reduction rate from 30° C. to 350° C. of 98% or more.

Such a planarizing agent for forming an organic film has good thermal flowability during the heating film formation, and further reduces a residue of the planarizing agent for forming an organic film in the film after the heating film formation. Thus, the film can be highly planarized without impairing the etching resistance of the resin for forming an organic film.

The planarizing agent for forming an organic film is preferably an aromatic-group-containing compound having an oxygen atom.

Such a planarizing agent for forming an organic film hardly causes film formation failure on the substrate to be processed.

The aromatic ring that the aromatic-group-containing compound has is more preferably a benzene ring.

Such a planarizing agent for forming an organic film has excellent solubility in the solvent because the aromatic ring that the aromatic-group-containing compound has is the benzene ring.

The planarizing agent for forming an organic film is more preferably a compound having: two or more benzene rings; or one benzene ring and a structure represented by the following general formula (A), (A)

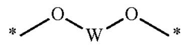

wherein "*" represents a bonding position; and W represents an alkylene group having 1 to 4 carbon atoms.

Such a planarizing agent for forming an organic film has further excellent solubility in the solvent.

The planarizing agent for forming an organic film is preferably one or more compounds selected from the general formulae (I) to (III), (I)

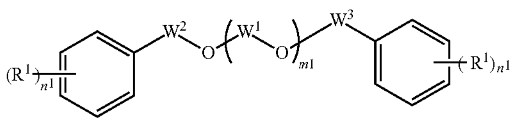

wherein $R^1$ each independently represents a hydrogen atom, a hydroxy group, or an optionally substituted organic group having 1 to 10 carbon atoms; $W^1$ represents a phenylene group or a divalent group represented by the following general formula (I-1); $W^2$ and $W^3$ represent a single bond or any one divalent group represented by the following general formula (I-2); "$m^1$" represents an integer of 1 to 10; and "$n^1$" each independently represents an integer of 0 to 5, (I-1)

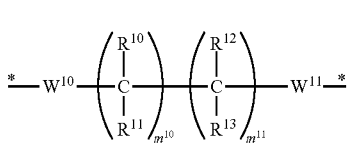

wherein "*" represents a bonding position; $R^{10}$, $R^{11}$, $R^{12}$, and $R^{13}$ represent a hydrogen atom, a hydroxy group, or an organic group having 1 to 10 carbon atoms; $W^{10}$ and $W^{11}$ each independently represent a single bond or a carbonyl group; and "$m^{10}$" and "$m^{11}$" represent an integer of 0 to 10, and $m^{10}+m^{11} \geq 1$, (I-2)

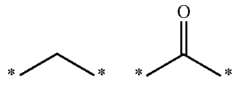

wherein "*" represents a bonding position, (II)

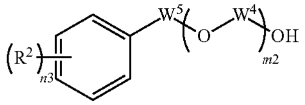

wherein $R^2$ each independently represents a hydrogen atom or an optionally substituted organic group having 1 to 10 carbon atoms; $W^4$ represents a divalent group represented by the following general formula (II-1); $W^5$ represents a single bond or any one divalent group represented by the following general formula (II-2); "$m^2$" represents an integer of 3 to 10; and "$n^3$" represents an integer of 0 to 5, (II-1)

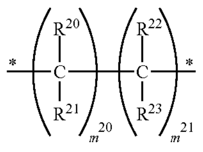

wherein "*" represents a bonding position; $R^{20}$, $R^{21}$, $R^{22}$, and $R^{23}$ represent a hydrogen atom, a hydroxy group, or an organic group having 1 to 10 carbon atoms; "$m^{20}$" and "$m^{21}$" represent an integer of 0 to 10; and $m^{20}+m^{21} \geq 1$, (II-2)

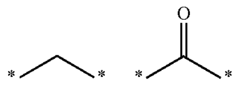

wherein "*" represents a bonding position, (III)

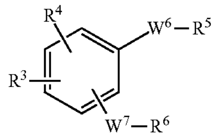

wherein $R^3$ and $R^4$ represent a hydrogen atom, a hydroxy group, or an optionally substituted organic group having 1 to 10 carbon atoms, and $R^3$ and $R^4$ are optionally bonded to form a cyclic structure; $R^5$ and $R^6$ represent an organic group having 1 to 10 carbon atoms, and $R^5$ represents a group having at least one of an aromatic ring or a divalent group represented by the following general formula (III-1); and $W^6$ and $W^7$ represent a single bond or any one divalent group represented by the following general formula (III-2), and at least one of $W^6$ and $W^7$ represents the divalent group represented by the any one following general formula (III-2), (III-1)

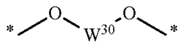

wherein "*" represents a bonding position; and $W^{30}$ represents an organic group having 1 to 4 carbon atoms, and (III-2)

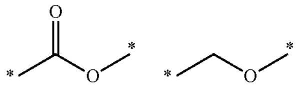

wherein "*" represents a bonding position.

Containing such a compound provides excellent compatibility with the resin for forming an organic film to further inhibit film formation failure such as a pinhole during the film formation.

The planarizing agent for forming an organic film as above sufficiently achieves the effect of the present invention.

The present invention also provides a composition for forming an organic film, the composition comprising: a resin for forming an organic film; the above inventive planarizing agent for forming an organic film; and a solvent.

Such a composition for forming an organic film yields a high planarizing ability.

The resin for forming an organic film preferably has an aromatic skeleton.

Such a composition for forming an organic film can provide an organic film having excellent etching resistance and optical characteristics.

Furthermore, the resin for forming an organic film preferably has at least one skeleton selected from the group the group consisting of benzene, naphthalene, and fluorene.

Such a composition for forming an organic film is preferable because it provides an organic film having excellent etching resistance and optical characteristics, and also excellent heat resistance.

The composition for forming an organic film as above sufficiently achieves the effect of the present invention.

The present invention also provides a method for forming an organic film functioning as an organic planarizing film used in a semiconductor device manufacturing process, comprising: applying the above composition for forming an organic film on a substrate to be processed by spin-coating; and heat-treating the substrate coated with the composition for forming an organic film within a range of a temperature of 100° C. or higher and 600° C. or lower for 10 to 600 seconds to form a cured film.

The present invention also provides a method for forming an organic film functioning as an organic planarizing film used in a semiconductor device manufacturing process, comprising: applying the above composition for forming an organic film on a substrate to be processed by spin-coating; heat-treating the substrate coated with the composition for forming an organic film within a range of a temperature of 100° C. or higher and 350° C. or lower for 10 to 600 seconds; and further heat-treating the substrate within a range of a temperature of 100° C. or higher and 600° C. or lower for 10 to 600 seconds to form a cured film.

As described above, the inventive method for forming an organic film may perform a one-step baking to promote the planarization with the thermal flow, and the crosslinking reaction. Alternatively, a two-step baking may be performed to proceed the planarization with the thermal flow in the first baking, and to proceed the crosslinking reaction in the second baking.

In this case, a substrate to be processed having a structure or step with 20 nm or more in height is preferably used as the substrate to be processed.

The inventive composition for forming an organic film, which has excellent planarizing ability, is particularly useful for forming a plane organic film on such a substrate to be processed.

Furthermore, the present invention provides a patterning process comprising: forming an organic film on a body to be processed by using the above composition for forming an organic film; forming a resist intermediate film on the organic film by using a resist intermediate film material having a silicon atom; forming a resist upper layer film on the resist intermediate film by using a resist upper layer film material composed of a photoresist composition; forming a circuit pattern in the resist upper layer film; transferring the pattern to the resist intermediate film by etching while using the resist upper layer film having the formed circuit pattern as a mask; transferring the pattern to the organic film by etching while using the resist intermediate film having the transferred pattern as a mask; and further transferring the pattern to the body to be processed by etching while using the organic film having the transferred pattern as a mask.

The present invention also provides a patterning process comprising: forming an organic film on a body to be processed by using the above composition for forming an organic film; forming a resist intermediate film on the organic film by using a resist intermediate film material having a silicon atom; forming an organic anti-reflective film or an adhesive film on the resist intermediate film; forming a resist upper layer film on the organic anti-reflective film or the adhesive film by using a resist upper layer film material composed of a photoresist composition; forming a circuit pattern in the resist upper layer film; transferring the pattern to the organic anti-reflective film or the adhesive film, and the resist intermediate film by etching while using the resist upper layer film having the formed circuit pattern as a mask; transferring the pattern to the organic film by etching while using the resist intermediate film having the transferred pattern as a mask; and further transferring the pattern to the body to be processed by etching while using the organic film having the transferred pattern as a mask.

The present invention also provides a patterning process comprising: forming an organic film on a body to be processed by using the above composition for forming an organic film; forming an inorganic hard mask selected from a silicon oxide film, a silicon nitride film, and a silicon oxynitride film on the organic film; forming a resist upper layer film on the inorganic hard mask by using a resist upper layer film material composed of a photoresist composition; forming a circuit pattern in the resist upper layer film; transferring the pattern to the inorganic hard mask by etching while using the resist upper layer film having the formed circuit pattern as a mask; transferring the pattern to the organic film by etching while using the inorganic hard mask having the transferred pattern as a mask; and further transferring the pattern to the body to be processed by etching while using the organic film having the transferred pattern as a mask.

The present invention also provides a patterning process comprising: forming an organic film on a body to be processed by using the above composition for forming an organic film; forming an inorganic hard mask selected from a silicon oxide film, a silicon nitride film, and a silicon oxynitride film on the organic film; forming an organic anti-reflective film or an adhesive film on the inorganic hard mask; forming a resist upper layer film on the organic anti-reflective film or the adhesive film by using a resist upper layer film material composed of a photoresist composition; forming a circuit pattern in the resist upper layer film; transferring the pattern to the organic anti-reflective film or the adhesive film, and the inorganic hard mask by etching while using the resist upper layer film having the formed circuit pattern as a mask; transferring the pattern to the organic film by etching while using the inorganic hard mask having the transferred pattern as a mask; and further transferring the pattern to the body to be processed by etching while using the organic film having the transferred pattern as a mask.

As described above, the inventive composition for forming an organic film can be suitably used for various patterning processes such as: the three-layer resist process using the silicon-containing resist intermediate film or the inorganic hard mask; and the four-layer resist process using the organic anti-reflective film or the adhesive film in addition to the above layers. According to the inventive patterning process, the circuit pattern in the resist upper layer film can be transferred to and formed in the body to be processed with high precision.

The inorganic hard mask is preferably formed by a CVD method or an ALD method.

In the inventive patterning process, the inorganic hard mask can be formed by such a method, for example.

The circuit pattern is preferably formed by a lithography using light having a wavelength of 10 nm or more and 300 nm or less, a direct writing with electron beam, nanoimprinting, or a combination thereof.

The circuit pattern is preferably developed with an alkaline development or an organic solvent.

In the inventive patterning process, such a forming means and developing means of the circuit pattern can be suitably used.

The body to be processed is preferably a semiconductor device substrate or a film formed on the semiconductor device substrate which is any of a metal film, a metal carbide film, a metal oxide film, a metal nitride film, a metal oxycarbide film, and a metal oxynitride film.

A metal constituting the body to be processed is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

According to the inventive patterning process, the body to be processed as above can be processed to form a pattern.

Advantageous Effects of Invention

As described above, the present invention can provide the planarizing agent for forming an organic film imparting high planarizing ability and the composition for forming an organic film having the high planarizing ability. Since having the excellent planarizing ability and also having excellent other characteristics such as heat resistance and etching resistance, the inventive composition for forming an organic film is extremely useful for a material for an organic film or a planarizing material for semiconductor device manufacturing process used for a multilayer resist process such as, for example: a two-layer resist process; a three-layer resist process using a silicon-containing resist intermediate film or an inorganic hard mask; or a four-layer resist process using a silicon-containing resist intermediate film, an inorganic hard mask, an organic anti-reflective film, or an adhesive film. In addition, the inventive method for forming an organic film can form extremely plane organic film having sufficient resistance against an organic solvent on a substrate to be processed. According to the inventive patterning process, a fine pattern can be formed with high precision in the body to be processed by the multilayer resist process.

BRIEF DESCRIPTION OF DRAWINGS

FIG. 1 is a graph indicating a complex viscosity of a preliminary composition for forming an organic film before blended with the inventive planarizing agent for forming an organic film. The complex viscosity is measured within a range of 50° C. or higher and 300° C. or lower.

FIG. 2 is a graph indicating a complex viscosity of an example of the inventive composition for forming an organic film (UDL-1) measured within a range of 50° C. or higher and 300° C. or lower.

FIG. 3 is an explanatory view on planarizing ability of the present invention.

FIG. 4 is an explanatory view on an example of the inventive patterning process with a three-layer resist process.

FIG. 5 is an explanatory view on a method for evaluating filling ability in Examples.

FIG. 6 is an explanatory view on a method for evaluating planarizing ability in Examples.

DESCRIPTION OF EMBODIMENTS

As described above, there have been demands for the developments of a composition for forming an organic film having high filling/planarizing ability and a compound for forming an organic film useful for such a composition.

An organic film is commonly formed by: dissolving a resin for forming an organic film in an organic solvent to prepare a composition; applying this composition on a substrate in which semiconductor device structures, wiring, etc. are formed; and baking the coating film. The coating film is formed along a geometry of the structure on the substrate immediately after applying the composition, but baking the coating film evaporates almost entire organic solvent until the curing. The roughness geometry immediately after the applying is planarized by thermal flow of the resin for forming an organic film remained on the substrate. Meanwhile, a resin having high etching resistance typically has poor thermal flowability, and difficult to planarize the roughness geometry. A resin having high thermal flowability, which has a flexible and low carbon-density structure such as an alkyl chain structure, has poor etching resistance. Thus, it is difficult to achieve both the etching resistance and the planarizing ability.

The present inventors have earnestly further made investigation, and found that blending a planarizing agent for forming an organic film with a composition for forming an organic film yields the composition having improved thermal flowability and high planarizing ability. The planarizing agent comprises: an aromatic-group-containing compound having a molecular weight represented by a molecular formula of 200 to 500, wherein when the planarizing agent for forming an organic film is blended in a preliminary composition containing a resin for forming an organic film and a solvent, the preliminary composition having a complex viscosity of 1.0 Pa·s or more in a temperature range of 175° C. or higher, the blending generates a temperature range in which a complex viscosity is less than 1.0 Pa·s in a temperature range of 175° C. or higher. This finding has led to the completion of the present invention.

Specifically, the present invention is a planarizing agent for forming an organic film, comprising an aromatic-group-containing compound having a molecular weight represented by a molecular formula of 200 to 500, wherein when the planarizing agent for forming an organic film is blended in a preliminary composition containing a resin for forming an organic film and a solvent, the preliminary composition having a complex viscosity of 1.0 Pa·s or more in a temperature range of 175° C. or higher, the blended composition has a temperature range in which a complex viscosity of the blended composition is less than 1.0 Pa·s in a temperature range of 175° C. or higher.

Hereinafter, the present invention will be described in detail, but the present invention is not limited thereto.

[Planarizing Agent for Forming Organic Film]

The planarizing agent for forming an organic film is a compound to be blended in a composition for forming an organic film with a resin for forming an organic film and a solvent to have an effect of improving the planarizing ability.

The inventive planarizing agent for forming an organic film comprises an aromatic-group-containing compound having a molecular weight represented by a molecular formula of 200 to 500, wherein when the planarizing agent for forming an organic film is blended in a preliminary composition containing a resin for forming an organic film and a solvent, the preliminary composition having a complex viscosity of 1.0 Pa·s or more in a temperature range of 175° C. or higher, the blended composition has a temperature range in which a complex viscosity of the blended composition is less than 1.0 Pa·s in a temperature range of 175° C. or higher.

The planarizing agent for forming an organic film will be described with reference to FIGS. 1 and 2. A detail of the composition corresponding to FIGS. 1 and 2 will be described later.

On a composition not containing the inventive planarizing agent for forming an organic film but constituted with a resin for forming an organic film and a solvent (hereinafter, referred to as the preliminary composition for forming an organic film), FIG. 1 shows a graph of the complex viscosity measured within a range of 50° C. or higher and 300° C. or lower. On a composition for forming an organic film blended with the inventive planarizing agent for forming an organic film, FIG. 2 shows a graph of the complex viscosity measured within a range of 50° C. or higher and 300° C. or lower. When the preliminary composition for forming an organic film containing no planarizing agent for forming an organic film is heated, the complex viscosity starts to increase within the range of 50° C. or higher and 100° C. or lower, as shown in FIG. 1. This increase in the complex viscosity is presumably because of volatilization of the solvent. When the heating is continued in a higher temperature region, the viscosity further increases due to the crosslinking reaction of the resin for forming an organic film. Meanwhile, when the compound for forming an organic film containing the inventive planarizing agent for forming an organic film is heated, a relatively low complex viscosity is maintained until near 180° C., and then the viscosity starts to increase due to the crosslinking, as shown in FIG. 2. The inventive planarizing agent for forming an organic film has an inhibiting function of the increase in the complex viscosity due to the heat treatment when blended with the composition for forming an organic film as above. The inventive planarizing agent for forming an organic film comprises an aromatic-group-containing compound having a molecular weight represented by a molecular formula of 200 to 500, wherein when the planarizing agent for forming an organic film is blended in a preliminary composition containing a resin for forming an organic film and a solvent, the preliminary composition having a complex viscosity of 1.0 Pa·s or more in a temperature range of 175° C. or higher, the blended composition has a temperature range in which a complex viscosity of the blended composition is less than 1.0 Pa·s in a temperature range of 175° C. or higher. The composition to be mixed the planarizing agent for forming an organic film with, i.e., the preliminary composition containing a resin for forming an organic film and a solvent, may have a complex viscosity of 1.0 Pa·s or more in a temperature range of 175° C. or higher, and the composition may have a complex viscosity of 1.0 Pa·s or more and 1,000,000 Pa·s or less within a temperature range of 175° C. to 300° C.

The complex viscosity of the compound for forming an organic film can be easily measured with a commercially available common measurement device. Examples of the measurement device include: MCR Rheometer, manufactured by Anton Paar GmbH; and ARES Viscoelasticity Measurement System, manufactured by Rheometric Scientific Far East Ltd. Examples of the measurement procedure include a method in which the composition for forming an organic film is set in the measurement device to measure the complex viscosity between 50° C. and 300° C. In the present invention, a temperature corresponding to the complex viscosity of the composition is measured by the following measuring method.

[Measuring Method]

A dynamic viscoelasticity measurement device (MCR Rheometer MCR 302, manufactured by Anton Paar GmbH) was used. When measured, the complex viscosity from 50° C. to 300° C. is measured by using a measurement tool with 20 mm in outer diameter, strain of 1%, frequency of 1 Hz, and heating rate of 5° C./min. A blending amount relative to 100 parts by mass of the composition to be measured may be 10 parts by mass of the planarizing agent for forming an organic film, 10 parts by mass of the resin for forming an organic film, and 80 parts by mass of the solvent.

The inventive planarizing agent for forming an organic film, which imparts good thermal flowability to the composition for forming an organic film, can achieve high planarization.

When the organic film, etc. are formed, the composition for forming an organic film is formed on a stepped substrate by a spin-coating method, and then hard-baked at typically approximately 250° C. to 400° C. for heat-curing to obtain a cured film. Thus, when the low complex viscosity can be maintained until a high temperature range, the thermal flow until the curing is promoted to achieve the high planarization of the stepped substrate.

The planarizing agent for forming an organic film has a molecular weight of the molecular formula expressing it of 200 to 500, and has sufficient thermal flowability during baking. Thus, the planarizing agent for forming an organic film has high penalization ability and the residue thereof in the film after baking is reduced. The molecular weight of the molecular formula expressing the planarizing agent for forming an organic film is preferably 240 to 450, and particularly preferably 300 to 400.

Meanwhile, if the planarizing agent for forming an organic film has a molecular weight of less than 200, the planarizing agent for forming an organic film is relatively easily lost by the heat treatment due to volatilization, and the thermal flowability becomes poor to cause insufficient planarizing ability. If the molecular weight is more than 500, the volatilization, etc. of the planarizing agent for forming an organic film by the heat treatment is inhibited, and the crosslinking reaction of the resin for forming an organic film and the volatilization of the planarizing agent occur simultaneously to deteriorate the in-plane uniformity. The planarizing agent remains in the film to deteriorate the etching resistance.

The planarizing agent for forming an organic film preferably has a weight reduction rate from 30° C. to 190° C. of less than 15%, and has a weight reduction rate from 30° C. to 350° C. of 98% or more because the low complex viscosity is sufficiently maintained with inhibited volatilization during the heat treatment, the thermal flowability is excellent, and little planarizing agent for forming an organic film is remained in the film after baking. The weight reduction rate herein is based on a value determined by a TG (thermal gravity) measurement with a differential thermal balance.

An upper limit of the temperature range in which the weight reduction rate of the planarizing agent for forming an organic film is less than 15% is further preferably 210° C., and further preferably 230° C. The temperature range of the weight reduction rate of the planarizing agent for forming an organic film being less than 15% within the above temperature range can further improve the planarizing ability.

The temperature at which the weight reduction rate of the planarizing agent for forming an organic film is 98% or more is further preferably 330° C., and particularly preferably 310° C. The temperature at which the weight reduction rate of the planarizing agent for forming an organic film is 98% or more within the above temperature range can further reduce the residue of the planarizing agent for forming an organic film in the film after baking.

Blending the above planarizing agent for forming an organic film improves the thermal flowability from the beginning of the heat treatment of the composition for forming an organic film to the curing with the crosslinking reaction to yield excellent planarizing ability. In addition, the planarizing agent for forming an organic film is reduced by volatilization, etc. due to the heat treatment, and thereby the etching resistance and the optical characteristics are not deteriorated.

In the present invention, the planarizing ability is ability to planarize a substrate surface. According to the composition containing the inventive planarizing agent for forming an organic film, as illustrated in FIG. 3, applying a composition for forming an organic film 3' on a substrate 1 and heating the coating film to form an organic film 3 can reduce a step with 115 nm on the substrate 1 to a step with less than 115 nm, for example. The step geometry illustrated in FIG. 3 describes a typical example of the step geometry on the substrate for producing a semiconductor device. The step geometry on the substrate that can be planarized with the composition containing the inventive compound for forming an organic film is of course not limited thereto.

Examples of a further preferable aspect of the planarizing agent for forming an organic film include a planarizing agent having an oxygen atom.

A used substrate to be processed has a surface coated with Si, α-Si, p-Si, $SiO_2$, SiN, SiON, W, TiN, Al, etc. Thus, such a planarizing agent for forming an organic film having an oxygen atom can improve the wetting property of the composition for forming an organic film against the substrate to be processed during the spin-coating of the composition for forming an organic film on the substrate to be processed or during the heat treatment. This improved wetting property can inhibit film formation failure such as dewetting.

The inventive planarizing agent for forming an organic film is an aromatic-group-containing compound having a molecular weight represented by a molecular formula of 200 to 500, and has an aromatic ring.

Examples of the aromatic ring include: aromatic carbon rings, such as a benzene ring and a naphthalene ring; and aromatic hetero-rings, such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring, and a triazine ring.

From the viewpoints of the etching resistance, the optical characteristics, and the heat resistance, the compound having an aromatic skeleton is preferably used for the resin for forming an organic film. When being the aromatic-group-containing compound, the planarizing agent for forming an organic film has excellent compatibility with the resin for forming an organic film and film formation failure such as pinholes hardly occurs during the film formation, and thus, such an agent is preferable. Among the aromatic rings, aromatic carbon rings are preferable, and a benzene ring is more preferable.

Examples of the planarizing agent for forming an organic film include a compound having: two or more benzene rings; or one benzene ring and a structure represented by the following general formula (A), (A)

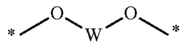

wherein "*" represents a bonding position; and W represents an alkylene group having 1 to 4 carbon atoms.

More specific examples of W include a methylene group, an ethylene group, a propylene group, a butylene group, a trimethylene group, and a tetramethylene group. Among these, an ethylene group is more preferable.

Further preferable aspect of the planarizing agent for forming an organic film include one or more compounds selected from the general formulae (I) to (III), (I)

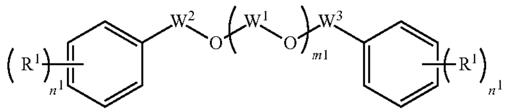

wherein $R^1$ each independently represents a hydrogen atom, a hydroxy group, or an optionally substituted organic group having 1 to 10 carbon atoms; $W^1$ represents a phenylene group or a divalent group represented by the following general formula (I-1); $W^2$ and $W^3$ represent a single bond or any one divalent group represented by the following general formula (I-2); "$m^1$" represents an integer of 1 to 10; and "$n^1$" each independently represents an integer of 0 to 5, (I-1)

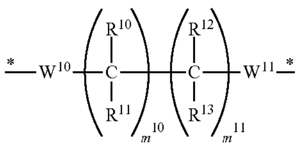

wherein "*" represents a bonding position; $R^{10}$, $R^{11}$, $R^{12}$, and $R^{13}$ represent a hydrogen atom, a hydroxy group, or an organic group having 1 to 10 carbon atoms; $W^{10}$ and $W^{11}$ each independently represent a single bond or a carbonyl group; and "$m^{10}$" and "$m^{11}$" represent an integer of 0 to 10, and $m^{10}+m^{11}\geq 1$, and (I-2)

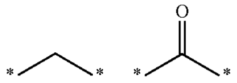

wherein "*" represents a bonding position.

(II)

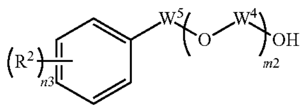

In the formula, $R^2$ each independently represents a hydrogen atom or an optionally substituted organic group having 1 to 10 carbon atoms; $W^4$ represents a divalent group represented by the following general formula (II-1); $W^5$ represents a single bond or any one divalent group represented by the following general formula (II-2); "$m^2$" represents an integer of 3 to 10; and "$n^3$" represents an integer of 0 to 5, (II-1)

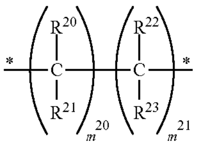

wherein "*" represents a bonding position; $R^{20}$, $R^{21}$, $R^{22}$, and $R^{23}$ represent a hydrogen atom, a hydroxy group, or an organic group having 1 to 10 carbon atoms; "$m^{20}$" and "$m^{21}$" represent an integer of 0 to 10; and $m^{20}+m^{21}\geq 1$, and (II-2)

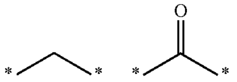

wherein "*" represents a bonding position.

(III)

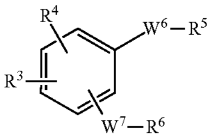

In the formula, $R^3$ and $R^4$ represent a hydrogen atom, a hydroxy group, or an optionally substituted organic group having 1 to 10 carbon atoms, and $R^3$ and $R^4$ are optionally bonded to form a cyclic structure; $R^5$ and $R^6$ represent an organic group having 1 to 10 carbon atoms, and $R^5$ represents a group having at least one of an aromatic ring or a divalent group represented by the following general formula (III-1); and $W^6$ and $W^7$ represent a single bond or any one divalent group represented by the following general formula (III-2), and at least one of $W^6$ and $W^7$ represents the divalent group represented by the any one following general formula (III-2), (III-1)

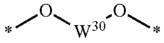

wherein "*" represents a bonding position; and $W^{30}$ represents an organic group having 1 to 4 carbon atoms, and (III-2)

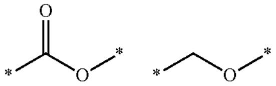

wherein "*" represents a bonding position.

In the general formula (I), $R^1$ each independently represents a hydrogen atom, a hydroxy group, or an optionally substituted organic group having 1 to 10 carbon atoms.

In the present invention, "organic group" means a group having at least one carbon atom, further has hydrogen atom, and optionally has an atom such as nitrogen, oxygen, sulfur, silicon, halogen atom, etc.

$R^1$ may be single, or a plurality of kinds of $R^1$ may be present. More specific examples of $R^1$ include a hydrogen atom, a hydroxy group, a methyl group, an ethyl group, a vinyl group, a 2,2,2-trifluoroethyl group, a propyl group, an isopropyl group, an allyl group, a n-butyl group, a s-butyl group, a t-butyl group, an isobutyl group, a pentyl group, a cyclopentyl group, a hexyl group, a cyclohexyl group, a cyclohexenyl group, a decyl group, a methoxy group, an ethoxy group, a propoxy group, an isopropoxy group, a n-butoxy group, a s-butoxy group, a t-butoxy group, an isobutoxy group, a norbornyl group, an adamantyl group, a phenyl group, a tolyl group, a xylyl group, a naphthyl group, a benzyl group, a 2-furanyl group, and a 2-tetrahydrofuranyl group. Among these, a hydrogen atom is more preferable.

$W^1$ represents a phenylene group or the divalent group represented by the general formula (I-1). $W^2$ and $W^3$ represent a single bond or any one of the divalent group represented by the general formula (I-2). "$m^1$" represents an integer of 1 to 10, and "$n^1$" each independently represents an integer of 0 to 5.

$R^{10}$, $R^{11}$, $R^{12}$, and $R^{13}$ more specifically represent a hydrogen atom, a hydroxy group, or an organic group having 1 to 10 carbon atoms. More specific examples thereof include a hydrogen atom, a hydroxy group, a methyl group, an ethyl group, a vinyl group, a 2,2,2-trifluoroethyl group, a propyl group, an isopropyl group, an allyl group, a n-butyl group, a s-butyl group, a t-butyl group, an isobutyl group, a pentyl group, a cyclopentyl group, a hexyl group, a cyclohexyl group, a cyclohexenyl group, a decyl group, a methoxy group, an ethoxy group, a propoxy group, an isopropoxy group, a n-butoxy group, a s-butoxy group, a t-butoxy group, an isobutoxy group, a norbornyl group, an adamantyl group, a phenyl group, a tolyl group, a xylyl group, a naphthyl group, a benzyl group, a 2-furanyl group, and a 2-tetrahydrofuranyl group. Among these, a hydrogen atom and a methyl group are more preferable, and a hydrogen atom is further more preferable.

$W^{10}$ and $W^{11}$ each independently represent a single bond or a carbonyl group. "$m^{10}$" and "$m^{11}$" represent an integer of 0 to 10, and $m^{10}+m^{11}\geq 1$.

$R^2$ may be single, or a plurality of kinds of $R^2$ may be present. More specific examples of $R^2$ include a hydrogen atom, a hydroxy group, a methyl group, an ethyl group, a vinyl group, a 2,2,2-trifluoroethyl group, a propyl group, an isopropyl group, an allyl group, a n-butyl group, a s-butyl group, a t-butyl group, an isobutyl group, a pentyl group, a cyclopentyl group, a hexyl group, a cyclohexyl group, a cyclohexenyl group, a decyl group, a methoxy group, an ethoxy group, a propoxy group, an isopropoxy group, a n-butoxy group, a s-butoxy group, a t-butoxy group, an isobutoxy group, a norbornyl group, an adamantyl group, a phenyl group, a tolyl group, a xylyl group, a naphthyl group, a benzyl group, a 2-furanyl group, and a 2-tetrahydrofuranyl group. Among these, a hydrogen atom is more preferable.

$W^4$ represents the divalent group represented by the general formula (II-1). $W^3$ represents a single bond or any one of the divalent group represented by the general formula (II-2). "$m^2$" represents an integer of 3 to 10, and "$n^3$" represents an integer of 0 to 5.

More specific examples of $R^{20}$, $R^{21}$, $R^{22}$, and $R^{23}$ include a hydrogen atom, a hydroxy group, a methyl group, an ethyl group, a vinyl group, a 2,2,2-trifluoroethyl group, a propyl group, an isopropyl group, an allyl group, a n-butyl group, a s-butyl group, a t-butyl group, an isobutyl group, a pentyl group, a cyclopentyl group, a hexyl group, a cyclohexyl group, a cyclohexenyl group, a decyl group, a methoxy group, an ethoxy group, a propoxy group, an isopropoxy group, a n-butoxy group, a s-butoxy group, a t-butoxy group, an isobutoxy group, a norbornyl group, an adamantyl group, a phenyl group, a tolyl group, a xylyl group, a naphthyl group, a benzyl group, a 2-furanyl group, and a 2-tetrahydrofuranyl group. Among these, a hydrogen atom and a methyl group are more preferable, and a hydrogen atom is further more preferable.

"$m^{20}$" and "$m^{21}$" represent an integer of 0 to 10, and $m^{20}+m^{21}\geq 1$.

$R^3$ and $R^4$ represent a hydrogen atom, a hydroxy group, or an organic group having 1 to 10 carbon atoms. More specific examples thereof include a hydrogen atom, a hydroxy group, a methyl group, an ethyl group, a vinyl group, a 2,2,2-trifluoroethyl group, a propyl group, an isopropyl group, an allyl group, a n-butyl group, a s-butyl group, a t-butyl group, an isobutyl group, a pentyl group, a cyclopentyl group, a hexyl group, a cyclohexyl group, a cyclohexenyl group, a decyl group, a methoxy group, an ethoxy group, a propoxy group, an isopropoxy group, a n-butoxy group, a s-butoxy group, a t-butoxy group, an isobutoxy group, a norbornyl group, an adamantyl group, a phenyl group, a tolyl group, a xylyl group, a naphthyl group, a benzyl group, a 2-furanyl group, and a 2-tetrahydrofuranyl group. Among these, a hydrogen atom is more preferable.

$R^6$ represents an organic group having 1 to 10 carbon atoms. $R^5$ represents an organic group having 1 to 10 carbon atoms, the group having at least one of an aromatic ring or the divalent group represented by the general formula (III-1). Examples of the organic group having 1 to 10 carbon atoms include the groups exemplified as the above $R^3$ and $R^4$.

$W^6$ and $W^7$ represent a single bond or any one of the divalent group represented by the general formula (III-2), and at least one of $W^6$ and $W^7$ represents the divalent group represented by the any one general formula (III-2).

$W^{30}$ represents an organic group having 1 to 4 carbon atoms. More specific examples thereof include a methylene group, an ethylene group, a propylene group, a butylene group, a trimethylene group, and a tetramethylene group. Among these, an ethylene group is more preferable.

More specific examples of the compound represented by the general formula (I) include the following compounds, but the compound is not limited thereto.

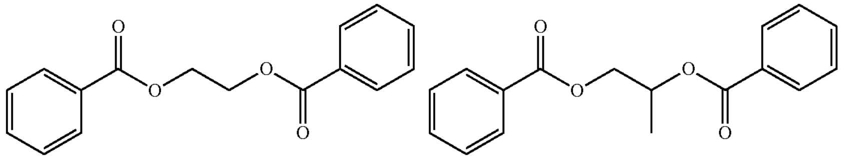

-continued
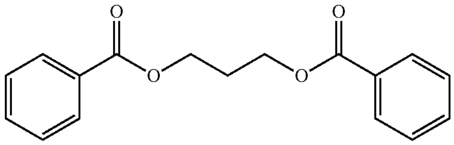
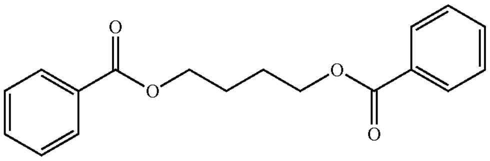
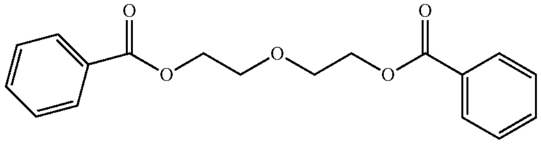
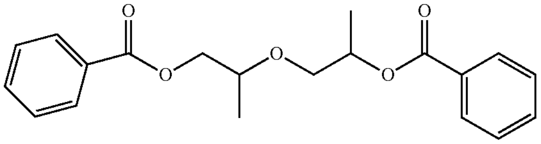
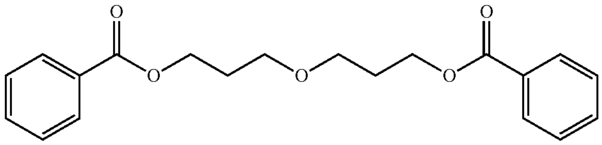
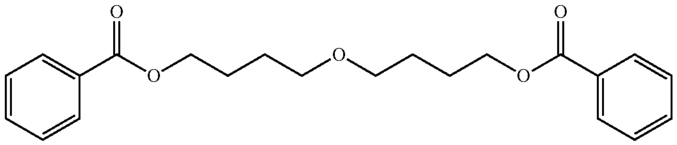
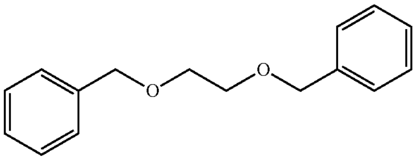
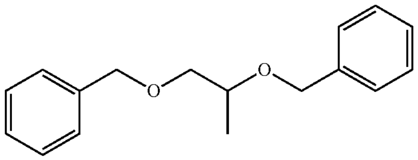
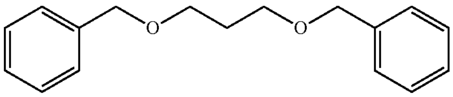
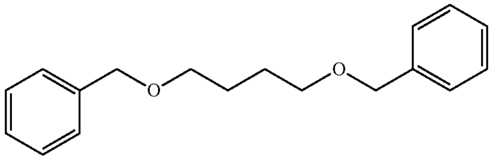
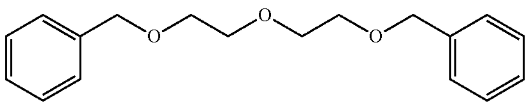
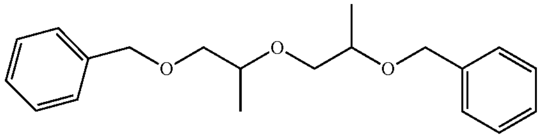
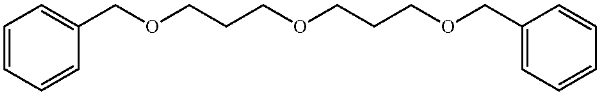
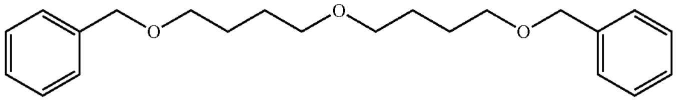
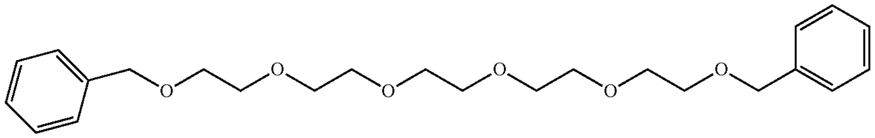
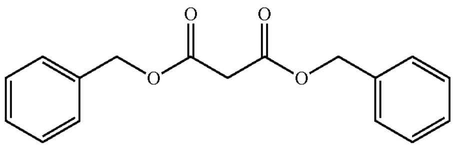
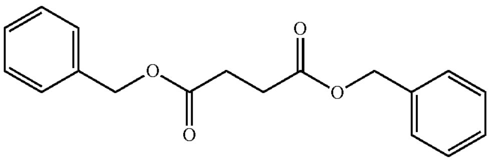
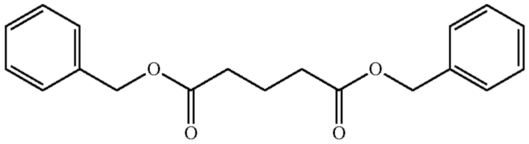
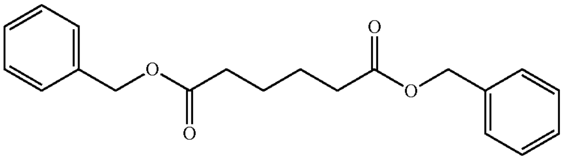

-continued
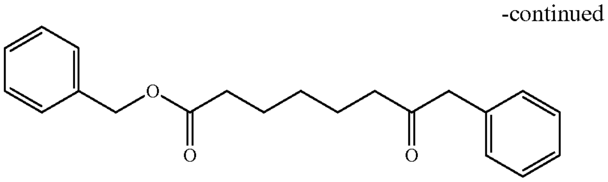
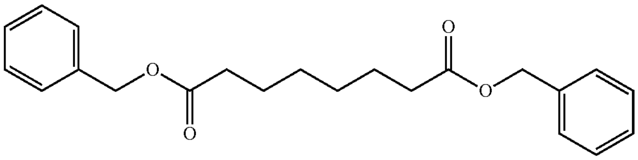
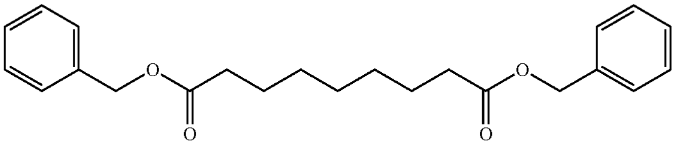
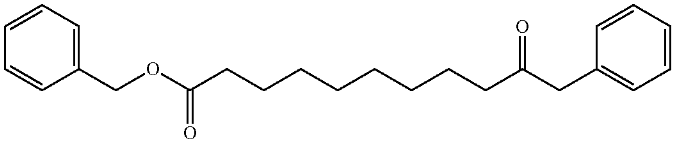
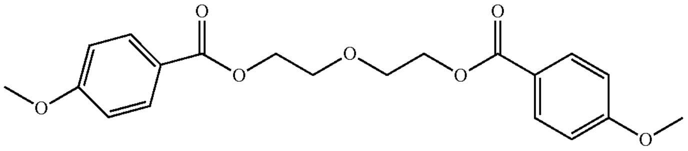
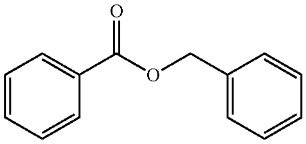
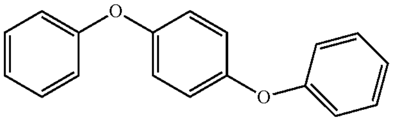
More specific examples of the compound represented by the general formula (II) include the following compounds, but the compound is not limited thereto.
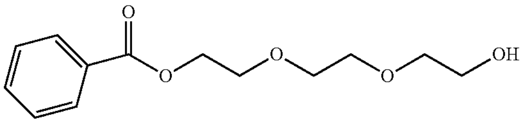
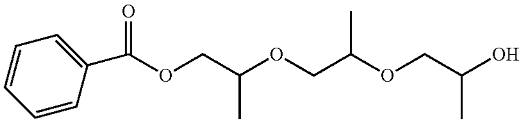
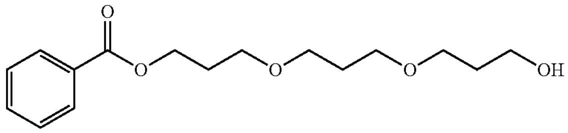
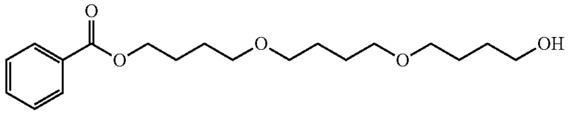
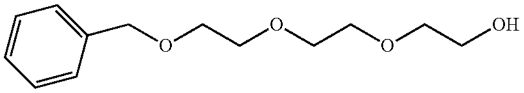
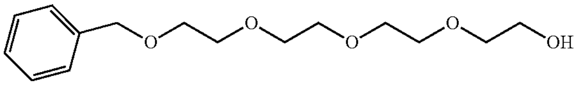
-continued
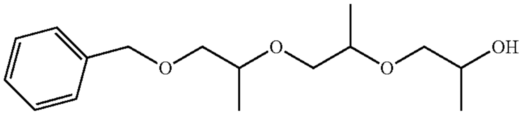
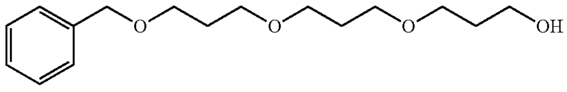
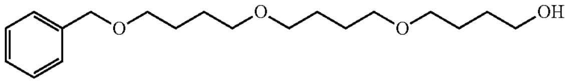
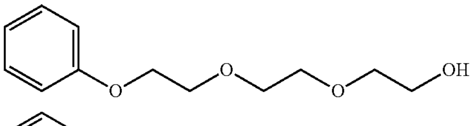
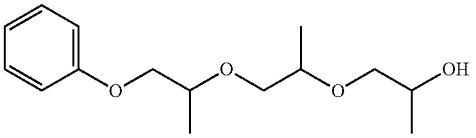
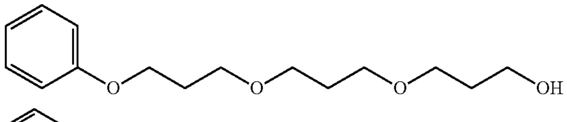
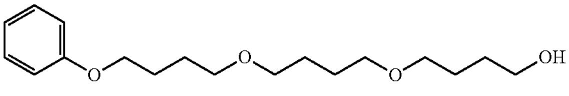

More specific examples of the compound represented by the general formula (III) include the following compounds, but the compound is not limited thereto.
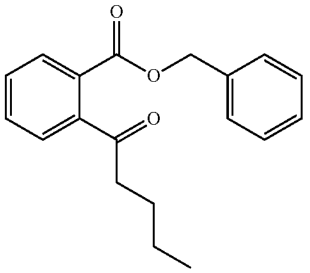
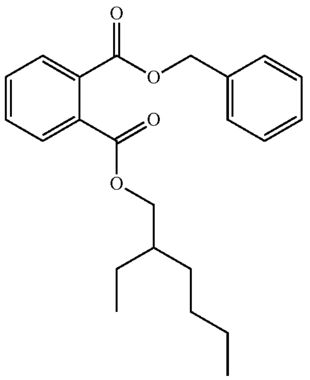
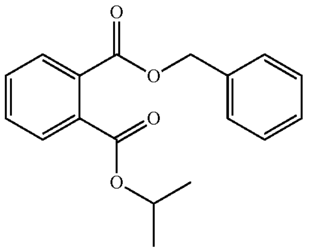
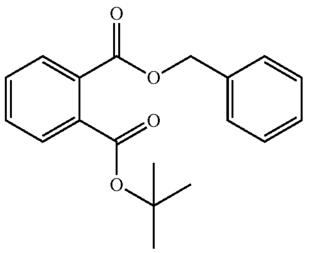
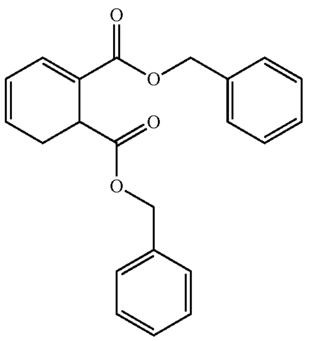
-continued
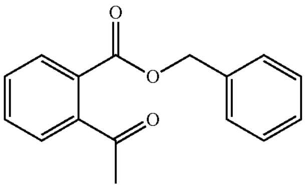
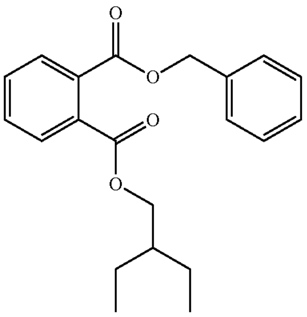
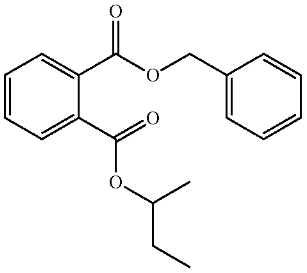
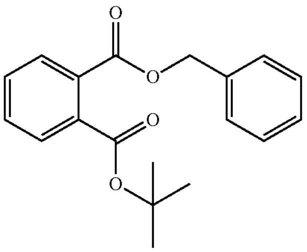
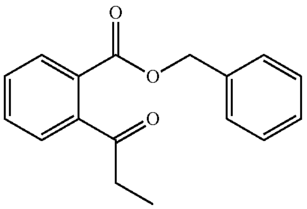
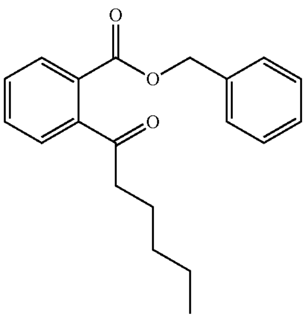

-continued
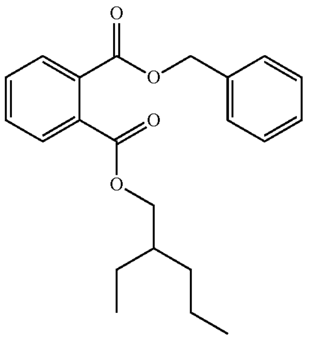
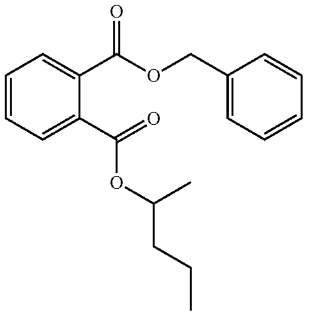
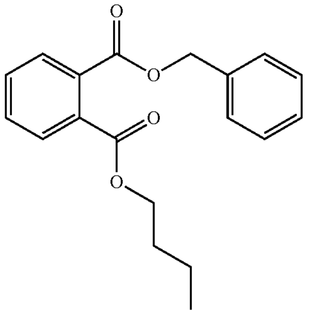
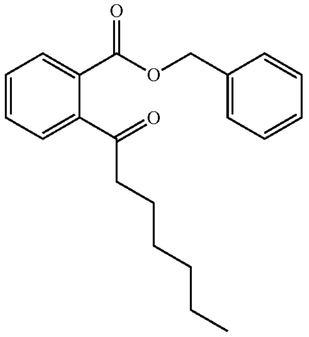
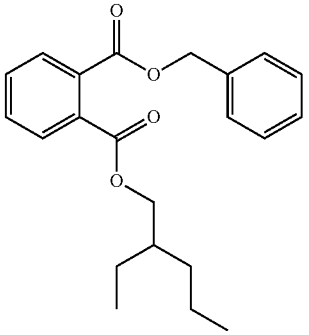
-continued
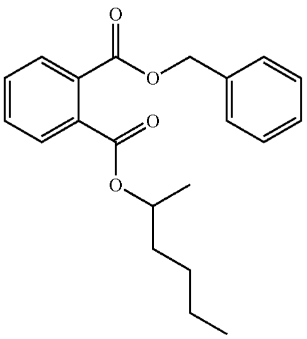
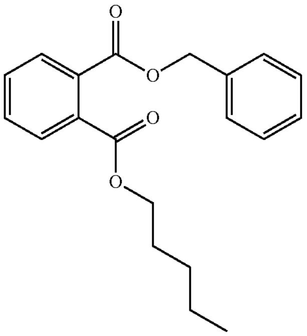
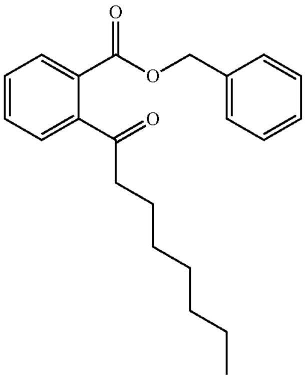
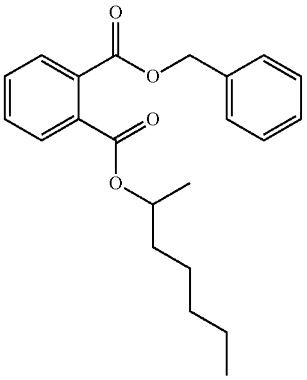

-continued

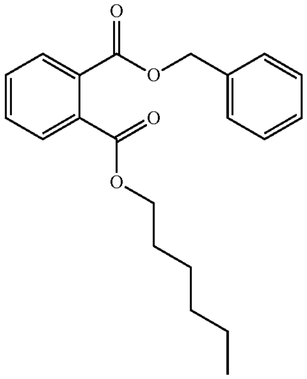

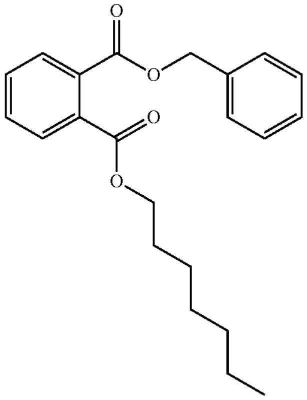

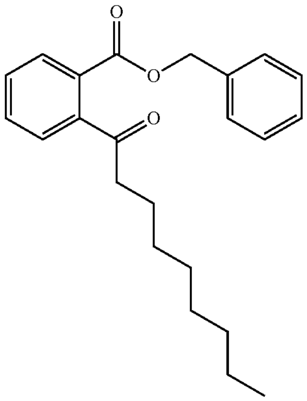

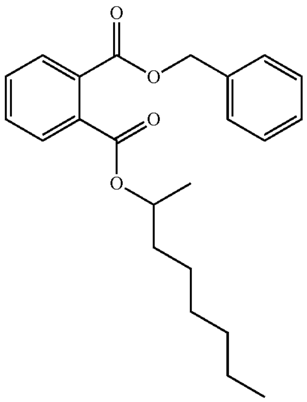

-continued

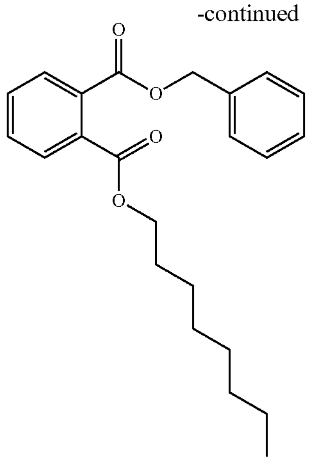

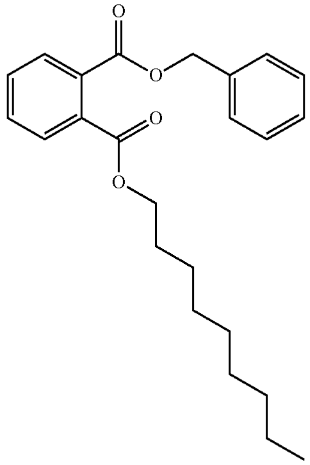 [SMILES: CCCCCCCCCOC(=O)c1ccccc1C(=O)OCc1ccccc1]

The following aromatic-group-containing compounds (piperonyl compounds and phthalate diesters) can be exemplified in addition to the compounds represented by the general formulae (I) to (III), but the compound is not limited thereto.

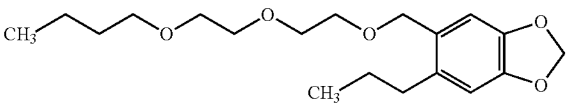

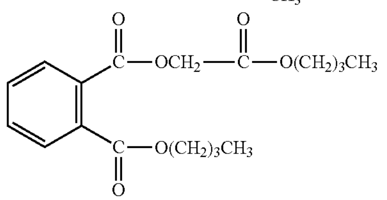

Collectively considering the etching resistance, the optical characteristics, the compatibility with the resin for forming an organic film, the film formability, and the wetting property against the substrate to be processed, in addition to the ability to planarize the substrate surface, the inventive planarizing agent for forming an organic film is preferably an aromatic-group-containing compound having a benzyl group or a benzoyl group, and particularly preferably the following aromatic-group-containing compound:

(i) (poly)ethylene glycol dibenzoate;

(ii) (poly)ethylene glycol dibenzyl ether;

(iii) (poly)propylene glycol dibenzyl ether;
(iv) (poly)butylene glycol dibenzyl ether;
(v) dibenzyl linear-chain aliphatic dicarboxylates;
(vi) (poly)ethylene glycol monobenzyl ether;
(vii) (poly)phenyl ether; and
(viii) alkylbenzyl phthalates.

(i)

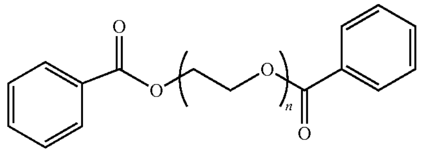

(ii)

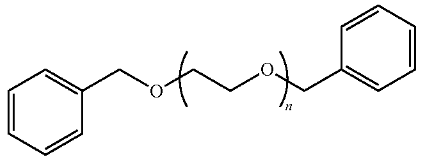

(iii)

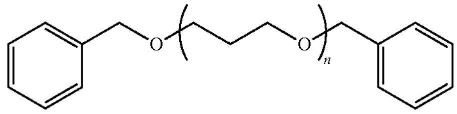

(iv)

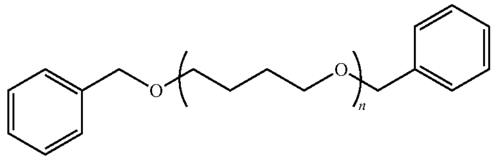

(v)

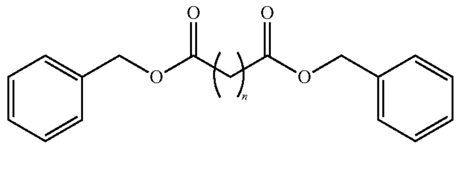

(vi)

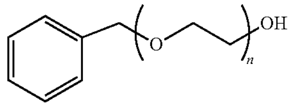

(vii)

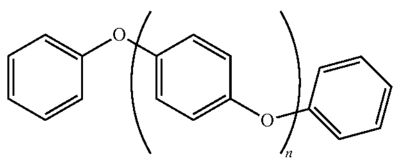

In the formulae, “n” represents an integer so that the molecular weight is within a range of 200 to 500, and applied only in these formulae.

A blending amount of the planarizing agent for forming an organic film is preferably 20 to 300 parts by mass, more preferably 30 to 200 parts by mass, further preferably 50 to 150 parts by mass, and particularly preferably 80 to 100 parts by mass, relative to 100 parts by mass of the resin for forming an organic film. When the blending amount of the planarizing agent for forming an organic film is 20 parts by mass or more, the blending effect is sufficiently obtained.

As the inventive planarizing agent for forming an organic film, the aromatic-group-containing compound may be used singly, or may be used in combination of two or more kinds thereof.

As described above, the inventive planarizing agent for forming an organic film provides the composition for forming an organic film having high planarizing ability.

[Composition for Forming Organic Film]

The inventive composition for forming an organic film comprises: a resin for forming an organic film; the planarizing agent for forming an organic film; and a solvent.

The inventive composition for forming an organic film may contain one or more kinds of the resin for forming an organic film, one or more kinds of the planarizing agent for forming an organic film, and one or more kinds of the solvent respectively. Each of them may be used singly, or may be used in combination of two or more kinds thereof.

[Resin for Forming Organic Film]

A usable resin for forming an organic film in the inventive organic film-forming composition is not particularly limited as long as the resin satisfies film-formability with spin-coating and curability. From the viewpoints of the etching resistance, the optical characteristics, the heat resistance, etc., a compound having an aromatic skeleton is more preferable.

Examples of the aromatic skeleton include benzene, naphthalene, anthracene, pyrene, indene, fluorene, furan, pyrrole, thiophene, phosphole, pyrazole, oxazole, isoxazole, thiazole, pyridine, pyrazine, pyrimidine, pyridazine, triazine, and carbazole. Among these, benzene, naphthalene, and fluorene are particularly preferable.

Examples of the resin for forming an organic film applied to the present invention include resins described in JP 2012-1687 A and JP 2012-77295 A, and having the following structure.

(1)

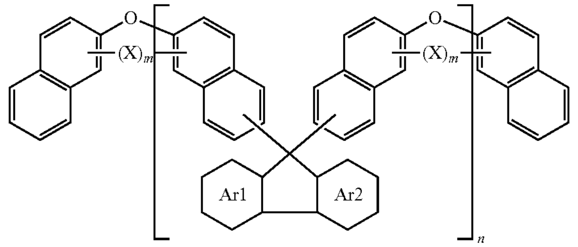

In the formula (1), cyclic structures Ar1 and Ar2 represent a benzene ring or a naphthalene ring. X represents a single bond or an alkylene group having 1 to 20 carbon atoms. “m” represents 0 or 1. “n” represents any natural number so that the molecular weight is 100,000 or less. The symbols in the formula are applied only in this formula.

(2)

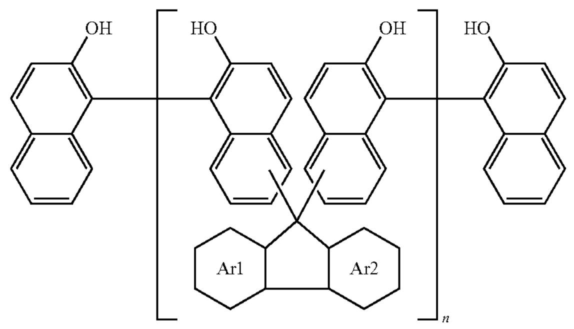

In the formula (2), cyclic structures Ar1 and Ar2 represent a benzene ring or a naphthalene ring. "n" represents any natural number so that the weight-average molecular weight in terms of polystyrene measured by gel permeation chromatography is 100,000 or less. The symbols in the formula are applied only in this formula.

Examples of the resin for forming an organic film applied to the present invention further include resins described in JP 2004-264710 A, JP 2005-043471 A, JP 2005-250434 A, JP 2007-293294 A, and JP 2008-65303 A, and having the following structure.

(3)

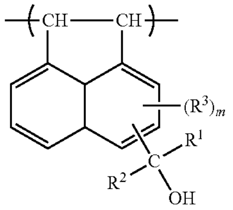

(4)

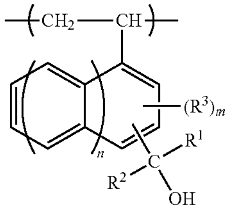

In the formulae (3) and (4), $R^1$ and $R^2$ represent a hydrogen atom, an alkyl group having 1 to 3 carbon atoms, or an aryl group. $R^3$ represents an alkyl group having 1 to 3 carbon atoms, a vinyl group, an allyl group, and an optionally substituted aryl group. "n" represents 0 or 1, and "m" represents 0, 1, or 2. The symbols in the formula are applied only in these formulae.

(5)

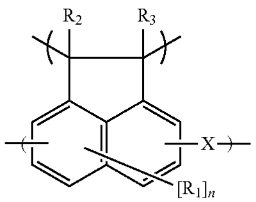

In the formula (5), $R_1$ represents a monovalent atom or group other than a hydrogen atom. "n" represents an integer of 0 to 4. When "n" represents 2 to 4, the plurality of $R_1$ may be the same as or different from each other. $R_2$ and $R_3$ independently represent a monovalent atom or group. X represents a divalent group. The symbols in the formula are applied only in this formula.

(6)

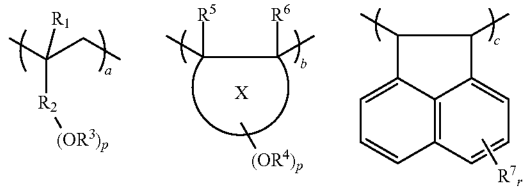

In the formula (6), $R_1$ represents a hydrogen atom or a methyl group. $R_2$ represents any one of a single bond, a linear, branched, or cyclic alkylene group having 1 to 20 carbon atoms, and an arylene group having 6 to 10 carbon atoms. $R_2$ optionally has any one of ether, ester, lactone, and amide. $R_3$ and $R_4$ each represent a hydrogen atom or a glycidyl group. X represents a polymer of any one of a hydrocarbon having an indene skeleton, a cycloolefin having 3 to 10 carbon atoms, and maleimide. X optionally has any one of ether, ester, lactone, and carboxylic anhydride. $R_5$ and $R_6$ each represent any one of a hydrogen atom, a fluorine atom, a methyl group, and a trifluoromethyl group. $R_7$ represents any one of a hydrogen atom, a linear, branched, or cyclic alkyl group having 1 to 6 carbon atoms, a hydroxy group, and an alkoxycarbonyl group. "p" and "q" each represent an integer of 1 to 4. "r" represents an integer of 0 to 4. Each of "a", "b", and "c" has a range of $0.5 \leq a+b+c \leq 1$, $0 \leq a \leq 0.8$, $0 \leq b \leq 0.8$, $0.1 \leq a+b \leq 0.8$, and $0.1 \leq c \leq 0.8$. The symbols in the formula are applied only in these formulae.

(7)

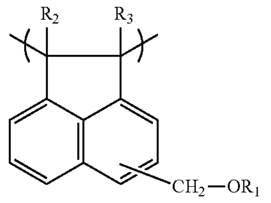

In the formula (7), $R_1$ represents a hydrogen atom or a monovalent organic group. $R_2$ and $R_3$ each independently represent a monovalent atom or a monovalent organic group. The symbols in the formula are applied only in this formula.

Specific examples of the resin for forming an organic film applied to the present invention include resins described in JP 2004-205685 A, JP 2007-171895 A, and JP 2009-14816 A, and having the following structure.

(8)

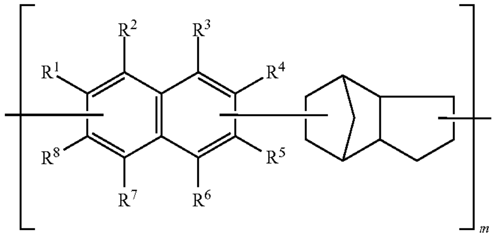

(9)

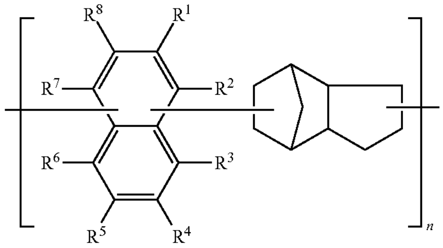

In the formulae (8) and (9), $R^1$ to $R^8$ each independently represent a hydrogen atom, a hydroxy group, an optionally substituted alkyl group having 1 to 6 carbon atoms, an optionally substituted alkoxy group having 1 to 6 carbon atoms, an optionally substituted alkoxycarboxyl group having 2 to 6 carbon atoms, an optionally substituted aryl group having 6 to 10 carbon atoms, a hydroxyalkyl group having 1 to 6 carbon atoms, an isocyanate group, or a glycidyl group. "m" and "n" represent a positive integer. The symbols in the formulae are applied only in these formulae.

(10)

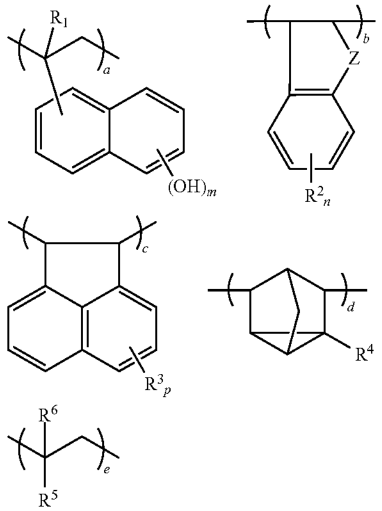

In the formula (10), $R^1$ and $R^6$ represent a hydrogen atom or a methyl group. $R^2$, $R^3$, and $R^4$ represent a hydrogen atom, an alkyl group having 1 to 4 carbon atoms, an alkoxy group, a hydroxy group, an acetoxy group, an alkoxycarbonyl group, or an aryl group having 6 to 10 carbon atoms. $R^5$ represents a condensed polycyclic hydrocarbon group having 13 to 30 carbon atoms, —O—$R^7$, —C(═O)—O—$R^7$, —O—C(═O)—$R^7$, or —C(═O)—$NR^8$—$R^7$. "m" represents 1 or 2, "n" represents an integer of 0 to 4, and "p" represents an integer of 0 to 6. $R^7$ represents an organic group having 7 to 30 carbon atoms, and $R^8$ represents a hydrogen atom or a hydrocarbon group having 1 to 6 carbon atoms. Z represents any one of a methylene group, —O—, —S—, and —NH—. Each of "a", "b", "c", "d", and "e" has a range of $0<a<1.0$, $0\leq b\leq 0.8$, $0\leq c\leq 0.8$, $0\leq d\leq 0.8$, $0\leq e\leq 0.8$, and $0<b+c+d+e<1.0$. The symbols in the formula are applied only in this formula.

(11)

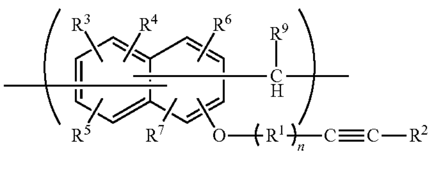

In the formula (11), "n" represents 0 or 1. $R^1$ represents an optionally substituted methylene group, an optionally substituted alkylene group having 2 to 20 carbon atoms, or an optionally substituted arylene group having 6 to 20 carbon atoms. $R^2$ represents a hydrogen atom, an optionally substituted alkyl group having 1 to 20 carbon atoms, or an optionally substituted aryl group having 6 to 20 carbon atoms. $R^3$ to $R^7$ represent a hydroxy group, an optionally substituted alkyl group having 1 to 6 carbon atoms, an optionally substituted alkoxy group having 1 to 6 carbon atoms, an optionally substituted alkoxycarbonyl group having 2 to 10 carbon atoms, an optionally substituted aryl group having 6 to 14 carbon atoms, or an optionally substituted glycidyl ether group having 2 to 6 carbon atoms. $R^9$ represents a hydrogen atom, a linear, branched, or cyclic alkyl group having 1 to 10 carbon atoms, a linear, branched, or cyclic alkyl ether group having 1 to 10 carbon atoms, or aryl group having 6 to 10 carbon atoms. The symbols in the formula are applied only in this formula.

For example, the following compounds are exemplified.

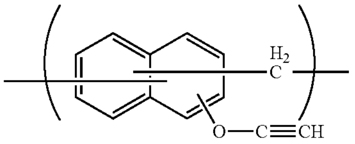

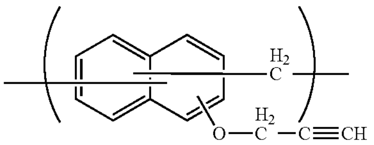

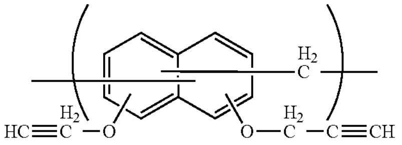

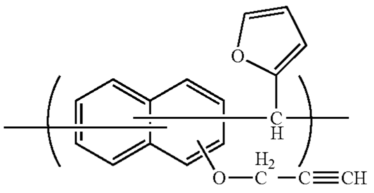

-continued

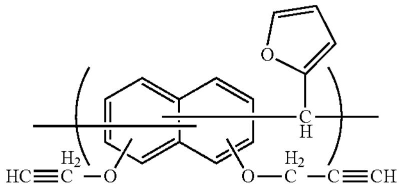

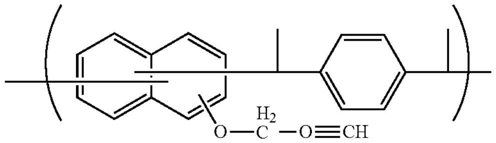

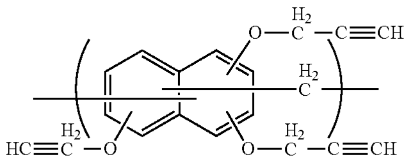

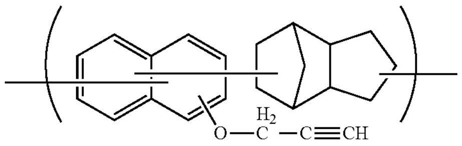

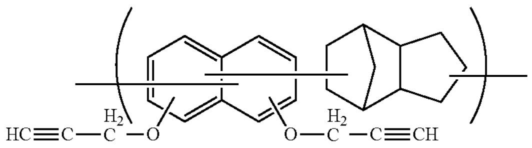

Examples of the resin for forming an organic film applied to the present invention include resins described in JP 2007-199653 A, JP 2008-274250 A, and JP 2010-122656 A, and having the following structure.

(12)

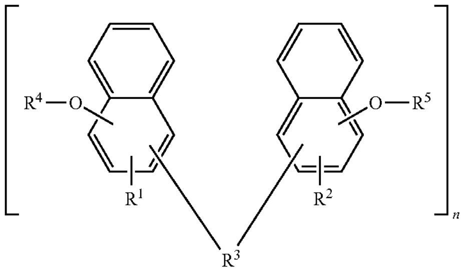

In the formula (12), $R^1$ and $R^2$ independently represent a hydrogen atom, a linear, branched, or cyclic alkyl group having 1 to 10 carbon atoms, an aryl group having 6 to 10 carbon atoms, or an alkenyl group having 2 to 10 carbon atoms. These groups may be the same as or different from each other. $R^3$ represents a single bond or an alkylene group having 1 to 30 carbon atoms and having a linear, branched, or cyclic structure. These groups optionally have a bridged cyclic hydrocarbon group, a double bond, a heteroatom, or an aromatic group having 6 to 30 carbon atoms. $R^4$ and $R^5$ each independently represent a hydrogen atom or a glycidyl group. "n" represents an integer of 1 to 4. The symbols in the formula are applied only in this formula.

(13)

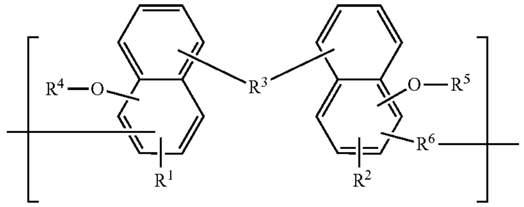

In the formula (13), $R^1$ and $R^2$ independently represent a hydrogen atom, a linear, branched, or cyclic alkyl group having 1 to 10 carbon atoms, an aryl group having 6 to 10 carbon atoms, or an alkenyl group having 2 to 10 carbon atoms. These groups may be the same as or different from each other. $R^3$ represents a single bond or an alkylene group having 1 to 30 carbon atoms and having a linear, branched, or cyclic structure. $R^3$ optionally has a bridged cyclic hydrocarbon group, a double bond, a heteroatom, or an aromatic group having 6 to 30 carbon atoms. $R^4$ and $R^5$ each independently represent a hydrogen atom or a glycidyl group. $R^6$ represents a single bond, or a linear or branched alkylene group having 1 to 10 carbon atoms. The symbols in the formula are applied only in this formula.

(14)

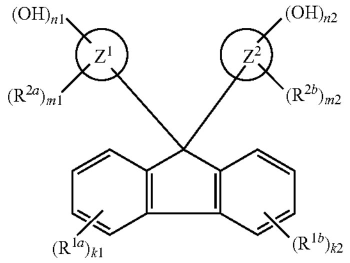

In the formula (14), ring $Z^1$ and ring $Z^2$ represent a condensed polycyclic aromatic hydrocarbon ring. $R^{1a}$, $R^{1b}$, $R^{2a}$, and $R^{2b}$ represent same or different substituents. "k1" and "k2" represent same or different integers of 0 or 1 to 4. "m1" and "m2" each represent an integer of 0 or 1 or more. "n1" and "n2" each represent an integer of 0 or 1 or more. "n1" and "n2" satisfy "n1+n2"≥1. The symbols in the formula are applied only in this formula.

(15)

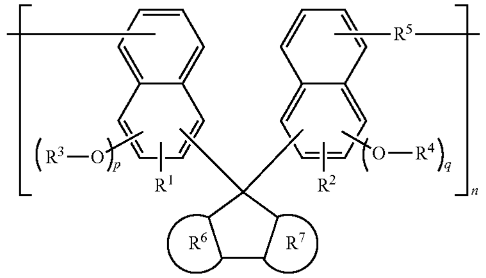

In the formula (15), $R^1$ and $R^2$ represent a hydrogen atom, a linear, branched, or cyclic alkyl group having 1 to 10 carbon atoms, an aryl group having 6 to 10 carbon atoms, or an alkenyl group having 2 to 10 carbon atoms. These groups may be the same as or different from each other. $R^3$ and $R^4$ each represent a hydrogen atom or a glycidyl group. $R^5$ represents a single bond, or a linear or branched alkylene group having 1 to 10 carbon atoms. $R^6$ and $R^7$ represent a benzene ring or a naphthalene ring. "p" and "q" each represent 1 or 2. "n" satisfies 0<n≤1. The symbols in the formula are applied only in this formula.

For example, the following compounds are exemplified.

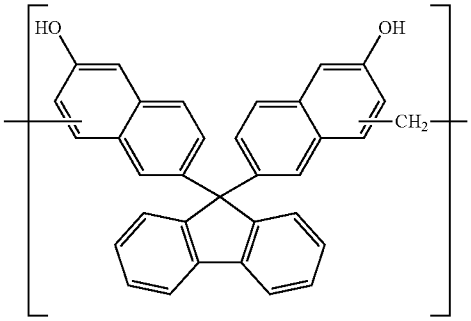

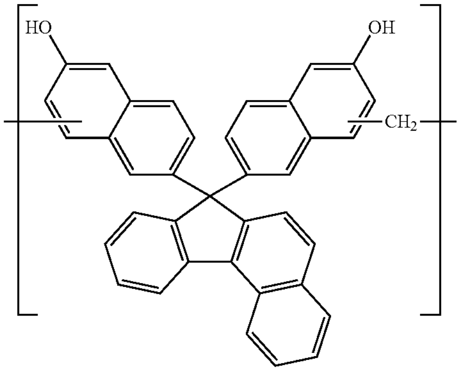

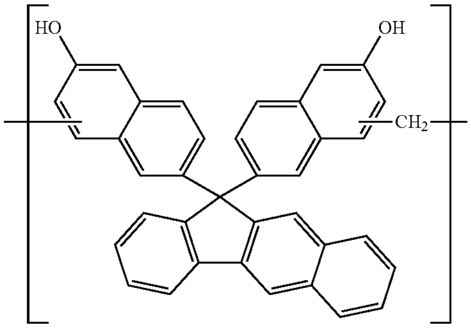

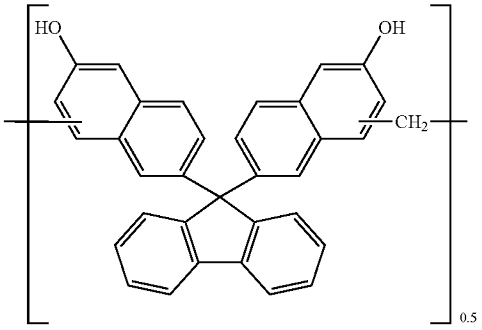

-continued

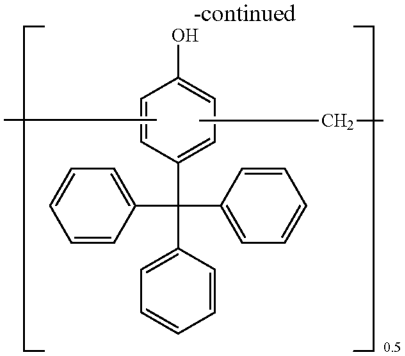

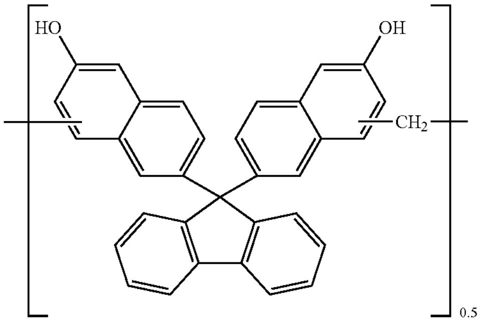

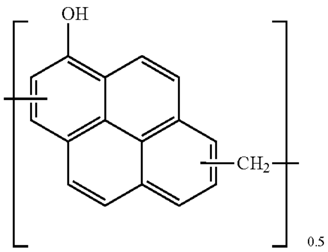

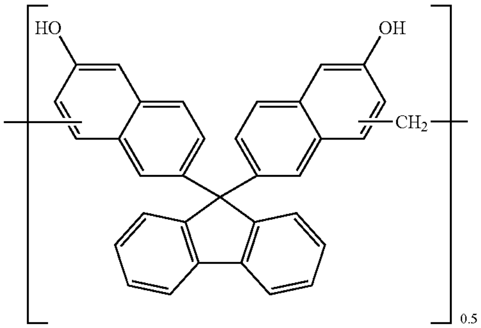

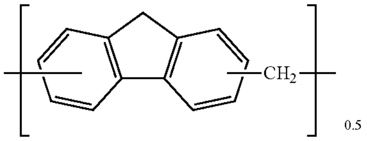

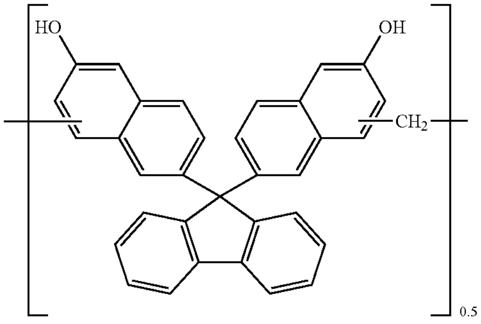

-continued
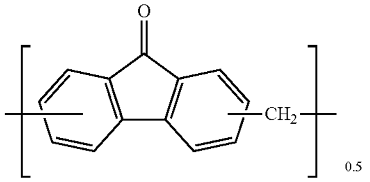
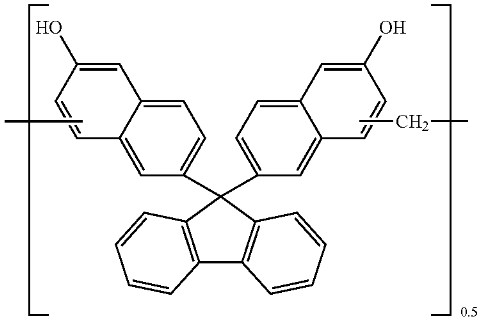
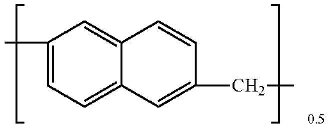
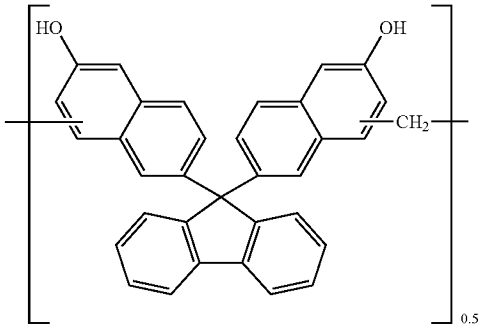
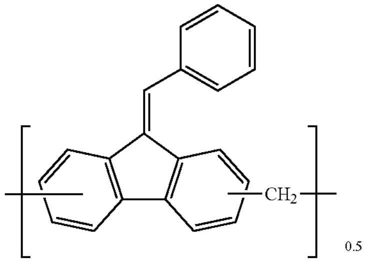
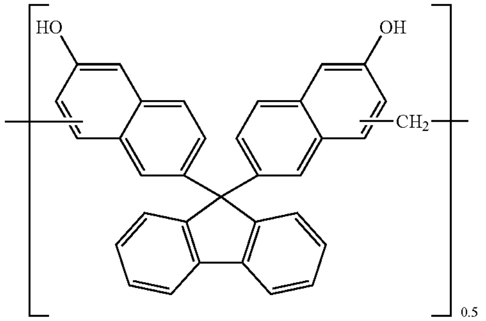
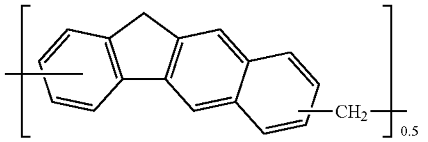
-continued
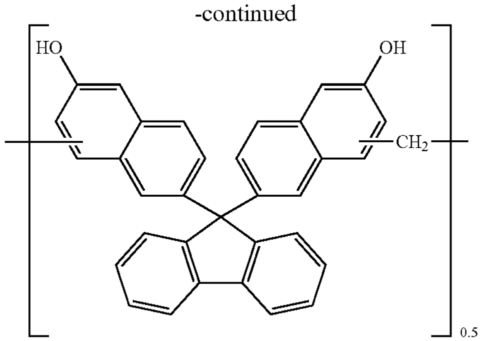
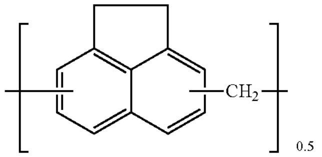
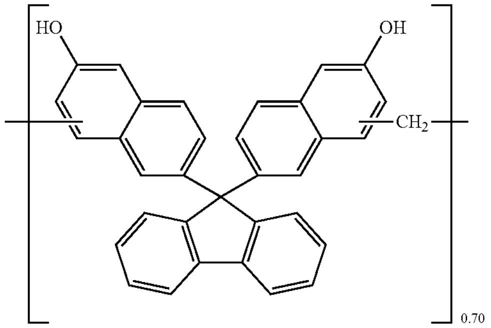
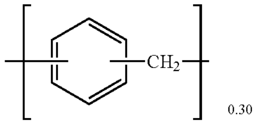
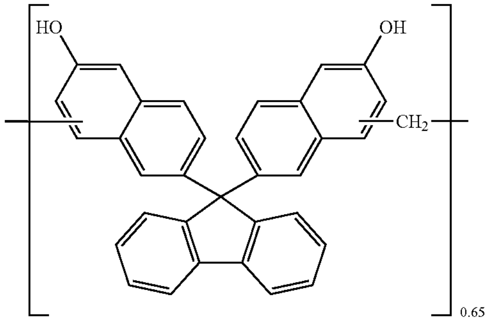
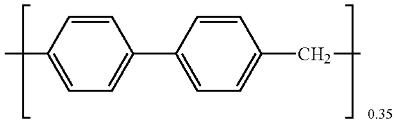
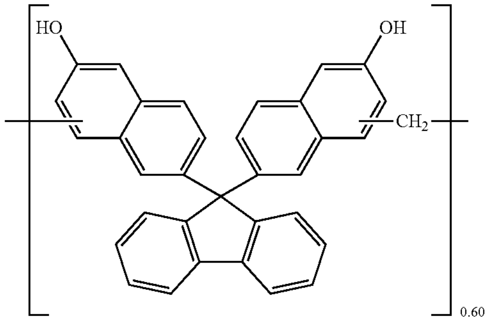

-continued
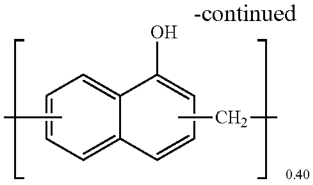
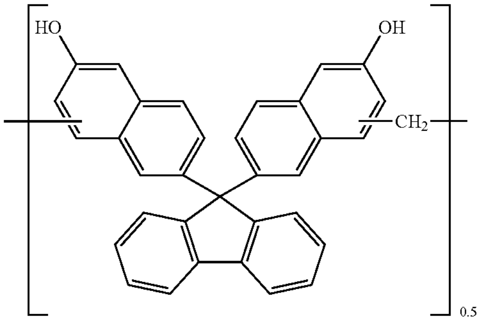
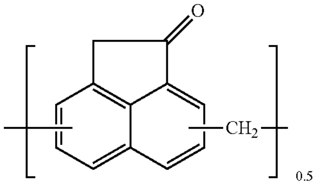
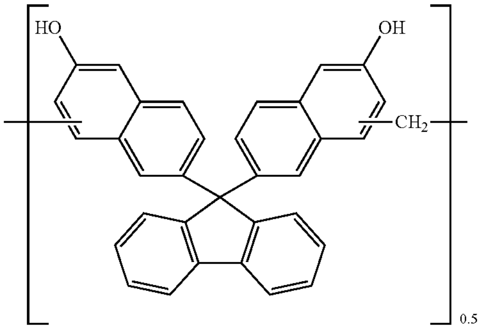
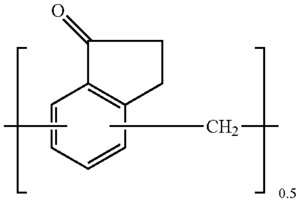
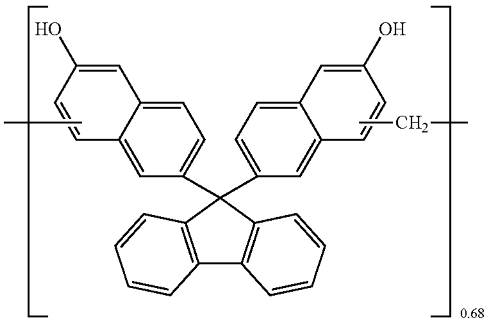
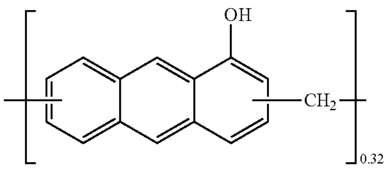
-continued
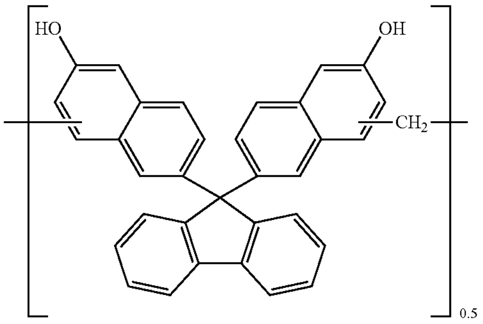
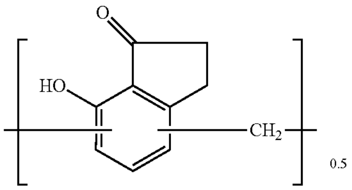
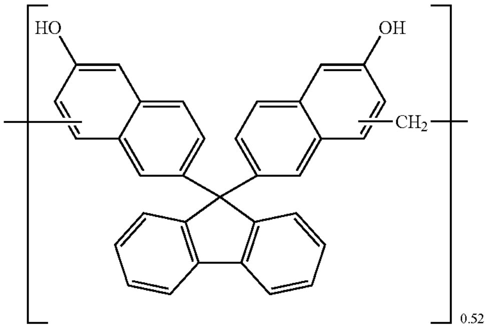
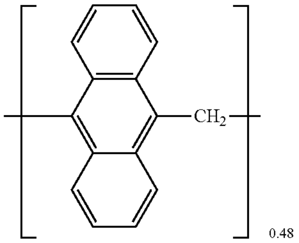
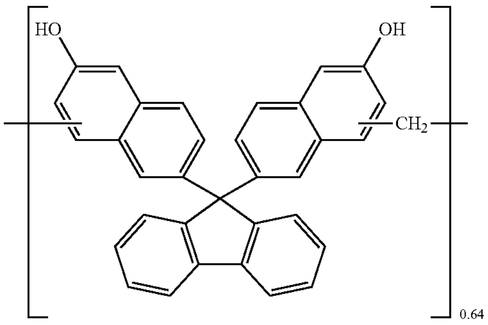
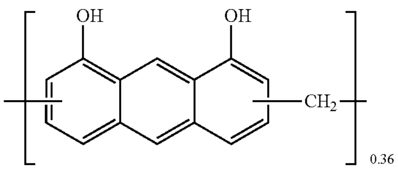

-continued

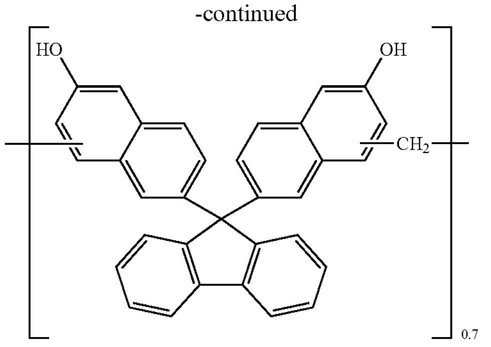

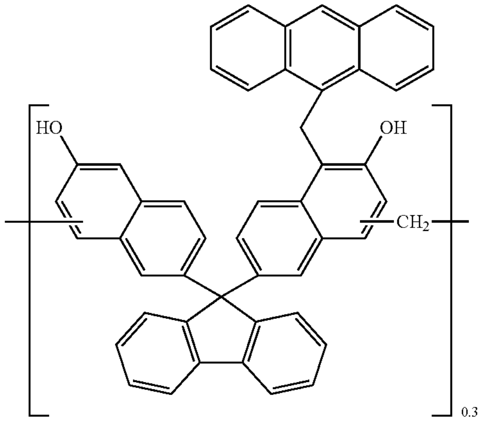

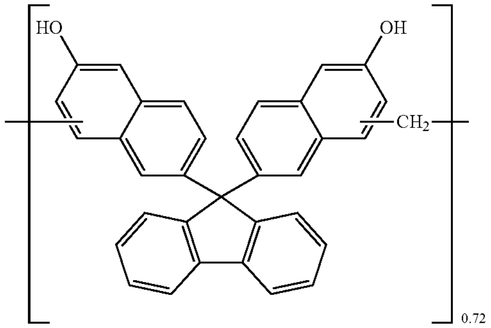

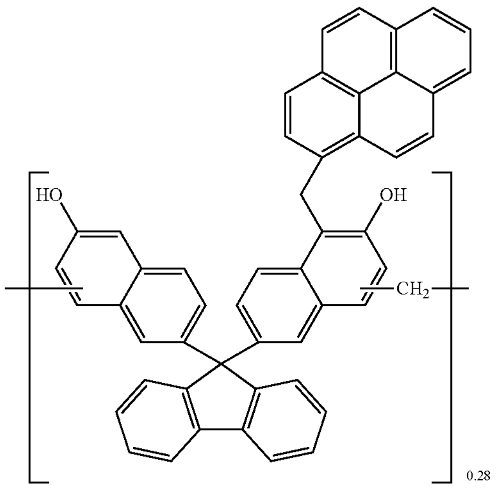

Examples of the resin for forming an organic film applied to the present invention include resins described in JP 2012-214720 A and having the following structure.

(16)

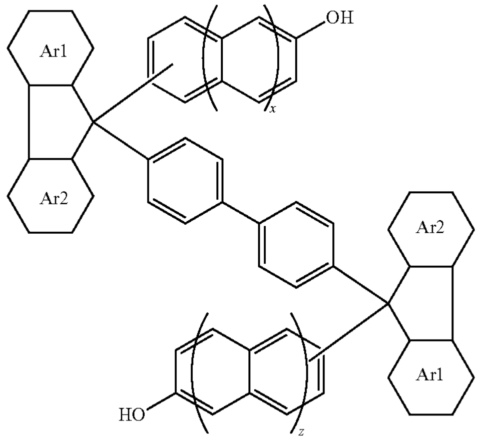

In the formula (16), cyclic structures Ar1 and Ar2 represent a benzene ring or a naphthalene ring. "x" and "z" each independently represent 0 or 1. The symbols in the formula are applied only in this formula.

Examples of the resin for forming an organic film applied to the present invention include resins described in JP 2014-29435 A, WO 2012/077640, and WO 2010/147155.

(17)

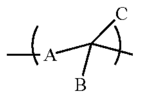

In the formula (17), A represents a structure having carbazole. B represents a structure having an aromatic ring, C represents a hydrogen atom, or a structure having an alkyl group or an aromatic ring. B and C optionally constitute a ring each other. The structure including A, B, and C has 1 to 4 carboxyl groups or salts thereof, or carboxylate ester groups. The symbols in the formula are applied only in this formula.

Polymers, described in WO 2012/077640, having a unit structure represented by the following formula (18) and a unit structure represented by the following formula (19) can be exemplified. A ratio between the unit structure represented by the formula (18) and the unit structure represented by the formula (19) is 3 to 97:97 to 3 in a molar ratio.

(18)

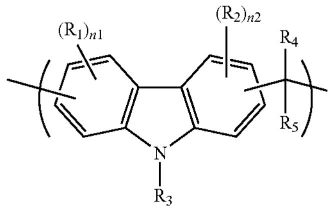

In the formula (18), $R_1$ and $R_2$ each independently represent a hydrogen atom, a halogen atom, a nitro group, an amino group, a hydroxy group, an alkyl group having 1 to 10 carbon atoms, an alkenyl group having 2 to 10 carbon atoms, an aryl group having 6 to 40 carbon atoms, or a combination of these groups optionally having an ether bond, a ketone bond, or an ester bond. $R_3$ represents a hydrogen atom, an alkyl group having 1 to 10 carbon atoms, an alkenyl group having 2 to 10 carbon atoms, an aryl group having 6 to 40 carbon atoms, or a combination of these groups optionally having an ether bond, a ketone bond, or an ester bond. $R_4$ represents a hydrogen atom, an aryl group having 6 to 40 carbon atoms, or a heterocyclic group, and the group is optionally substituted with a halogen atom, a nitro group, an amino group, or a hydroxy group. $R_5$ represents a hydrogen atom, an alkyl group having 1 to 10 carbon atoms, an aryl group having 6 to 40 carbon atoms, or a heterocyclic group, and the group is optionally substituted with a halogen atom, a nitro group, an amino group, or a hydroxy group. $R_4$ and $R_5$ optionally form a ring each other. "n1" and "n2" each represent an integer of 1 to 3. The symbols in the formula are applied only in this formula.

(19)

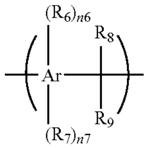

In the formula (19), Ar represents an aromatic ring group having 6 to 20 carbon atoms. $R_6$ represents a hydroxy group. $R_7$ represents a hydrogen atom, a halogen atom, a nitro group, an amino group, an alkyl group having 1 to 10 carbon atoms, an alkenyl group having 2 to 10 carbon atoms, an aryl group having 6 to 40 carbon atoms, or a combination of these groups optionally having an ether bond, a ketone bond, or an ester bond. $R_8$ represents a hydrogen atom, an aryl group having 6 to 40 carbon atoms, or a heterocyclic group, and the group is optionally substituted with a halogen atom, a nitro group, an amino group, or a hydroxy group. $R_9$ represents a hydrogen atom, an alkyl group having 1 to 10 carbon atoms, an aryl group having 6 to 40 carbon atoms, or a heterocyclic group, and the group is optionally substituted with a halogen atom, a nitro group, an amino group, or a hydroxy group. $R_8$ and $R_9$ optionally form a ring each other. "n6" represents an integer of 1 to "p". "n7" represents an integer of "p-n6". Here, "p" represents a maximum number of substituents that the aromatic ring group Ar can have. The symbols in the formula are applied only in this formula.

Examples of the resin for forming an organic film applied to the present invention include polymers described in WO 2010/147155 and having a unit structure represented by the following formula (20).

(20)

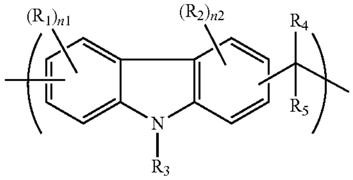

In the formula (20), $R_1$ and $R_2$ are selected from the group consisting of a hydrogen atom, a halogen group, a nitro group, an amino group, a hydroxy group, an alkyl group having 1 to 10 carbon atoms, an alkenyl group having 2 to 10 carbon atoms, an aryl group having 6 to 40 carbon atoms, and a combination of these groups. The alkyl group, the alkenyl group, or the aryl group optionally have an ether bond, a ketone bond, or an ester bond. $R_3$ is selected from the group consisting of a hydrogen atom, an alkyl group having 1 to 10 carbon atoms, an alkenyl group having 2 to 10 carbon atoms, an aryl group having 6 to 40 carbon atoms, and a combination of these groups. The alkyl group, the alkenyl group, or the aryl group optionally have an ether bond, a ketone bond, or an ester bond. $R_4$ represents an aryl group or heterocyclic group having 6 to 40 carbon atoms. The aryl group and the heterocyclic group are optionally substituted with a halogen group, a nitro group, an amino group, or a hydroxy group. $R_5$ represents a hydrogen atom, an alkyl group having 1 to 10 carbon atoms, an aryl group having 6 to 40 carbon atoms, or a heterocyclic group, and the group is optionally substituted with a halogen group, a nitro group, an amino group, or a hydroxy group. $R_4$ and $R_5$ optionally form a ring together with the carbon atom to which $R_4$ and $R_5$ are bonded. "n1" and "n2" each represent an integer of 1 to 3. The symbols in the formula are applied only in this formula.

Examples of the resin for forming an organic film applied to the present invention include novolac resins and resins having a repeating unit structure described in WO 2012/176767 and represented by the following formula (21). The novolac resins are obtained by a reaction of: one or more kinds of phenols, such as phenol, cresol, xylenol, catechol, resorcinol, hydroquinone, pyrogallol, hydroxyquinol, and phloroglucinol; and one or more kinds of aldehyde sources, such as formaldehyde, paraformaldehyde, and trioxane, using an acidic catalyst.

(21)

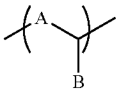

In the formula (21), A represents a hydroxyl group-substituted phenylene group derived from a polyhydroxybenzene. B represents a monovalent condensed aromatic hydrocarbon ring group in which two to six benzene rings are condensed. The symbols in the formula are applied only in this formula.

Examples of the resin for forming an organic film applied to the present invention include resins described in JP 2005-128509 A, JP 2006-259249 A, JP 2006-259482 A, JP 2006-293298 A, and JP 2007-316282 A. In the resins, a novolac resin having a structure of fluorene or tetrahydrospirobiindene has a repeating unit structure represented by the following formula (22-1) or (22-2).

(22-1)

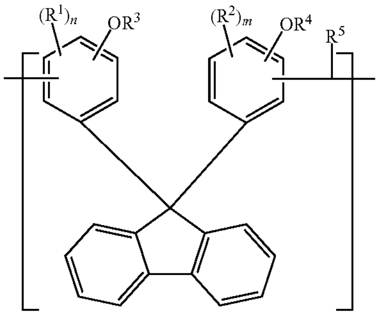

-continued (22-2)

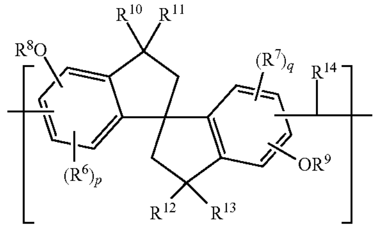

In the formulae (22-1) and (22-2), $R^1$, $R^2$, $R^6$, and $R^7$ independently represent a hydrogen atom, a linear, branched, or cyclic alkyl group having 1 to 10 carbon atoms, an aryl group having 6 to 10 carbon atoms, an allyl group, or a halogen atom. $R^3$, $R^4$, $R^8$, and $R^9$ independently represent a hydrogen atom, a linear, branched, or cyclic alkyl group having 1 to 6 carbon atoms, a linear, branched, or cyclic alkenyl group having 2 to 6 carbon atoms, an aryl group having 6 to 10 carbon atoms, or a glycidyl group. $R^5$ and $R^{14}$ independently represent a hydrogen atom, a linear, branched, or cyclic alkyl group having 1 to 10 carbon atoms, or an aryl group having 6 to 10 carbon atoms. "n", "m", "p", and "q" represent an integer of 1 to 3. $R^{10}$ to $R^{13}$ independently represent a hydrogen atom, a halogen atom, a hydroxy group, a linear, branched, or cyclic alkyl group having 1 to 6 carbon atoms, or a linear, branched, or cyclic alkoxy group having 1 to 6 carbon atoms. The symbols in the formulae are applied only in these formulae.

Examples of the resin for forming an organic film applied to the present invention include reaction products obtained by a method described in JP 2012-145897 A.

More specifically, a polymer obtained by condensing: one or more kinds of compounds represented by the following general formulae (23-1) and/or (23-2); and one or more kinds of compounds represented by the following general formulae (24-1) and/or (24-2), and/or equivalents thereof can be exemplified.

(23-1)

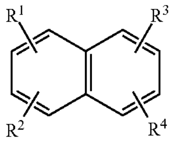

(23-2)

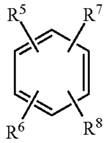

In the formulae (23-1) and (23-2), $R^1$ to $R^8$ each independently represent a hydrogen atom, a halogen atom, a hydroxy group, an isocyanate group, a glycidyloxy group, a carboxyl group, an amino group, an alkoxy group having 1 to 30 carbon atoms, an alkoxycarbonyl group having 1 to 30 carbon atoms, an alkanoyloxy group having 1 to 30 carbon atoms, or an optionally substituted saturated or unsaturated organic group having 1 to 30 carbon atoms. Furthermore, any two substituents selected from each of $R^1$ to $R^4$ or $R^5$ to $R^8$ are optionally bonded in the molecule to form an additional cyclic substituent. The symbols in the formulae are applied only in these formulae.

(24-1)

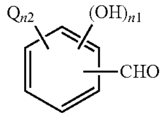

(24-2)

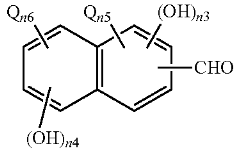

In the formulae (24-1) and (24-2), Q represents an optionally substituted organic group having 1 to 30 carbon atoms. Furthermore, any two Q selected in the molecule are optionally bonded to form a cyclic substituent. "n1" to "n6" represent a number of each substituent, and "n1" to "n6"=0, 1, or 2. The formula (24-1) excludes hydroxybenzaldehyde. The formula (24-2) satisfies relationships of $0 \leq n3+n5 \leq 3$, $0 \leq n4+n6 \leq 4$, and $1 \leq n3+n4 \leq 4$. The symbols in the formulae are applied only in these formulae.

A polymer obtained by condensing: one or more kinds of compounds represented by the general formulae (23-1) and/or (23-2); one or more kinds of compound and/or equivalents thereof represented by the general formulae (24-1) and/or (24-2); and one or more kinds of compounds represented by the general formula (25), and/or equivalents thereof can be exemplified.

$$Y—CHO \quad (25)$$

In the formula (25), Y represents a hydrogen atom or an optionally substituted monovalent organic group having 30 or less carbon atoms. The formula (25) differs from the formulae (24-1) and (24-2). The symbols in the formula are applied only in this formula.

Examples of the resin for forming an organic film applied to the present invention include resins described in JP 2017-119671 A and having the following structure.

$$R \negthinspace - \negthinspace (X)_{m1} \quad (26\text{-}1)$$

In the formula (26-1), R represents a single bond or an organic group having 1 to 50 carbon atoms. X represents a group represented by the following general formula (26-2). "m1" represents an integer satisfying $2 \leq m1 \leq 10$. The symbols in the formula are applied only in this formula.

(26-2)

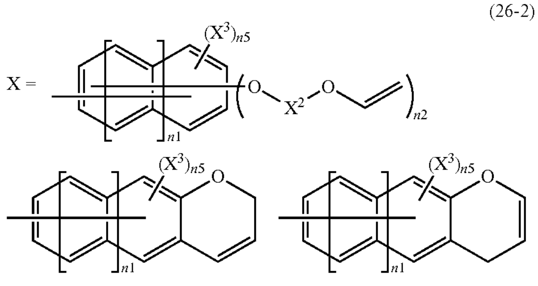

-continued

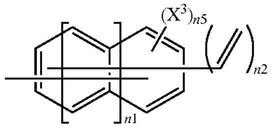

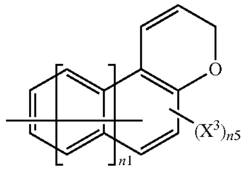

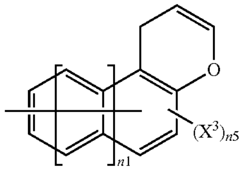

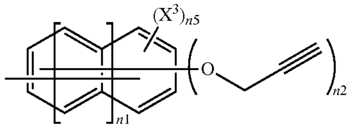

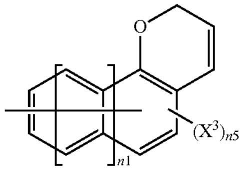

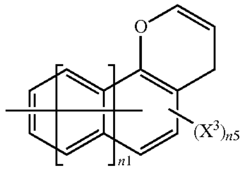

In the formulae, $X^2$ represents a divalent organic group having 1 to 10 carbon atoms. "n1" represents 0 or 1. "n2" represents 1 or 2. $X^3$ represents a group represented by the following general formula (26-3). "n5" represents 0, 1, or 2. The symbols in the formula are applied only in this formula.

(26-3)

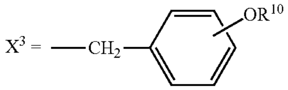

In the formula, $R^{10}$ represents a hydrogen atom or a saturated or unsaturated hydrocarbon group having 1 to 10 carbon atoms. In the formula, hydrogen atoms on the benzene ring are optionally substituted with a methyl group or a methoxy group. The symbols in the formulae are applied only in these formulae.

For example, the following compounds are exemplified.

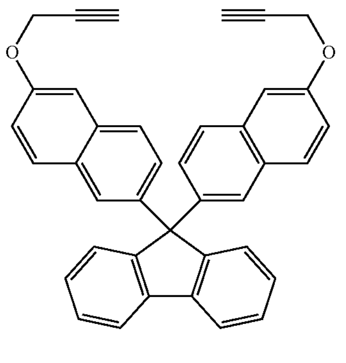

-continued

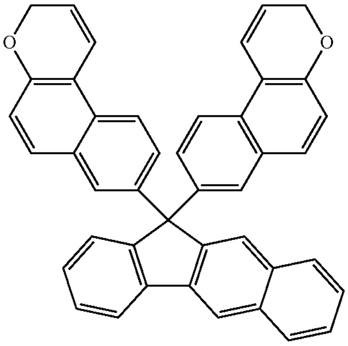

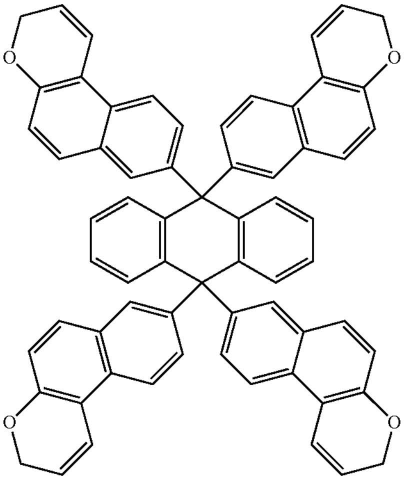

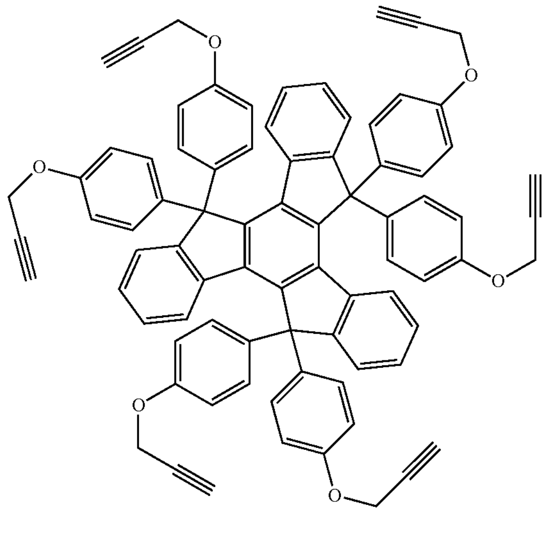

-continued
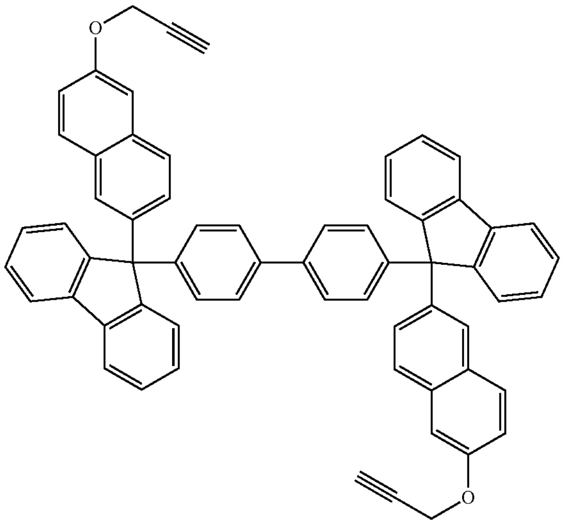
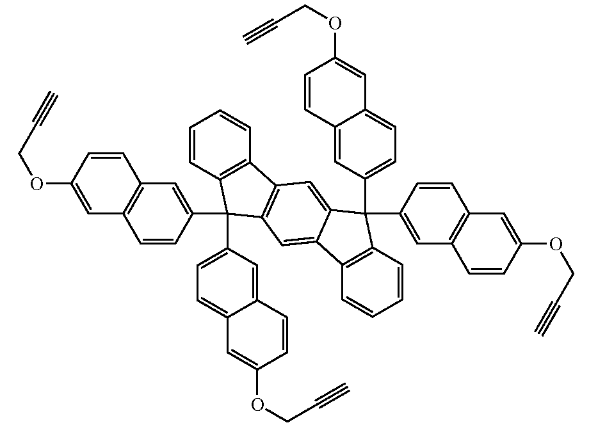
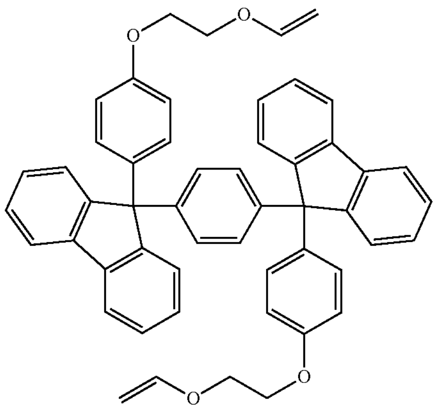
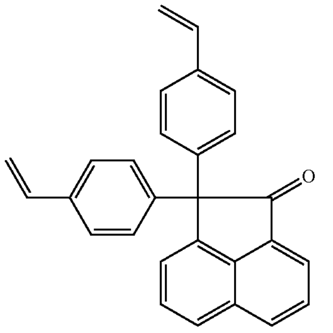
-continued
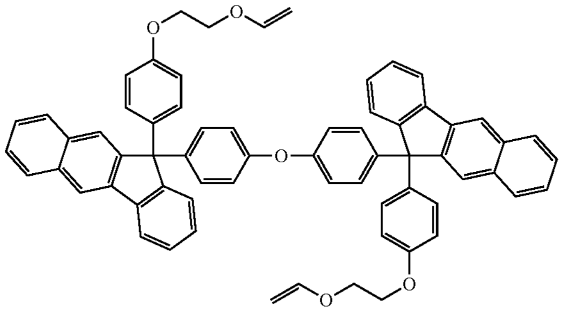
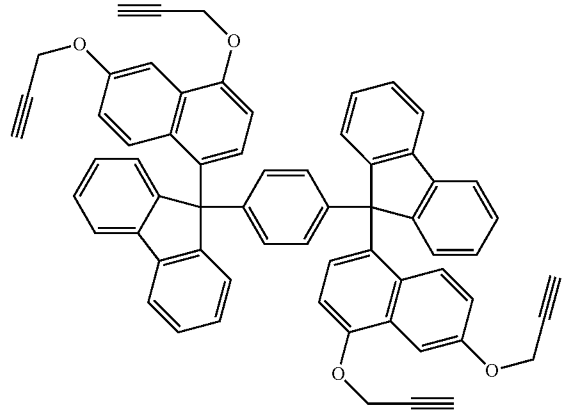
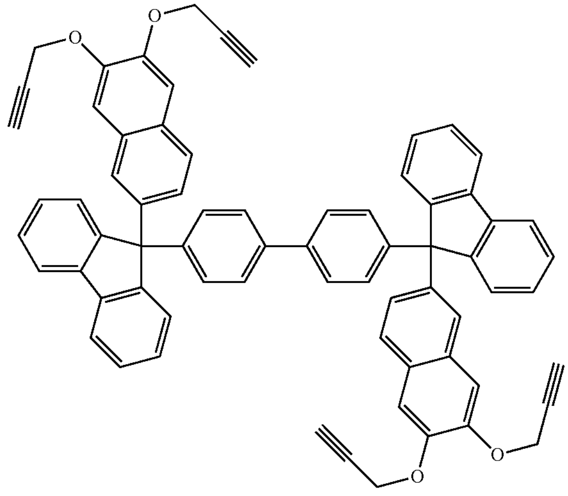
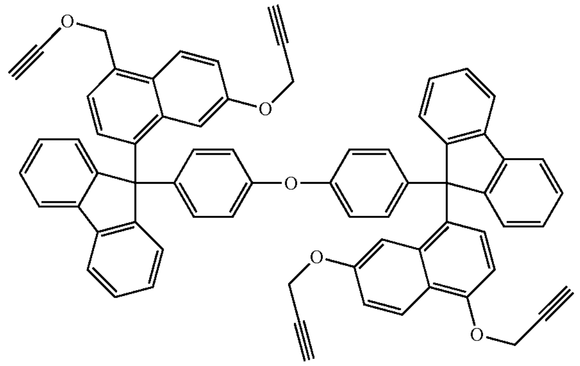
Examples of the resin for forming an organic film applied to the present invention include polymers described in JP 2019-44022 A and having a repeating unit represented by the following general formula (27-1).

(27-1)

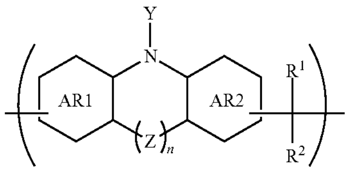

In the formula (27-1), AR1 and AR2 represent an optionally substituted benzene ring or naphthalene ring. $R^1$ and $R^2$ each independently represent a hydrogen atom or an organic group having 1 to 30 carbon atoms. When $R^1$ and $R^2$ represent organic groups, $R^1$ and $R^2$ are optionally bonded in the molecule to form a cyclic organic group. "n" represents 0 or 1. When n=0, AR1 and AR2 do not form a bridged structure of the aromatic rings of AR1 and AR2 via Z. When n=1, AR1 and AR2 form a bridged structure of the aromatic rings of AR1 and AR2 via Z. Z represents a single bond or any one group represented by the following formula (27-2). Y represents a group represented by the following formula (27-3). The symbols in the formula are applied only in this formula.

(27-2)

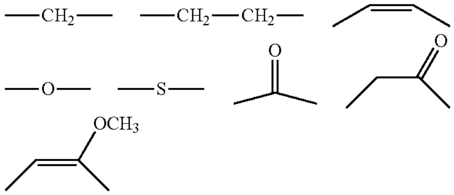

(27-3)

$$----R^3—C\equiv C—R^4$$

In the formula, $R^3$ represents a single bond or a divalent organic group having 1 to 20 carbon atoms. $R^4$ represents a hydrogen atom or a monovalent organic group having 1 to 20 carbon atoms. A broken line represents a bond. The symbols in the formula are applied only in this formula.

For example, the following polymers are exemplified.

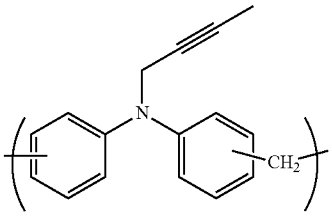

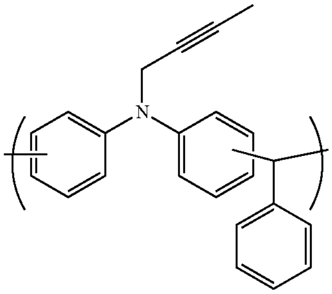

-continued

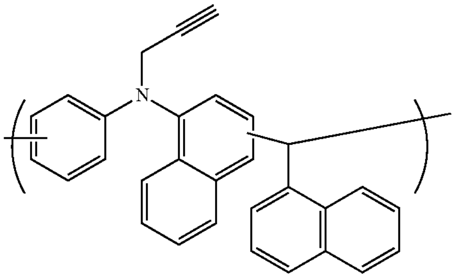

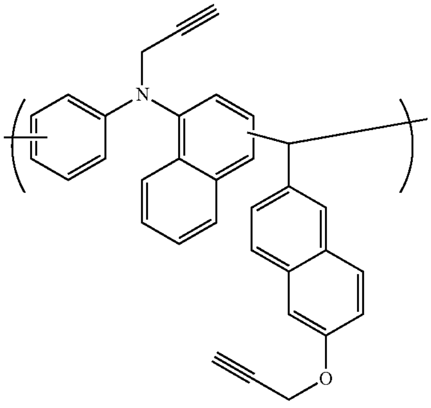

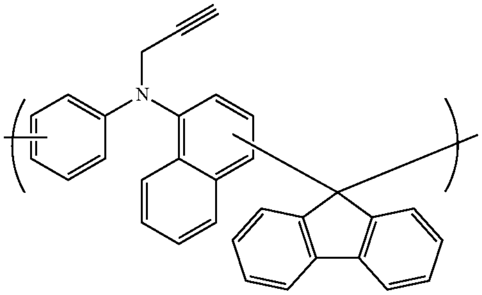

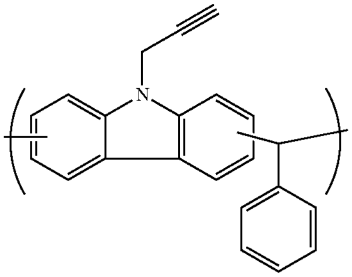

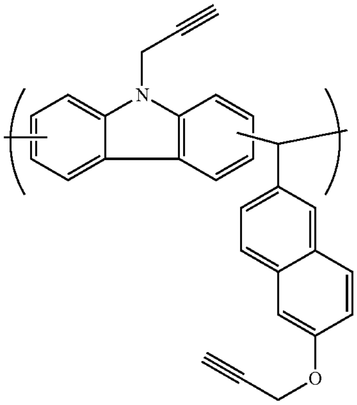

-continued
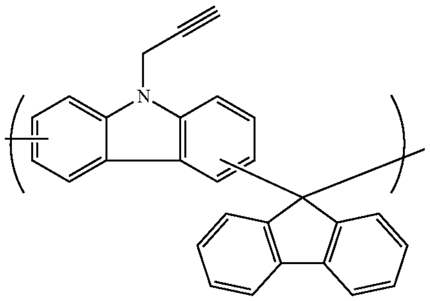
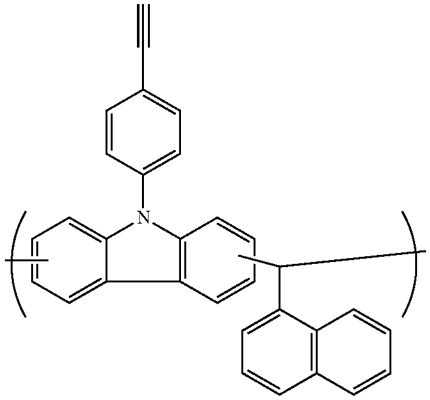
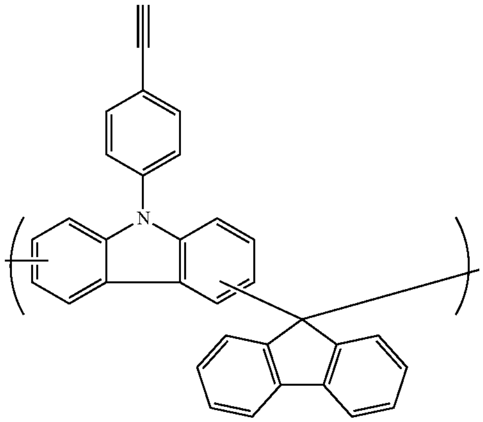
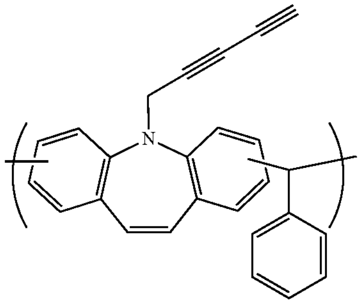
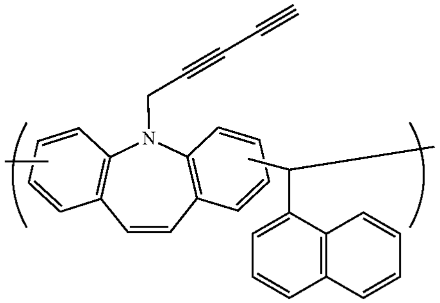
-continued
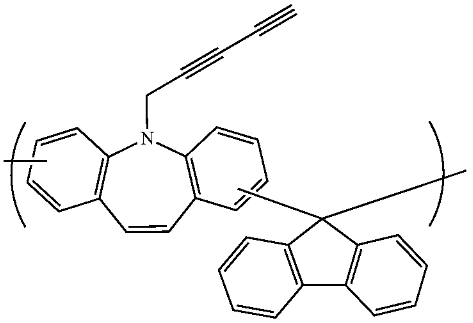
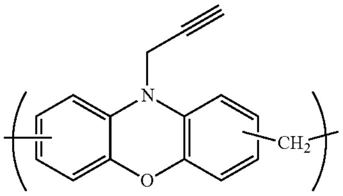
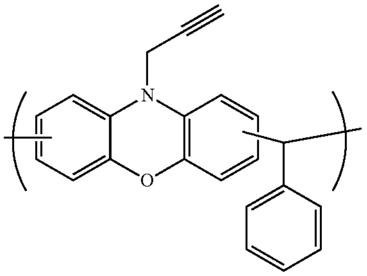
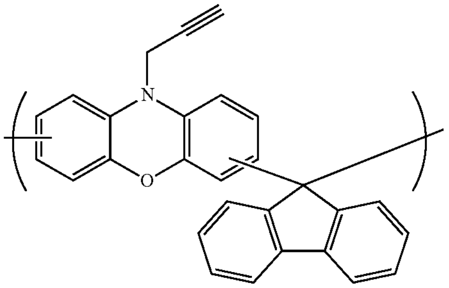
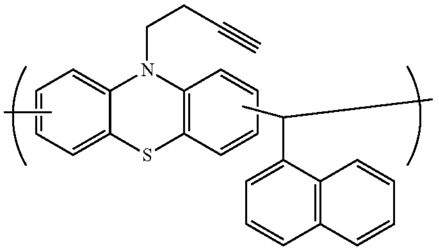
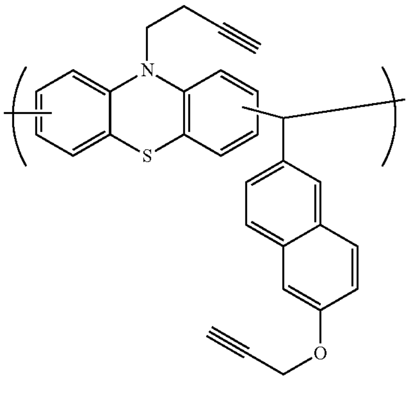

-continued
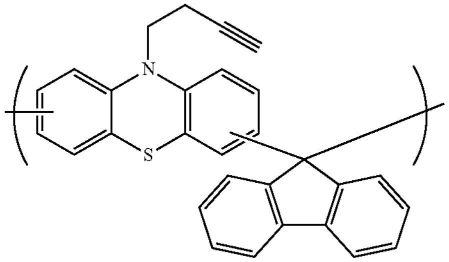
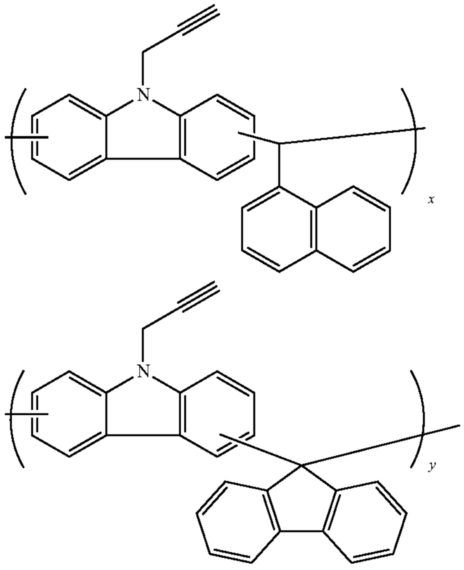
x:y = 50:50
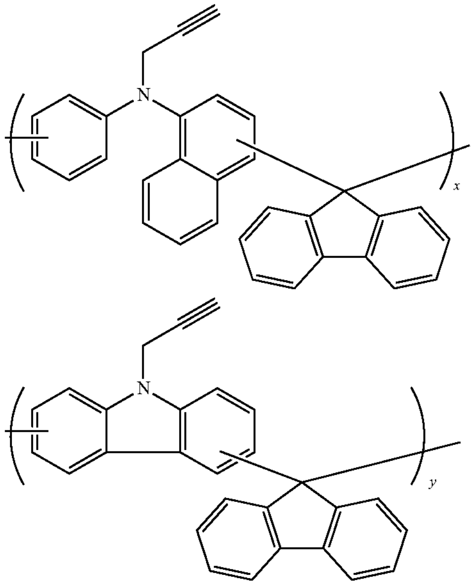
x:y = 30:70
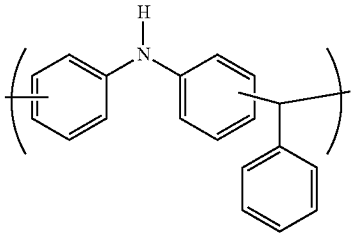
-continued
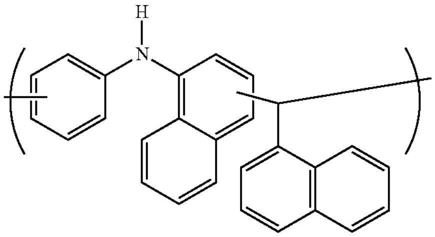
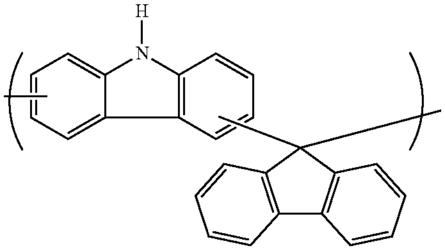
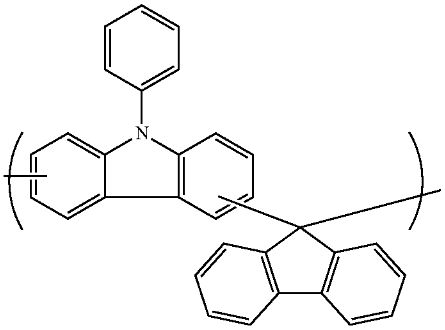
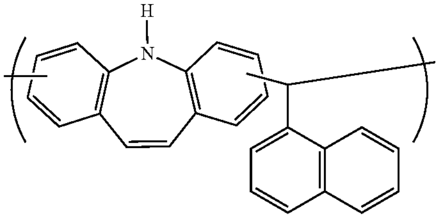
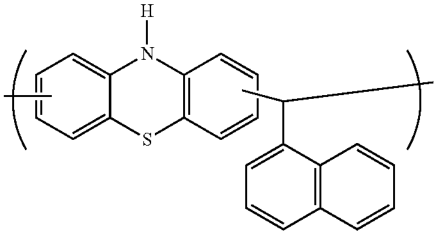
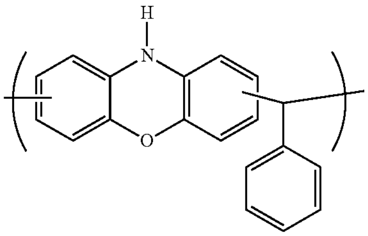
The resin for forming an organic film may be synthesized by known methods, or commercially available products may be used.
A blending amount of the resin for forming an organic film is preferably, for example, 0.2 to 50 parts by mass, and more preferably 1 to 33.3 parts by mass, relative to 100 parts by mass of the composition for forming an organic film.

[Solvent]

The solvent usable in the inventive composition for forming an organic film is not particularly limited as long as it can dissolve the resin for forming an organic film and the planarizing agent for forming an organic film. Favorably, the solvent can also dissolve an acid generator, a crosslinker, a surfactant, etc., described later. Specific examples thereof include: ketones, such as 2-heptanone, cyclopentanone, and cyclohexanone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, γ-butyrolactone, and propylene glycol mono-tert-butyl ether acetate. One or more kinds thereof may be mixed to be used, and the solvent is not limited thereto.

Among these, propylene glycol monomethyl ether acetate, propylene glycol monomethyl ether, 2-heptanone, cyclopentanone, cyclohexanone, γ-butyrolactone, and a mixture of two or more kinds thereof are preferably used.

A blending amount of the solvent is preferably 100 to 50,000 parts by mass, and more preferably 200 to 10,000 parts by mass, relative to 100 parts by mass of the resin for forming an organic film.

[Other Components]

With the inventive composition for forming an organic film, an acid generator, a crosslinker, etc. to further promote the crosslinking reaction can be added.

The acid generator includes an acid generator to generate an acid by thermal decomposition and an acid generator to generate an acid by light irradiation, and any of them may be added. Specific examples of the acid include acid generators described in paragraphs (0061) to (0085) of JP 2007-199653 A.

A blending amount of the acid generator is not particularly limited, and may be, for example, 0.05 to 50 parts by mass relative to 100 parts by mass of the resin for forming an organic film.

Specific examples of the crosslinker include crosslinkers described in paragraphs (0055) to (0060) of JP 2007-199653 A.

A blending amount of the crosslinker is not particularly limited, and may be, for example, 1 to 50 parts by mass relative to 100 parts by mass of the resin for forming an organic film.

With the inventive composition for forming an organic film, a surfactant can be added to improve coatability by spin-coating. Specific examples of the surfactant include surfactants described in paragraphs (0142) to (0147) in JP 2009-269953 A.

A blending amount of the surfactant is not particularly limited, and may be, for example, 0.001 to 20 parts by mass relative to 100 parts by mass of the resin for forming an organic film.

With the inventive composition for forming an organic film, a basic compound to improve storage stability can be further added. The basic compound prevents proceeding of the crosslinking reaction due to a small amount of an acid generated from the acid generator, and plays a role of a quencher against the acid. Specific examples of such a basic compound include compounds described in paragraphs (0086) to (0090) in JP 2007-199653 A.

As described above, the inventive composition for forming an organic film yields the composition for forming an organic film having the high planarizing ability. Therefore, the inventive composition for forming an organic film is extremely useful for an composition for forming an organic film for a multilayer resist process such as: a two-layer resist process; a three-layer resist process using a silicon-containing resist intermediate film or a silicon-containing inorganic hard mask; and a four-layer resist process using a silicon-containing resist intermediate film or a silicon-containing inorganic hard mask, and an organic anti-reflective film or an adhesive film. Since having excellent planarizing ability, the inventive composition for forming an organic film can also be suitably used as a planarizing material for a semiconductor device manufacturing process other than the multilayer resist process.

[Method for Forming Organic Film]

The present invention provides a method for forming an organic film functioning as an organic planarizing film used in a semiconductor device manufacturing process comprising: applying the above inventive composition for forming an organic film on a substrate to be processed by spin-coating; and heat-treating the substrate coated with the composition for forming an organic film within a range of a temperature of 100° C. or higher and 600° C. or lower for 10 to 600 seconds to form a cured film.

In this method for forming an organic film, the above inventive composition for forming an organic film is firstly applied on the substrate to be processed by spin-coating. Using the spin-coating method can yield the good filling ability. After the spin-coating, baking (heat treatment) is performed to promote the planarization with the thermal flow and the crosslinking reaction. Since this baking can evaporate the solvent in the composition, mixing can be prevented even when the resist upper layer film or the silicon-containing resist intermediate film is formed on the organic film.

The baking is performed within a range of a temperature of 100° C. or higher and 600° C. or lower for 10 to 600 seconds, preferably within a range of a temperature of 200° C. or higher and 500° C. or lower for 10 to 300 seconds. With considering effects on device damage and wafer deformation, an upper limit of the heating temperature in the wafer process of the lithography is preferably 600° C. or lower, and more preferably 500° C. or lower. The heat treatment under such a condition can promote the planarization with the thermal flow and the crosslinking reaction, and can form an organic film without mixing with a film to be formed thereon.

For example, the present invention can also form a cured film by: applying the above inventive composition for forming an organic film on a substrate to be processed by spin-coating; heat-treating the substrate coated with the composition for forming an organic film within a range of a temperature of 100° C. or higher and 350° C. or lower for 10 to 600 seconds (first baking); and further heat-treating the substrate within a range of a temperature of 100° C. or higher and 600° C. or lower for 10 to 600 seconds (second baking).

The first baking performed at a temperature not causing the crosslinking reaction of the resin for forming an organic film proceeds the planarization with the thermal flow, and the second baking proceeds the crosslinking reaction to enable to obtain a further excellently planarized cured film.

In the inventive method for forming an organic film, a substrate to be processed having a structure or step with 20 nm or more in height is preferably used. As described above, the inventive composition for forming an organic film has excellent filling/planarizing ability. Thus, a planarized cured film can be formed even on the substrate to be processed having a structure or step with 20 nm or more in height (roughness). That is, the inventive method for forming an organic film is particularly useful when the planarized organic film is formed on such a substrate to be processed. The maximum height is not particularly limited, but it may be set to, for example, 500 nm.

A thickness of the organic film to be formed is appropriately selected, and preferably 20 to 20,000 nm, and particularly preferably 50 to 15,000 nm.

The above method for forming an organic film can be applied for both of forming an organic film for an organic underlayer film and forming an organic film for planarizing film, by using the inventive composition for forming an organic film.

[Patterning Process]

[Three-Layer Resist Process Using Silicon-Containing Resist Intermediate Film]

The present invention provides a patterning process comprising: forming an organic film on a body to be processed by using the above inventive composition for forming an organic film; forming a resist intermediate film on the organic film by using a resist intermediate film material having a silicon atom; forming a resist upper layer film on the resist intermediate film by using a resist upper layer film material composed of a photoresist composition; forming a circuit pattern in the resist upper layer film; transferring the pattern to the resist intermediate film by etching while using the resist upper layer film having the formed circuit pattern as a mask; transferring the pattern to the organic film by etching while using the resist intermediate film having the transferred pattern as a mask; and further transferring the pattern to the body to be processed by etching while using the organic film having the transferred pattern as a mask.

As the substrate to be processed, a semiconductor apparatus substrate or a substrate in which any of a metal film, a metal carbide film, a metal oxide film, a metal nitride film, a metal oxycarbide film, and a metal oxynitride film is formed on the semiconductor apparatus substrate is preferably used. More specifically, a substrate such as Si, α-Si, p-Si, $SiO_2$, SiN, SiON, W, TiN, and Al; and a substrate in which the above metal film is formed on the substrate as a layer to be processed are used.

As the layer to be processed, various low-k films such as Si, $SiO_2$, SiON, SiN, p-Si, α-Si, W, W—Si, Al, Cu, and Al—Si, and stopper films thereof are used. The layer to be processed can be formed to have a thickness of typically 50 to 10,000 nm, particularly 100 to 5,000 nm. When the layer to be processed is formed, the substrate and the layer to be processed having different materials are used.

A metal constituting the body to be processed is preferably silicon, titanium, tungsten, hafnium, zirconium, chromium, germanium, copper, silver, gold, aluminum, indium, gallium, arsenic, palladium, iron, tantalum, iridium, molybdenum, or an alloy thereof.

As the body to be processed, a substrate to be processed having a structure or step with 30 nm or more in height is preferably used.

When the organic film is formed on the body to be processed by using the inventive composition for forming an organic film, the above inventive method for forming an organic film is applied.

Then, the resist intermediate film (silicon-containing resist intermediate film) is formed on the organic film by using the resist intermediate film material containing a silicon atom. As the resist intermediate film material containing a silicon atom, a polysiloxane-based intermediate film material is preferable. Imparting an anti-reflective effect to the silicon-containing resist intermediate film can inhibit reflection. In particular, using a material for 193-nm exposure containing a large amount of aromatic groups and having high etching selectivity to the substrate as the composition for forming an organic film increases the k-value to increase reflection on the substrate. However, the silicon-containing resist intermediate film having the absorption so as to have an appropriate k-value can inhibit the reflection, resulting in the substrate reflection of 0.5% or less. Preferably used for the silicon-containing resist intermediate film having the anti-reflective effect is anthracene for 248-nm or 157-nm exposure, and a polysiloxane crosslinkable with an acid or heat for 193-nm exposure. The polysiloxane has a light absorption group having a phenyl group or silicon-silicon bond at the pendant structure.

Then, the resist upper layer film is formed on the resist intermediate film by using the resist upper layer film material composed of the photoresist composition. The resist upper layer film material may be any of positive-type or negative-type, and a material same as commonly used photoresist compositions can be used. After the resist upper layer film material is applied by spin-coating, the pre-baking is preferably performed within a range at 60 to 180° C. for 10 to 300 seconds. Thereafter, the exposure, then post exposure bake (PEB), and development are performed in accordance with a common method to obtain the resist upper layer film pattern. A thickness of the resist upper layer film is not particularly limited, and preferably 30 to 500 nm, particularly preferably 50 to 400 nm.

Then, the circuit pattern (resist upper layer film pattern) is formed in the resist upper layer film. The circuit pattern is preferably formed by lithography using light having a wavelength of 10 nm or more and 300 nm or less, direct writing with electron beam, nanoimprinting, or a combination thereof.

Examples of the exposure light include a high-energy ray having a wavelength of 300 nm or less, and specifically, far ultraviolet ray, KrF excimer laser light (248 nm), ArF excimer laser light (193 nm), $F_2$ excimer laser light (157 nm), $Kr_2$ laser light (146 nm), Are laser light (126 nm), soft X-ray with 3 to 20 nm (EUV), electron beam (EB), ion beam, and X-ray.

The circuit pattern is preferably developed with an alkaline development or an organic solvent to form the pattern.

Then, the pattern is transferred to the resist intermediate film by etching while using the resist upper layer film having the formed circuit pattern as a mask. The etching of the resist intermediate film while using the resist upper layer film pattern as a mask is preferably performed by using a fluorocarbon-based gas. This etching forms the silicon-containing resist intermediate film pattern.

Then, the pattern is transferred to the organic film by etching while using the resist intermediate film having the transferred pattern as a mask. Since the silicon-containing resist intermediate film has etching resistance against oxygen gas or hydrogen gas, the etching of the organic film while using the silicon-containing resist intermediate film pattern as a mask is preferably performed by using an etching gas mainly composed of oxygen gas or hydrogen gas. This etching forms the organic film pattern.

Then, the pattern is transferred to the body to be processed by etching while using the organic film having the transferred pattern as a mask. The subsequent etching of the body to be processed (layer to be processed) can be performed by a common method. For example, when the body to be processed is $SiO_2$-based, SiN-based, or silica-based low dielectric-constant insulative film, the etching is performed mainly using a fluorocarbon-based gas. When the body to be processed is p-Si, Al, or W, the etching is performed mainly using a chlorine-based or bromine-based gas. When the substrate is processed by etching using the fluorocarbon-based gas, the silicon-containing resist intermediate film pattern is simultaneously removed with the substrate processing. Meanwhile, when the substrate is processed by etching using the chlorine-based or bromine-based gas, a dry-etching removal using the fluorocarbon-based gas is required to be separately performed after the substrate processing in order to remove the silicon-containing resist intermediate film pattern.

The organic film obtained by using the inventive composition for forming an organic film has excellent etching resistance during the above etching of the body to be processed.

[Four-Layer Resist Process Using Silicon-Containing Resist Intermediate Film and Organic Anti-Reflective Film or Adhesive Film]

The present invention also provides a patterning process comprising: forming an organic film on a body to be processed by using the above inventive composition for forming an organic film; forming a resist intermediate film on the organic film by using a resist intermediate film material having a silicon atom; forming an organic anti-reflective film or an adhesive film on the resist intermediate film; forming a resist upper layer film on the organic anti-reflective film or the adhesive film by using a resist upper layer film material composed of a photoresist composition; forming a circuit pattern in the resist upper layer film; transferring the pattern to the organic anti-reflective film or the adhesive film, and the resist intermediate film by etching while using the resist upper layer film having the formed circuit pattern as a mask; transferring the pattern to the organic film by etching while using the resist intermediate film having the transferred pattern as a mask; and further transferring the pattern to the body to be processed by etching while using the organic film having the transferred pattern as a mask.

This method can be performed in the same manner as the above three-layer resist process using the silicon-containing resist intermediate film except that the organic anti-reflective film (bottom ant-reflection coating: BARC) or the adhesive film is formed between the resist intermediate film and the resist upper layer film.

The organic anti-reflective film and the adhesive film can be formed with spin-coating by using a known organic anti-reflective film material.

[Three-Layer Resist Process Using Inorganic Hard Mask]

The present invention also provides, as a three-layer resist process using the above inventive composition for forming an organic film, a patterning process comprising: forming an organic film on a body to be processed by using the above inventive composition for forming an organic film; forming an inorganic hard mask selected from a silicon oxide film, a silicon nitride film, and a silicon oxynitride film on the organic film; forming a resist upper layer film on the inorganic hard mask by using a resist upper layer film material composed of a photoresist composition; forming a circuit pattern in the resist upper layer film; transferring the pattern to the inorganic hard mask by etching while using the resist upper layer film having the formed circuit pattern as a mask; transferring the pattern to the organic film by etching while using the inorganic hard mask having the transferred pattern as a mask; and further transferring the pattern to the body to be processed by etching while using the organic film having the transferred pattern as a mask.

This method can be performed in the same manner as the above three-layer resist process using the silicon-containing resist intermediate film except that the inorganic hard mask is formed on the organic film instead of the resist intermediate film.

The inorganic hard mask selected from a silicon oxide film, a silicon nitride film, and a silicon oxynitride film (SiON film) can be formed by a CVD method, an ALD method, etc. The method for forming the silicon nitride film is described in, for example, JP 2002-334869 A, WO 2004/066377, etc. A film thickness of the inorganic hard mask is preferably 5 to 200 nm, and more preferably 10 to 100 nm. As the inorganic hard mask, the SiON film, which is highly effective as the anti-reflective film, is most preferably used. Since the substrate temperature during the SiON film formation reaches 300 to 500° C., the underlayer film is required to resist the temperature of 300 to 500° C. The organic film formed by using the inventive composition for forming an organic film has high heat resistance and can resist the high temperature of 300° C. to 500° C., and thereby the inorganic hard mask formed by the CVD method or the ALD method and the organic film formed by spin-coating method can be combined.

[Four-Layer Resist Process Using Inorganic Hard Mask and Organic Anti-Reflective Film]

The present invention also provides, as a four-layer resist process using the above inventive composition for forming an organic film, a patterning process comprising: forming an organic film on a body to be processed by using the above inventive composition for forming an organic film; forming an inorganic hard mask selected from a silicon oxide film, a silicon nitride film, and a silicon oxynitride film on the organic film; forming an organic anti-reflective film or an adhesive film on the inorganic hard mask; forming a resist upper layer film on the organic anti-reflective film or the adhesive film by using a resist upper layer film material composed of a photoresist composition; forming a circuit pattern in the resist upper layer film; transferring the pattern to the organic anti-reflective film or the adhesive film, and the inorganic hard mask by etching while using the resist upper layer film having the formed circuit pattern as a mask; transferring the pattern to the organic film by etching while using the inorganic hard mask having the transferred pattern as a mask; and further transferring the pattern to the body to be processed by etching while using the organic film having the transferred pattern as a mask.

This method can be performed in the same manner as the above three-layer resist process using the inorganic hard mask except that the organic anti-reflective film (BARC) or the adhesive film is formed between the inorganic hard mask and the resist upper layer film.

In particular, when the SiON film is used as the inorganic hard mask, the reflection can be inhibited by the two-layer anti-reflective film including the SiON film and the BARC even with the immersion exposure having high NA of more than 1.0. Another merit of forming the BARC is an effect of reducing footing of the resist upper layer film pattern just on the SiON film.

Here, an example of the patterning process with the inventive three-layer resist process will be described in FIGS. 4(A) to (F). In the three-layer resist process, as illustrated in FIG. 4(A), an organic film 3 is formed on a layer 2 to be processed formed on a substrate 1 by using the inventive composition for forming an organic film, then a silicon-containing resist intermediate film 4 is formed, and a resist upper layer film 5 is formed thereon. Then, as illustrated in FIG. 4(B), an exposure portion 6 in the resist upper layer film 5 is exposed, and post exposure bake (PEB) is performed. Thereafter, as illustrated in FIG. 4(C), development is performed to form a resist upper layer film pattern 5*a*. Subsequently, as illustrated in FIG. 4(D), the silicon-containing resist intermediate film 4 is processed by dry-etching with a fluorocarbon-based gas while using the resist upper layer film pattern 5*a* as a mask to form a silicon-containing resist intermediate film 4*a*. Then, as illustrated in FIG. 4(E), the resist upper layer film 5*a* is removed, and then the organic film 3 is etched by oxygen plasma while using the silicon-containing resist intermediate film pattern 4*a* as a mask to form an organic film pattern 3*a*. Furthermore, as illustrated FIG. 4(F), the silicon-containing resist intermediate film pattern 4*a* is removed, and then the layer 2 to be processed is processed by dry-etching while using the organic film pattern 3*a* as a mask to form a pattern 2*a*.

When forming the inorganic hard mask, the silicon-containing resist intermediate film 4 may be changed to the inorganic hard mask. When forming the BARC or the adhesive film, the BARC or the adhesive film may be formed between the silicon-containing resist intermediate film 4 and the resist upper layer film 5. The BARC may be continuously etched prior to the etching of the silicon-containing resist intermediate film 4. Alternatively, only the BARC may be etched, and then the etching apparatus is changed, for example, to etch the silicon-containing resist intermediate film 4.

As described above, the inventive patterning process can form a fine pattern in the body to be processed with high precision using the multilayer resist process.

EXAMPLE

Hereinafter, the present invention will be described more specifically with showing Synthesis Examples, Comparative Synthesis Examples, Examples, and Comparative Examples, but the present invention is not limited by these examples.

The weight reduction rate from 30° C. to 350° C. was determined by TG (thermal gravity) measurement with a differential thermal balance under a condition of approximate air atmosphere (oxygen 20 vol % and nitrogen 80 vol %) and heating rate of 10° C./min.

[Preparation of Composition for Forming Organic Film (UDL-1 to 45 and Comparative UDL-1 to 17)]

Planarizing agents for forming an organic film (A1) to (A12), comparative additives (a1) to (a8), resins for forming an organic film (B1) to (B6), and solvents (C-1) to (C-2), used for preparing compositions for forming an organic film, are shown below.

[Planarizing Agent for Forming Organic Film]

A1: Compound represented by the following formula (A-1)

A2: Compound represented by the following formula (A-2)

A3: Compound represented by the following formula (A-3)

A4: Compound represented by the following formula (A-4)

A5: Compound represented by the following formula (A-5)

A6: Compound represented by the following formula (A-6)

A7: Compound represented by the following formula (A-7)

A8: Compound represented by the following formula (A-8)

A9: Compound represented by the following formula (A-9)

A10: Compound represented by the following formula (A-10)

A11: Compound represented by the following formula (A-11)

A12: Compound represented by the following formula (A-12)

[Comparative Additive]

a1: Compound represented by the following formula (a-1)

a2: Compound represented by the following formula (a-2)

a3: Compound represented by the following formula (a-3)

a4: Compound represented by the following formula (a-4)

a5: Compound represented by the following formula (a-5)

a6: Compound represented by the following formula (a-6)

a7: Compound represented by the following formula (a-7)

a8: Compound represented by the following formula (a-8)

With regard to the above compounds, Table 1 shows their characteristics: Chemical formula, Molecular weight, Mw, which is represented by a molecular formula, Weight reduction rate from 30° C. to 190° C., and Weight reduction rate from 30° C. to 350° C.

TABLE 1

| Compound | Mw (calculated) | Weight reduction rate from 30° C. to 190° C. | Weight reduction rate from 30° C. to 350° C. |
|---|---|---|---|
| 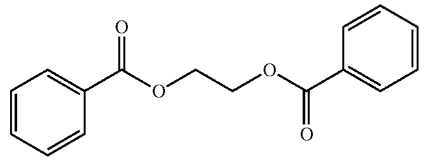 A-1 | 270 | 2 | 100 |

TABLE 1-continued
| Compound | Mw (calcu-lated) | Weight reduction rate from 30° C. to 190° C. | Weight reduction rate from 30° C. to 350° C. |
|---|---|---|---|
| 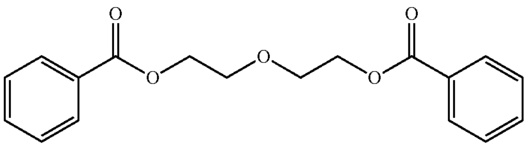 A-2 | 314 | 1 | 100 |
| 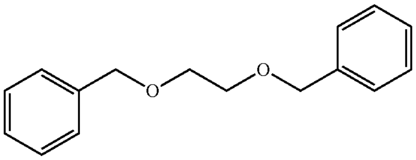 A-3 | 242 | 14 | 100 |
| 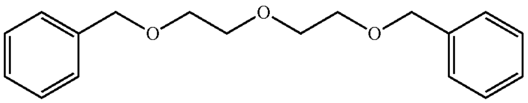 A-4 | 286 | 5 | 99 |
| 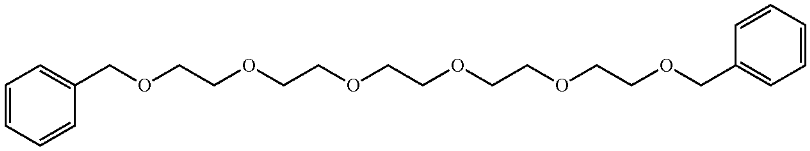 A-5 | 419 | 3 | 100 |
| 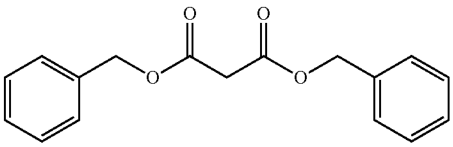 A-6 | 284 | 3 | 99 |
| 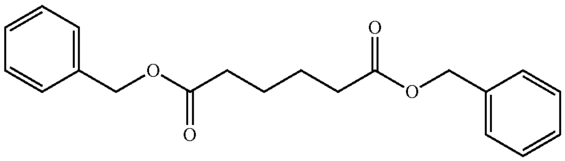 A-7 | 326 | 1 | 99 |
| 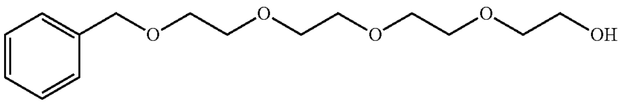 A-8 | 284 | 5 | 100 |

TABLE 1-continued
| Compound | Mw (calculated) | Weight reduction rate from 30° C. to 190° C. | Weight reduction rate from 30° C. to 350° C. |
|---|---|---|---|
| 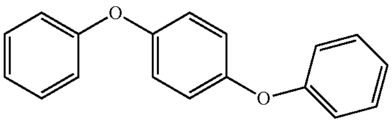 A-9 | 262 | 3 | 100 |
| 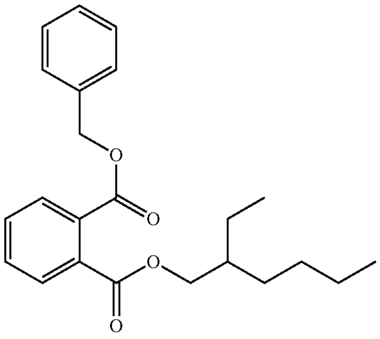 A-10 | 368 | 2 | 100 |
| 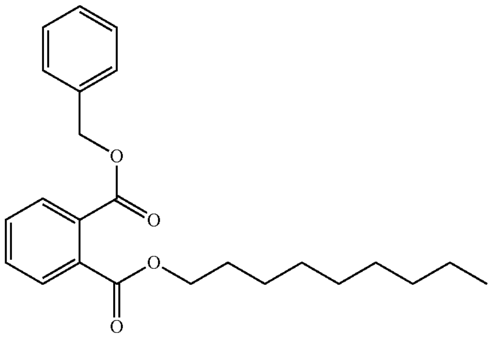 A-11 | 383 | 2 | 100 |
| 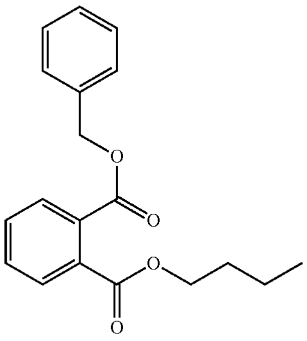 A-12 | 312 | 2 | 100 |

TABLE 1-continued
| Compound | Mw (calculated) | Weight reduction rate from 30° C. to 190° C. | Weight reduction rate from 30° C. to 350° C. |
|---|---|---|---|
| 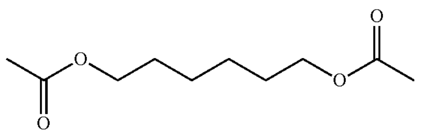 a-1 | 202 | 99 | 100 |
| 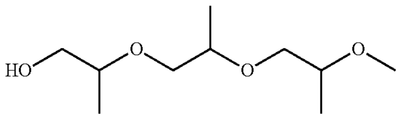 a-2 | 206 | 100 | 100 |
| 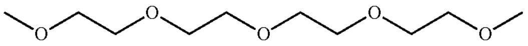 a-3 | 222 | 72 | 100 |
| 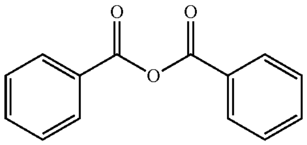 a-4 | 226 | 6 | 100 |
| 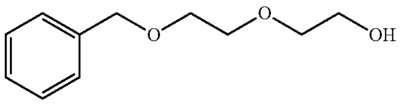 a-5 | 196 | 26 | 99 |
| 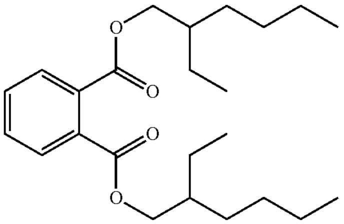 a-6 | 391 | 2 | 99 |

TABLE 1-continued

| Compound | Mw (calcu-lated) | Weight reduction rate from 30° C. to 190° C. | Weight reduction rate from 30° C. to 350° C. |
|---|---|---|---|
| 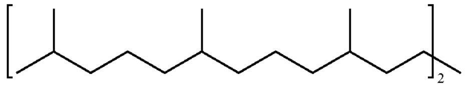 | | | |
| 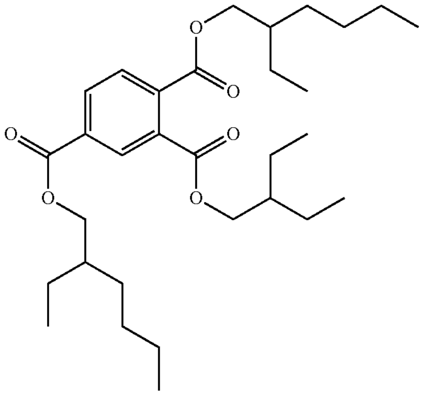 | 547 | 0 | 96 |
| a-7 | | | |
| a-8 | 423 | 1 | 100 |

[Resin for Forming Organic Film]

B1: Resin represented by the following formula (B-1)

B2: Resin represented by the following formula (B-2)

B3: Resin represented by the following formula (B-3)

B4: Resin represented by the following formula (B-4)

B5: Resin represented by the following formula (B-5)

B6: Resin represented by the following formula (B-6)

(B-1)

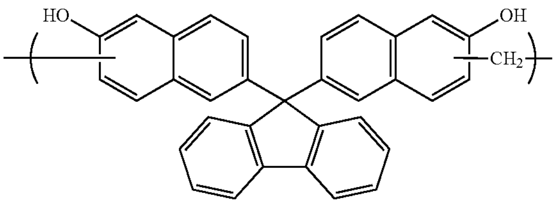

(B-2)

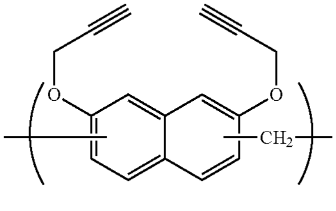

-continued (B-3)

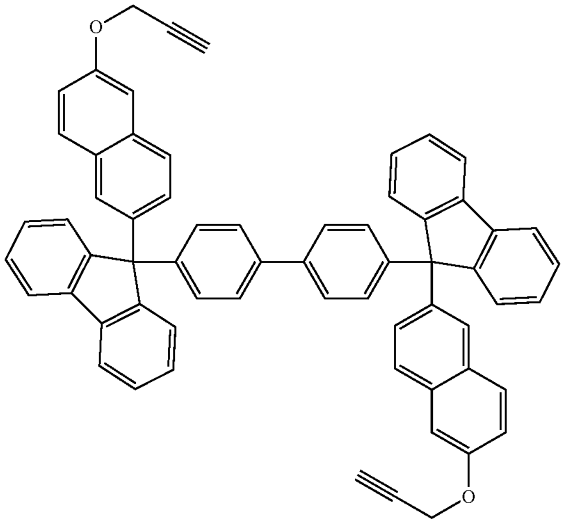

-continued (B-4)

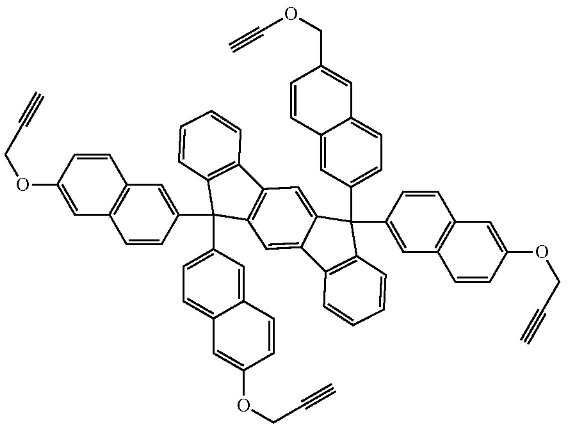

(B-5)

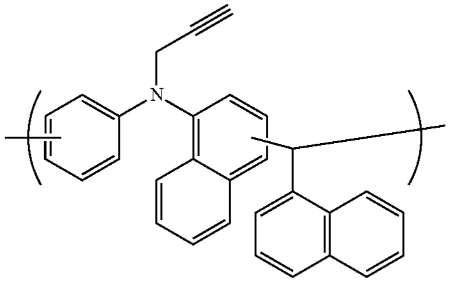

-continued (B-6)

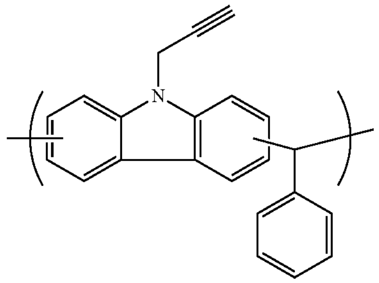

[Solvent]

C-1: Propylene glycol monomethyl ether acetate

C-2: Propylene glycol monoethyl ether

The planarizing agents for forming an organic film (A1) to (A12), the comparative additives (a1) to (a8), and the resins for forming an organic film (B1) to (B6) were dissolved in the solvent containing 0.5 mass % FC-4430 (manufactured by Sumitomo 3M Limited.) at a proportion shown in Table 2, and filtered through a 0.1-μm filter made of a fluororesin with to prepare each of organic film materials (compositions for forming an organic film: UDL-1 to 45 and Comparative UDL-1 to 17). Numbers in Table are based on parts by mass.

TABLE 2

| Composition for forming organic film | Resin for forming organic film: Kind | Resin for forming organic film: parts by mass | Planarizing agents for forming organic film: A1 | A2 | A3 | A4 | A5 | A6 | A7 | A8 | A9 | A10 | A11 | A12 |
|---|---|---|---|---|---|---|---|---|---|---|---|---|---|---|
| UDL-1 | B1 | 10 | | 10 | | | | | | | | | | |
| UDL-2 | B1 | 10 | | | | 10 | | | | | | | | |
| UDL-3 | B1 | 10 | | | | | | 10 | | | | | | |
| UDL-4 | B1 | 10 | | | | | | | | 10 | | | | |
| UDL-5 | B1 | 10 | | | | | | | | | 10 | | | |
| UDL-6 | B2 | 10 | | 10 | | | | | | | | | | |
| UDL-7 | B2 | 10 | | | | 10 | | | | | | | | |
| UDL-8 | B2 | 10 | | | | | | 10 | | | | | | |
| UDL-9 | B2 | 10 | | | | | | | | 10 | | | | |
| UDL-10 | B2 | 10 | | | | | | | | | 10 | | | |
| UDL-11 | B2 | 10 | | | | | | | | | | | | 10 |
| UDL-12 | B3 | 10 | 10 | | | | | | | | | | | |
| UDL-13 | B3 | 10 | | 10 | | | | | | | | | | |
| UDL-14 | B3 | 10 | | | 10 | | | | | | | | | |
| UDL-15 | B3 | 10 | | | | 10 | | | | | | | | |
| UDL-16 | B3 | 10 | | | | | 10 | | | | | | | |
| UDL-17 | B3 | 10 | | | | | | 10 | | | | | | |
| UDL-18 | B3 | 10 | | | | | | | 10 | | | | | |
| UDL-19 | B3 | 10 | | | | | | | | 10 | | | | |
| UDL-20 | B3 | 10 | | | | | | | | | 10 | | | |
| UDL-21 | B3 | 10 | | | | | | | | | | 10 | | |
| UDL-22 | B3 | 10 | | | | | | | | | | | 10 | |
| UDL-23 | B3 | 10 | | | | | | | | | | | | 10 |
| UDL-24 | B3 | 10 | | 10 | | | | | | | | | | |
| UDL-25 | B3 | 10 | | | | 10 | | | | | | | | |
| UDL-26 | B4 | 10 | | 10 | | | | | | | | | | |
| UDL-27 | B4 | 10 | | | | 10 | | | | | | | | |
| UDL-28 | B4 | 10 | | | | | | 10 | | | | | | |
| UDL-29 | B4 | 10 | | | | | | | | 10 | | | | |
| UDL-30 | B4 | 10 | | | | | | | | | 10 | | | |
| UDL-31 | B4 | 10 | | | | | | | | | | | | 10 |
| UDL-32 | B5 | 10 | | 10 | | | | | | | | | | |

TABLE 2-continued

| | | | | | | | | | |
|---|---|---|---|---|---|---|---|---|---|
| UDL-33 | B5 | 10 | | 10 | | | | | |
| UDL-34 | B5 | 10 | | | 10 | | | | |
| UDL-35 | B5 | 10 | | | | 10 | | | |
| UDL-36 | B5 | 10 | | | | | 10 | | |
| UDL-37 | B5 | 10 | | | | | | | 10 |
| UDL-38 | B5 | 10 | | | | | | 10 | |
| UDL-39 | B5 | 10 | | | | | | | 10 |
| UDL-40 | B6 | 10 | 10 | | | | | | |
| UDL-41 | B6 | 10 | | 10 | | | | | |
| UDL-42 | B6 | 10 | | | 10 | | | | |
| UDL-43 | B6 | 10 | | | | 10 | | | |
| UDL-44 | B6 | 10 | | | | | 10 | | |
| UDL-45 | B6 | 10 | | | | | | | 10 |
| Comparative UDL-1 | B1 | 10 | | | | | | | |
| Comparative UDL-2 | B2 | 10 | | | | | | | |
| Comparative UDL-3 | B3 | 10 | | | | | | | |
| Comparative UDL-4 | BA | 10 | | | | | | | |
| Comparative UDL-5 | B5 | 10 | | | | | | | |
| Comparative UDL-6 | B6 | 10 | | | | | | | |
| Comparative UDL-7 | B2 | 10 | | | | | | | |
| Comparative UDL-8 | BA | 10 | | | | | | | |
| Comparative UDL-9 | B4 | 10 | | | | | | | |
| Comparative UDL-10 | B6 | 10 | | | | | | | |
| Comparative UDL-11 | B6 | 10 | | | | | | | |
| Comparative UDL-12 | B6 | 10 | | | | | | | |
| Comparative UDL-13 | B6 | 10 | | | | | | | |
| Comparative UDL-14 | B6 | 10 | | | | | | | |
| Comparative UDL-15 | B6 | 10 | | | | | | | |
| Comparative UDL-16 | B6 | 10 | | | | | | | |
| Comparative UDL-17 | B6 | 10 | | | | | | | |

| Composition for forming organic film | Comparative additive | | | | | | | | Solvent 1 | | Solvent 2 | |
|---|---|---|---|---|---|---|---|---|---|---|---|---|
| | a1 | a2 | a3 | a4 | a5 | a6 | a7 | a8 | Kind | parts by mass | Kind | parts by mass |
| UDL-1 | | | | | | | | | C-1 | 80 | | |
| UDL-2 | | | | | | | | | C-1 | 80 | | |
| UDL-3 | | | | | | | | | C-1 | 80 | | |
| UDL-4 | | | | | | | | | C-1 | 80 | | |
| UDL-5 | | | | | | | | | C-1 | 80 | | |
| UDL-6 | | | | | | | | | C-1 | 80 | | |
| UDL-7 | | | | | | | | | C-1 | 80 | | |
| UDL-8 | | | | | | | | | C-1 | 80 | | |
| UDL-9 | | | | | | | | | C-1 | 80 | | |
| UDL-10 | | | | | | | | | C-1 | 80 | | |
| UDL-11 | | | | | | | | | C-1 | 80 | | |
| UDL-12 | | | | | | | | | C-1 | 80 | | |
| UDL-13 | | | | | | | | | C-1 | 80 | | |
| UDL-14 | | | | | | | | | C-1 | 80 | | |
| UDL-15 | | | | | | | | | C-1 | 80 | | |
| UDL-16 | | | | | | | | | C-1 | 80 | | |
| UDL-17 | | | | | | | | | C-1 | 80 | | |
| UDL-18 | | | | | | | | | C-1 | 80 | | |
| UDL-19 | | | | | | | | | C-1 | 80 | | |
| UDL-20 | | | | | | | | | C-1 | 80 | | |
| UDL-21 | | | | | | | | | C-1 | 80 | | |
| UDL-22 | | | | | | | | | C-1 | 80 | | |
| UDL-23 | | | | | | | | | C-1 | 80 | | |
| UDL-24 | | | | | | | | | C-1 | 56 | C-2 | 24 |
| UDL-25 | | | | | | | | | C-1 | 56 | C-2 | 24 |

TABLE 2-continued

| | | | | | | | | | | | | |
|---|---|---|---|---|---|---|---|---|---|---|---|---|
| UDL-26 | | | | | | | | | C-1 | 80 | | |
| UDL-27 | | | | | | | | | C-1 | 80 | | |
| UDL-28 | | | | | | | | | C-1 | 80 | | |
| UDL-29 | | | | | | | | | C-1 | 80 | | |
| UDL-30 | | | | | | | | | C-1 | 80 | | |
| UDL-31 | | | | | | | | | C-1 | 80 | | |
| UDL-32 | | | | | | | | | C-1 | 80 | | |
| UDL-33 | | | | | | | | | C-1 | 80 | | |
| UDL-34 | | | | | | | | | C-1 | 80 | | |
| UDL-35 | | | | | | | | | C-1 | 80 | | |
| UDL-36 | | | | | | | | | C-1 | 80 | | |
| UDL-37 | | | | | | | | | C-1 | 80 | | |
| UDL-38 | | | | | | | | | C-1 | 56 | C-2 | 24 |
| UDL-39 | | | | | | | | | C-1 | 56 | C-2 | 24 |
| UDL-40 | | | | | | | | | C-1 | 80 | | |
| UDL-41 | | | | | | | | | C-1 | 80 | | |
| UDL-42 | | | | | | | | | C-1 | 80 | | |
| UDL-43 | | | | | | | | | C-1 | 80 | | |
| UDL-44 | | | | | | | | | C-1 | 80 | | |
| UDL-45 | | | | | | | | | C-1 | 80 | | |
| Comparative UDL-1 | | | | | | | | | C-1 | 90 | | |
| Comparative UDL-2 | | | | | | | | | C-1 | 90 | | |
| Comparative UDL-3 | | | | | | | | | C-1 | 90 | | |
| Comparative UDL-4 | | | | | | | | | C-1 | 90 | | |
| Comparative UDL-5 | | | | | | | | | C-1 | 90 | | |
| Comparative UDL-6 | | | | | | | | | C-1 | 90 | | |
| Comparative UDL-7 | | | 10 | | | | | | C-1 | 80 | | |
| Comparative UDL-8 | 10 | | | | | | | | C-1 | 80 | | |
| Comparative UDL-9 | | 10 | | | | | | | C-1 | 80 | | |
| Comparative UDL-10 | 10 | | | | | | | | C-1 | 80 | | |
| Comparative UDL-11 | | 10 | | | | | | | C-1 | 80 | | |
| Comparative UDL-12 | | | 10 | | | | | | C-1 | 80 | | |
| Comparative UDL-13 | | | | 10 | | | | | C-1 | 80 | | |
| Comparative UDL-14 | | | | | 10 | | | | C-1 | 80 | | |
| Comparative UDL-15 | | | | | | 10 | | | C-1 | 80 | | |
| Comparative UDL-16 | | | | | | | 10 | | C-1 | 80 | | |
| Comparative UDL-17 | | | | | | | | 10 | C-1 | 80 | | |

Measurement of Solvent Resistance: Examples 1-1 to 1-45 and Comparative Examples 1-1 to 1-17

The compositions for forming an organic film (UDL-1 to 45 and Comparative UDL-1 to 17) prepared as above were each applied on a silicon substrate, and baked under the following condition by using a hot plate, and the film thickness was measured. A PGMEA solvent was dispensed on each film and allowed to stand for 30 seconds. The resultant was spin-dried and baked at 100° C. for 60 seconds to evaporate the PGMEA, and the film thickness was measured. The thickness before dispensing the PGMEA solvent was specified as X, the thickness after dispensing the PGMEA solvent was specified as $X_1$, and an absolute value of a value calculated by $(X_1-X)/X\times100$ was specified as a rate of change in the film thickness (%). A rate of change in the film thickness of less than 0.5% was evaluated as "Good", and that of 0.5% or more was evaluated as "Poor".

(Baking Condition)

Baking at 180° C. for 60 seconds (first baking) and subsequent baking at 350° C. for 60 seconds (second baking).

Measurement of In-Plane Uniformity: Examples 1-1 to 1-45 and Comparative Examples 1-1 to 1-17

The compositions for forming an organic film (UDL-1 to 45 and Comparative UDL-1 to 17) prepared as above were each applied on a silicon substrate, and baked under the above baking condition by using a hot plate, and the film thickness was measured. A maximum value of the film thickness $X_{max}$, a minimum value of the film thickness $X_{min}$, and an average film thickness $X_{average}$ were determined, and a value calculated by $(X_{max}-X_{min})/X_{average}$ was specified as the in-plane uniformity (%). An in-plane uniformity of less than 2% was evaluated as "Good", and that of 2% or more was evaluated as "Poor".

Evaluation of Filling: Examples 1-1 to 1-45 and Comparative Examples 1-1 to 1-17

As illustrated in FIG. 5, the compositions for forming an organic film were each applied on a $SiO_2$ wafer substrate having a dense hole pattern (hole diameter: 0.16 μm, hole depth: 0.50 μm, and distance between centers of adjacent two holes: 0.32 μm), and baked under the above baking condition to form an organic film 8. The used substrate was a base substrate ($SiO_2$ wafer substrate) 7 having the dense hole pattern as illustrated in FIG. 5(G) (overhead view) and FIG. 5(H) (sectional view). A sectional shape of the obtained each wafer substrate was observed by using a scanning electron microscope (SEM) to check whether voids (cavities) are absent inside the holes and are filled with the organic film. If a composition for forming an organic film having poor filling ability is used, voids are generated inside the holes. If a composition for forming an organic film having good filling ability is used, voids are absent inside the holes as illustrated in FIG. 5(I) and filled with the organic film in this evaluation. No void generation was evaluated as "Good", and void generation was evaluated as "Poor".

Evaluation of Defect after Application: Examples 1-1 to 1-45 and Comparative Examples 1-1 to 1-17

The compositions for forming an organic film (UDL-1 to 45 and Comparative UDL-1 to 17) prepared as above were each applied on a silicon substrate, baked under the above baking condition, and then a number of defects was determined by using SP5 (defect detecting device), manufactured by KLA-TENCOR Corporation. A number of defects of less than 30 was evaluated as "Good", and a number of defects of 30 or more was evaluated as "Poor".

TABLE 3

| | Composition for forming organic film | Solvent resistance | In-plane uniformity | Filling ability | Number of defects after application |
|---|---|---|---|---|---|
| Example 1-1 | UDL-1 | Good | Good | Good | Good |
| Example 1-2 | UDL-2 | Good | Good | Good | Good |
| Example 1-3 | UDL-3 | Good | Good | Good | Good |
| Example 1-4 | UDL-4 | Good | Good | Good | Good |
| Example 1-5 | UDL-5 | Good | Good | Good | Good |
| Example 1-6 | UDL-6 | Good | Good | Good | Good |
| Example 1-7 | UDL-7 | Good | Good | Good | Good |
| Example 1-8 | UDL-8 | Good | Good | Good | Good |
| Example 1-9 | UDL-9 | Good | Good | Good | Good |
| Example 1-10 | UDL-10 | Good | Good | Good | Good |
| Example 1-11 | UDL-11 | Good | Good | Good | Good |
| Example 1-12 | UDL-12 | Good | Good | Good | Good |
| Example 1-13 | UDL-13 | Good | Good | Good | Good |
| Example 1-14 | UDL-14 | Good | Good | Good | Good |
| Example 1-15 | UDL-15 | Good | Good | Good | Good |
| Example 1-16 | UDL-16 | Good | Good | Good | Good |
| Example 1-17 | UDL-17 | Good | Good | Good | Good |
| Example 1-18 | UDL-18 | Good | Good | Good | Good |
| Example 1-19 | UDL-19 | Good | Good | Good | Good |
| Example 1-20 | UDL-20 | Good | Good | Good | Good |
| Example 1-21 | UDL-21 | Good | Good | Good | Good |
| Example 1-22 | UDL-22 | Good | Good | Good | Good |
| Example 1-23 | UDL-23 | Good | Good | Good | Good |
| Example 1-24 | UDL-24 | Good | Good | Good | Good |
| Example 1-25 | UDL-25 | Good | Good | Good | Good |
| Example 1-26 | UDL-26 | Good | Good | Good | Good |
| Example 1-27 | UDL-27 | Good | Good | Good | Good |
| Example 1-28 | UDL-28 | Good | Good | Good | Good |
| Example 1-29 | UDL-29 | Good | Good | Good | Good |
| Example 1-30 | UDL-30 | Good | Good | Good | Good |
| Example 1-31 | UDL-31 | Good | Good | Good | Good |
| Example 1-32 | UDL-32 | Good | Good | Good | Good |

TABLE 3-continued

| | Composition for forming organic film | Solvent resistance | In-plane uniformity | Filling ability | Number of defects after application |
|---|---|---|---|---|---|
| Example 1-33 | UDL-33 | Good | Good | Good | Good |
| Example 1-34 | UDL-34 | Good | Good | Good | Good |
| Example 1-35 | UDL-35 | Good | Good | Good | Good |
| Example 1-36 | UDL-36 | Good | Good | Good | Good |
| Example 1-37 | UDL-37 | Good | Good | Good | Good |
| Example 1-38 | UDL-38 | Good | Good | Good | Good |
| Example 1-39 | UDL-39 | Good | Good | Good | Good |
| Example 1-40 | UDL-40 | Good | Good | Good | Good |
| Example 1-41 | UDL-41 | Good | Good | Good | Good |
| Example 1-42 | UDL-42 | Good | Good | Good | Good |
| Example 1-43 | UDL-43 | Good | Good | Good | Good |
| Example 1-44 | UDL-44 | Good | Good | Good | Good |
| Example 1-45 | UDL-45 | Good | Good | Good | Good |
| Comparative Example 1-1 | Comparative UDL-1 | Good | Good | Good | Good |
| Comparative Example 1-2 | Comparative UDL-2 | Good | Good | Good | Good |
| Comparative Example 1-3 | Comparative UDL-3 | Good | Good | Good | Good |
| Comparative Example 1-4 | Comparative UDL-4 | Good | Good | Good | Good |
| Comparative Example 1-5 | Comparative UDL-5 | Good | Good | Good | Good |
| Comparative Example 1-6 | Comparative UDL-6 | Good | Good | Good | Good |
| Comparative Example 1-7 | Comparative UDL-7 | Good | Good | Good | Good |
| Comparative Example 1-8 | Comparative UDL-8 | Good | Good | Good | Good |
| Comparative Example 1-9 | Comparative UDL-9 | Good | Good | Good | Good |
| Comparative Example 1-10 | Comparative UDL-10 | Good | Good | Good | Good |
| Comparative Example 1-11 | Comparative UDL-11 | Good | Good | Good | Good |
| Comparative Example 1-12 | Comparative UDL-12 | Good | Good | Good | Good |
| Comparative Example 1-13 | Comparative UDL-13 | Good | Good | Good | Good |
| Comparative Example 1-14 | Comparative UDL-14 | Good | Good | Good | Good |
| Comparative Example 1-15 | Comparative UDL-15 | Good | Good | Good | Poor |
| Comparative Example 1-16 | Comparative UDL-16 | Good | Poor | Good | Poor |
| Comparative Example 1-17 | Comparative UDL-17 | Dewetting occurred to fail to form a coating film | | | |

As shown in Table 3, the organic films (UDL-1 to 45) using the inventive planarizing agents for forming an organic film have been confirmed to be excellent in the solvent resistance, the in-plane uniformity, the filling ability, and the number of defects after application. Meanwhile, Comparative Examples 1-15 to 1-17, which included Comparative UDL-15 to 17 blending with the comparative additives a6 to a8 as the composition for forming an organic film out of the inventive range, yielded the poor evaluation result of the defect after application or failed to form a coating film. Thus, on Comparative UDL-15 to 17, the following evaluation was not performed. Comparative UDL-15, which is blended with the comparative additive a6, does not have the temperature range in which the complex viscosity is less than 1.0 Pa·s in a temperature range of 175° C. or higher.

Measurement of Complex Viscosity: Examples 2-1 to 2-45 and Comparative Examples 2-1 to 2-14

The complex viscosity of the above compositions for forming an organic film (UDL-1 to 45 and Comparative UDL-1 to 14) was measured by using MCR Rheometer MCR 302, manufactured by Anton Paar GmbH. When measured, the complex viscosity from 50° C. to 300° C. was measured by using a measurement tool with 20 mm in outer diameter, strain of 1%, frequency of 1 Hz, and heating rate of 5° C./min. FIG. 1 is a graph indicating the measurement result of the complex viscosity of the preliminary composition for forming an organic film (Comparative UDL-1), which contains no planarizing agent for forming an organic film. From the measurement result in FIG. 1, the complex viscosity within a range of the heating temperature of 50° C. to 74° C. was less than 1.0 Pa·s, and the viscosity was maintained to be relatively low. After the heating temperature exceeded 75° C., the complex viscosity exceeded 1.0 Pa·s and rapidly increased, and the thermal flowability was suggested to be lowered. FIG. 2 is a graph indicating the measurement result of the complex viscosity of the composition for forming an organic film (UDL-1). The complex viscosity was maintained to be relatively low of less than 1.0 Pa·s within the heating temperature of 50° C. to 179° C., and rapidly increased after the heating temperature exceeded 180° C. Since UDL-1 is obtained by blending Comparative UDL-1 with the planarizing agent A2 for forming an organic film, adding the planarizing agent A2 for forming an organic film generates the temperature range of 175° C. to 179° C. in which the complex viscosity is less than 1.0 Pa·s in a temperature range of 175° C. or higher by heating. Table 4 shows: the temperature range in which the complex viscosity of the compositions for forming an organic film (UDL-1) to (UDL-45) and (Comparative UDL-1) to (Comparative UDL-14) measured as above is less than 1.0 Pa·s; and the temperature range of 175° C. or higher in which the complex viscosity becomes less than 1.0 Pa·s by adding the planarizing agent for an organic film.

TABLE 4

| | Compositions for forming organic film | Temperature range in which complex viscosity is less than 1.0 Pa · s | Temperature range of 175° C. or higher in which complex viscosity becomes less than 1.0 Pa · s by adding planarizing agent for organic film |
|---|---|---|---|
| Example 2-1 | UDL-1 | up to 179° C. | 175 to 179° C. |
| Example 2-2 | UDL-2 | up to 177° C. | 175 to 177° C. |
| Example 2-3 | UDL-3 | up to 179° C. | 175 to 179° C. |
| Example 2-4 | UDL-4 | up to 177° C. | 175 to 177° C. |
| Example 2-5 | UDL-5 | up to 177° C. | 175 to 177° C. |
| Example 2-6 | UDL-6 | up to 192° C. | 175 to 192° C. |
| Example 2-7 | UDL-7 | up to 189° C. | 175 to 189° C. |
| Example 2-8 | UDL-8 | up to 195° C. | 175 to 195° C. |
| Example 2-9 | UDL-9 | up to 180° C. | 175 to 180° C. |
| Example 2-10 | UDL-10 | up to 182° C. | 175 to 182° C. |
| Example 2-11 | UDL-11 | up to 185° C. | 175 to 185° C. |
| Example 2-12 | UDL-12 | up to 179° C. | 175 to 179° C. |
| Example 2-13 | UDL-13 | up to 209° C. | 175 to 209° C. |
| Example 2-14 | UDL-14 | up to 179° C. | 175 to 179° C. |
| Example 2-15 | UDL-15 | up to 205° C. | 175 to 205° C. |
| Example 2-16 | UDL-16 | up to 206° C. | 175 to 206° C. |
| Example 2-17 | UDL-17 | up to 181° C. | 175 to 181° C. |
| Example 2-18 | UDL-18 | up to 206° C. | 175 to 206° C. |
| Example 2-19 | UDL-19 | up to 199° C. | 175 to 199° C. |
| Example 2-20 | UDL-20 | up to 203° C. | 175 to 203° C. |
| Example 2-21 | UDL-21 | up to 203° C. | 175 to 203° C. |
| Example 2-22 | UDL-22 | up to 201° C. | 175 to 201° C. |
| Example 2-23 | UDL-23 | up to 200° C. | 175 to 200° C. |
| Example 2-24 | UDL-24 | up to 205° C. | 175 to 205° C. |
| Example 2-25 | UDL-25 | up to 203° C. | 175 to 203° C. |
| Example 2-26 | UDL-26 | up to 207° C. | 175 to 207° C. |
| Example 2-27 | UDL-27 | up to 201° C. | 175 to 201° C. |
| Example 2-28 | UDL-28 | up to 208° C. | 175 to 208° C. |
| Example 2-29 | UDL-29 | up to 198° C. | 175 to 198° C. |
| Example 2-30 | UDL-30 | up to 202° C. | 175 to 202° C. |
| Example 2-31 | UDL-31 | up to 198° C. | 175 to 198° C. |
| Example 2-32 | UDL-32 | up to 194° C. | 175 to 194° C. |
| Example 2-33 | UDL-33 | up to 192° C. | 175 to 192° C. |
| Example 2-34 | UDL-34 | up to 197° C. | 175 to 197° C. |
| Example 2-35 | UDL-35 | up to 189° C. | 175 to 189° C. |
| Example 2-36 | UDL-36 | up to 189° C. | 175 to 189° C. |
| Example 2-37 | UDL-37 | up to 191° C. | 175 to 191° C. |
| Example 2-38 | UDL-38 | up to 192° C. | 175 to 192° C. |
| Example 2-39 | UDL-39 | up to 191° C. | 175 to 191° C. |
| Example 2-40 | UDL-40 | up to 201° C. | 175 to 201° C. |
| Example 2-41 | UDL-41 | up to 198° C. | 175 to 198° C. |
| Example 2-42 | UDL-42 | up to 202° C. | 175 to 202° C. |
| Example 2-43 | UDL-43 | up to 196° C. | 175 to 196° C. |
| Example 2-44 | UDL-44 | up to 199° C. | 175 to 199° C. |
| Example 2-45 | UDL-45 | up to 196° C. | 175 to 196° C. |
| Comparative Example 2-1 | Comparative UDL-1 | up to 74° C. | — |
| Comparative Example 2-2 | Comparative UDL-2 | up to 75° C. | — |
| Comparative Example 2-3 | Comparative UDL-3 | up to 72° C. | — |

TABLE 4-continued

| | Compositions for forming organic film | Temperature range in which complex viscosity is less than 1.0 Pa · s | Temperature range of 175° C. or higher in which complex viscosity becomes less than 1.0 Pa · s by adding planarizing agent for organic film |
|---|---|---|---|
| Comparative Example 2-4 | Comparative UDL-4 | up to 72° C. | — |
| Comparative Example 2-5 | Comparative UDL-5 | up to 73° C. | — |
| Comparative Example 2-6 | Comparative UDL-6 | up to 75° C. | — |
| Comparative Example 2-7 | Comparative UDL-7 | up to 157° C. | Absent |
| Comparative Example 2-8 | Comparative UDL-8 | up to 127° C. | Absent |
| Comparative Example 2-9 | Comparative UDL-9 | up to 157° C. | Absent |
| Comparative Example 2-10 | Comparative UDL-10 | up to 123° C. | Absent |
| Comparative Example 2-11 | Comparative UDL-11 | up to 150° C. | Absent |
| Comparative Example 2-12 | Comparative UDL-12 | up to 171° C. | Absent |
| Comparative Example 2-13 | Comparative UDL-13 | up to 170° C. | Absent |
| Comparative Example 2-14 | Comparative UDL-14 | up to 150° C. | Absent |

As shown in Table 4, the inventive planarizing agent for forming an organic film generates the temperature range in which the complex viscosity is less than 1.0 Pa·s within a temperature range of 175° C. or higher.

Evaluation of Planarizing Ability: Examples 3-1 to 3-46 and Comparative Examples 3-1 to 3-14

Each of the above compositions for forming an organic film (UDL-1 to 45 and Comparative UDL-1 to 14) was applied on a base substrate 9 ($SiO_2$ wafer substrate) having a giant isolated trench pattern (FIG. 6(J), trench width: 50 μm, trench depth: 0.115 μm). The composition was baked under a baking condition shown in Table 5, and then a step on an organic film 10 between the trenched portion and the non-trenched portion (delta 10 in FIG. 6(K)) was observed by using Alpha-Step D-600 (contact profiler), manufactured by KLA-TENCOR Corporation. Table 5 shows the results. In this evaluation, the smaller the step, the better the planarizing ability. In this evaluation, the trench pattern with 0.115 μm (115 nm) in depth is planarized using the composition for forming an organic film by forming the organic film having a typical film thickness of approximately 0.2 μm (200 nm), which is a special and strict evaluation condition to evaluate relative planarizing ability.

TABLE 5

| | Compositions for forming organic film | First baking condition | Second baking condition | Step (nm) |
|---|---|---|---|---|
| Example 3-1 | UDL-1 | 180° C. for 60 sec. | 350° C. for 60 sec. | 100 |
| Example 3-2 | UDL-2 | 180° C. for 60 sec. | 350° C. for 60 sec. | 100 |
| Example 3-3 | UDL-3 | 180° C. for 60 sec. | 350° C. for 60 sec. | 100 |
| Example 3-4 | UDL-4 | 180° C. for 60 sec. | 350° C. for 60 sec. | 100 |
| Example 3-5 | UDL-5 | 180° C. for 60 sec. | 350° C. for 60 sec. | 100 |
| Example 3-6 | UDL-6 | 180° C. for 60 sec. | 350° C. for 60 sec. | 90 |

TABLE 5-continued

| | Compositions for forming organic film | First baking condition | Second baking condition | Step (nm) |
|---|---|---|---|---|
| Example 3-7 | UDL-7 | 180° C. for 60 sec. | 350° C. for 60 sec. | 95 |
| Example 3-8 | UDL-8 | 180° C. for 60 sec. | 350° C. for 60 sec. | 90 |
| Example 3-9 | UDL-9 | 180° C. for 60 sec. | 350° C. for 60 sec. | 100 |
| Example 3-10 | UDL-10 | 180° C. for 60 sec. | 350° C. for 60 sec. | 100 |
| Example 3-11 | UDL-11 | 180° C. for 60 sec. | 350° C. for 60 sec. | 95 |
| Example 3-12 | UDL-12 | 180° C. for 60 sec. | 350° C. for 60 sec. | 100 |
| Example 3-13 | UDL-13 | 180° C. for 60 sec. | 350° C. for 60 sec. | 80 |
| Example 3-14 | UDL-14 | 180° C. for 60 sec. | 350° C. for 60 sec. | 105 |
| Example 3-15 | UDL-15 | 180° C. for 60 sec. | 350° C. for 60 sec. | 80 |
| Example 3-16 | UDL-16 | 180° C. for 60 sec. | 350° C. for 60 sec. | 80 |
| Example 3-17 | UDL-17 | 180° C. for 60 sec. | 350° C. for 60 sec. | 100 |
| Example 3-18 | UDL-18 | 180° C. for 60 sec. | 350° C. for 60 sec. | 80 |
| Example 3-19 | UDL-19 | 180° C. for 60 sec. | 350° C. for 60 sec. | 85 |
| Example 3-20 | UDL-20 | 180° C. for 60 sec. | 350° C. for 60 sec. | 80 |
| Example 3-21 | UDL-21 | 180° C. for 60 sec. | 350° C. for 60 sec. | 80 |
| Example 3-22 | UDL-22 | 180° C. for 60 sec. | 350° C. for 60 sec. | 85 |
| Example 3-23 | UDL-23 | 180° C. for 60 sec. | 350° C. for 60 sec. | 85 |
| Example 3-24 | UDL-24 | 180° C. for 60 sec. | 350° C. for 60 sec. | 80 |
| Example 3-25 | UDL-25 | 180° C. for 60 sec. | 350° C. for 60 sec. | 80 |
| Example 3-26 | UDL-26 | 180° C. for 60 sec. | 350° C. for 60 sec. | 80 |
| Example 3-27 | UDL-27 | 180° C. for 60 sec. | 350° C. for 60 sec. | 85 |
| Example 3-28 | UDL-28 | 180° C. for 60 sec. | 350° C. for 60 sec. | 80 |
| Example 3-29 | UDL-29 | 180° C. for 60 sec. | 350° C. for 60 sec. | 85 |
| Example 3-30 | UDL-30 | 180° C. for 60 sec. | 350° C. for 60 sec. | 85 |
| Example 3-31 | UDL-31 | 180° C. for 60 sec. | 350° C. for 60 sec. | 85 |
| Example 3-32 | UDL-32 | 180° C. for 60 sec. | 350° C. for 60 sec. | 90 |
| Example 3-33 | UDL-33 | 180° C. for 60 sec. | 350° C. for 60 sec. | 90 |
| Example 3-34 | UDL-34 | 180° C. for 60 sec. | 350° C. for 60 sec. | 85 |
| Example 3-35 | UDL-35 | 180° C. for 60 sec. | 350° C. for 60 sec. | 95 |
| Example 3-36 | UDL-36 | 180° C. for 60 sec. | 350° C. for 60 sec. | 95 |
| Example 3-37 | UDL-37 | 180° C. for 60 sec. | 350° C. for 60 sec. | 90 |
| Example 3-38 | UDL-38 | 180° C. for 60 sec. | 350° C. for 60 sec. | 90 |
| Example 3-39 | UDL-39 | 180° C. for 60 sec. | 350° C. for 60 sec. | 90 |
| Example 3-40 | UDL-40 | 180° C. for 60 sec. | 350° C. for 60 sec. | 85 |
| Example 3-41 | UDL-41 | 180° C. for 60 sec. | 350° C. for 60 sec. | 85 |
| Example 3-42 | UDL-42 | 180° C. for 60 sec. | 350° C. for 60 sec. | 85 |
| Example 3-43 | UDL-43 | 180° C. for 60 sec. | 350° C. for 60 sec. | 90 |
| Example 3-44 | UDL-44 | 180° C. for 60 sec. | 350° C. for 60 sec. | 85 |

TABLE 5-continued

| | Compositions for forming organic film | First baking condition | Second baking condition | Step (nm) |
|---|---|---|---|---|
| Example 3-45 | UDL-45 | 180° C. for 60 sec. | 350° C. for 60 sec. | 90 |
| Example 3-46 | UDL-45 | 350° C. for 60 sec. | — | 95 |
| Comparative Example 3-1 | Comparative UDL-1 | 180° C. for 60 sec. | 350° C. for 60 sec. | 120 |
| Comparative Example 3-2 | Comparative UDL-2 | 180° C. for 60 sec. | 350° C. for 60 sec. | 120 |
| Comparative Example 3-3 | Comparative UDL-3 | 180° C. for 60 sec. | 350° C. for 60 sec. | 115 |
| Comparative Example 3-4 | Comparative UDL-4 | 180° C. for 60 sec. | 350° C. for 60 sec. | 115 |
| Comparative Example 3-5 | Comparative UDL-5 | 180° C. for 60 sec. | 350° C. for 60 sec. | 120 |
| Comparative Example 3-6 | Comparative UDL-6 | 180° C. for 60 sec. | 350° C. for 60 sec. | 120 |
| Comparative Example 3-7 | Comparative UDL-7 | 180° C. for 60 sec. | 350° C. for 60 sec. | 120 |
| Comparative Example 3-8 | Comparative UDL-8 | 180° C. for 60 sec. | 350° C. for 60 sec. | 115 |
| Comparative Example 3-9 | Comparative UDL-9 | 180° C. for 60 sec. | 350° C. for 60 sec. | 115 |
| Comparative Example 3-10 | Comparative UDL-10 | 180° C. for 60 sec. | 350° C. for 60 sec. | 120 |
| Comparative Example 3-11 | Comparative UDL-11 | 180° C. for 60 sec. | 350° C. for 60 sec. | 120 |
| Comparative Example 3-12 | Comparative UDL-12 | 180° C. for 60 sec. | 350° C. for 60 sec. | 120 |
| Comparative Example 3-13 | Comparative UDL-13 | 180° C. for 60 sec. | 350° C. for 60 sec. | 120 |
| Comparative Example 3-14 | Comparative UDL-14 | 180° C. for 60 sec. | 350° C. for 60 sec. | 120 |

As shown in Table 5, Examples 3-1 to 3-46, which use the inventive compositions for forming an organic film (UDL-1 to 45), have a smaller step of the organic film between the trenched portion and the non-trenched portion than Comparative Examples 3-1 to 3-14, which use the comparative compositions for forming an organic film (Comparative UDL-1 to 14). It is found that Examples have excellent planarizing ability.

Pattern-Forming Test: Examples 4-1 to 4-46

Each of the above compositions for forming an organic film (UDL-1 to 45) was applied on a $SiO_2$ wafer substrate having a trench pattern (trench width: 10 μm, trench depth: 0.1 μm). The composition was baked under a baking condition shown in Table 8 to form an organic film. The following silicon-containing resist intermediate film material (SOG 1) was applied thereon, and baked at 200° C. for 60 seconds to form a silicon-containing resist intermediate film having a film thickness of 35 nm. The following single-layer resist for ArF was applied thereon as a resist upper layer film material, and baked at 105° C. for 60 seconds to form a photoresist film having a film thickness of 100 nm. The following protective film material for immersion (TC-1) was applied on the photoresist film, and baked at 90° C. for 60 seconds to form a protective film having a film thickness of 50 nm.

Prepared as the silicon-containing resist intermediate film material (SOG 1) was a 2% solution of the following polymer in propylene glycol ethyl ether.

SOG1

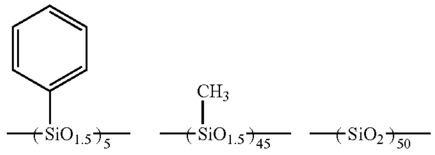

The resist upper layer film material (single layer resist for ArF) was prepared by: dissolving a polymer (RP 1), an acid generator (PAG 1), and a basic compound (Amine 1) in a solvent containing 0.1 mass % of FC-430 (manufactured by Sumitomo 3M Limited.) at a proportion shown in Table 6; and filtering the solution through a 0.1-μm filter made of a fluororesin.

TABLE 6

| | Polymer (parts by mass) | Acid generator (parts by mass) | Basic compound (parts by mass) | Solvent (parts by mass) |
|---|---|---|---|---|
| Single-layer resist for ArF | RP 1 (100) | PAG 1 (6.6) | Amine 1 (0.8) | PGMEA (2500) |

The polymer (RP 1), the acid generator (PAG 1), and the basic compound (Amine 1) are shown as follows.

RP1

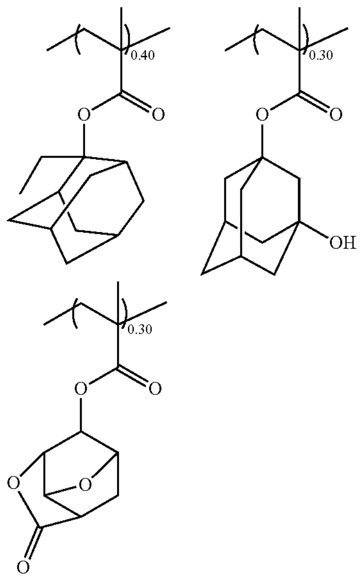

Mw7,800

-continued

PAG1

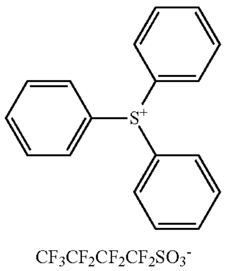

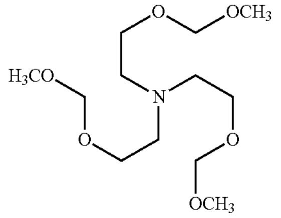

Amine1

The protective film material for immersion (TC-1) was prepared by: dissolving a polymer (PP 1) in an organic solvent at a proportion shown in Table 7; and filtering the solution through a 0.1-μm filter made of a fluororesin.

TABLE 7

| | Polymer (parts by mass) | Organic solvent (parts by mass) |
|---|---|---|
| TC-1 | PP 1 (100) | Diisoamyl ether (2700) 2-Methyl-1-butanol (270) |

The polymer (PP 1) is shown as follows.

PP1

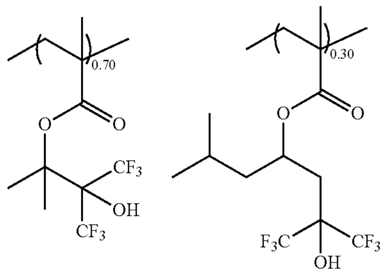

Mw8,800 Mw/Mn1.69

Then, the film was exposed by using an ArF immersion exposure device (manufactured by NIKON CORPORATION; NSR-S610C, NA 1.30, σ 0.98/0.65, 35°-dipole s-polarized illumination, 6% halftone phase-shifting mask), baked at 100° C. for 60 seconds (PEB), and developed with 2.38 mass % aqueous solution of tetramethylammonium hydroxide (TMAH) for 30 seconds to obtain a positive line-and-space pattern of 1:1 with 55 nm (resist upper layer film pattern).

Then, while using the resist upper layer film pattern as a mask, the silicon-containing resist intermediate film was processed by dry etching (pattern-transferred) using an etching apparatus "Telius", manufactured by Tokyo Electron Ltd. While using the obtained silicon-containing resist intermediate film pattern as a mask, the organic film was processed by dry etching (pattern-transferred). While using the obtained organic film pattern as a mask, the $SiO_2$ wafer substrate ($SiO_2$ film) was processed by dry etching (pattern-transferred). The etching condition was as follows.

(Transferring Condition of Resist Upper Layer Film Pattern to Silicon-Containing Resist Intermediate Film)

Chamber pressure: 10.0 Pa
RF power: 1,500 W
$CF_4$ gas flow rate: 75 mL/min.
$O_2$ gas flow rate: 15 mL/min.
Time: 15 sec.

(Transferring Condition of Silicon-Containing Resist Intermediate Film Pattern to Organic Film)

Chamber pressure: 2.0 Pa
RF power: 500 W
Ar gas flow rate: 75 mL/min.
$O_2$ gas flow rate: 45 mL/min.
Time: 120 sec.

(Transferring Condition of Organic Film Pattern to $SiO_2$ Wafer Substrate)

Chamber pressure: 2.0 Pa
RF power: 2,200 W
$C_5F_{12}$ gas flow rate: 20 mL/min.
$C_2F_6$ gas flow rate: 10 mL/min.
Ar gas flow rate: 300 mL/min.
$O_2$ gas flow rate: 60 mL/min.
Time: 90 sec.

Table 8 shows the result of observing a cross section of the obtained pattern with an electron microscope (S-4700), manufactured by Hitachi, Ltd.

TABLE 8

| | Compositions for forming organic film | First baking condition | Second baking condition | Geometry after substrate etching and transferring |
|---|---|---|---|---|
| Example 4-1 | UDL-1 | 180° C. for 60 sec. | 350° C. for 60 sec. | Vertical |
| Example 4-2 | UDL-2 | 180° C. for 60 sec. | 350° C. for 60 sec. | Vertical |
| Example 4-3 | UDL-3 | 180° C. for 60 sec. | 350° C. for 60 sec. | Vertical |
| Example 4-4 | UDL-4 | 180° C. for 60 sec. | 350° C. for 60 sec. | Vertical |
| Example 4-5 | UDL-5 | 180° C. for 60 sec. | 350° C. for 60 sec. | Vertical |
| Example 4-6 | UDL-6 | 180° C. for 60 sec. | 350° C. for 60 sec. | Vertical |
| Example 4-7 | UDL-7 | 180° C. for 60 sec. | 350° C. for 60 sec. | Vertical |
| Example 4-8 | UDL-8 | 180° C. for 60 sec. | 350° C. for 60 sec. | Vertical |
| Example 4-9 | UDL-9 | 180° C. for 60 sec. | 350° C. for 60 sec. | Vertical |
| Example 4-10 | UDL-10 | 180° C. for 60 sec. | 350° C. for 60 sec. | Vertical |
| Example 4-11 | UDL-11 | 180° C. for 60 sec. | 350° C. for 60 sec. | Vertical |
| Example 4-12 | UDL-12 | 180° C. for 60 sec. | 350° C. for 60 sec. | Vertical |
| Example 4-13 | UDL-13 | 180° C. for 60 sec. | 350° C. for 60 sec. | Vertical |
| Example 4-14 | UDL-14 | 180° C. for 60 sec. | 350° C. for 60 sec. | Vertical |

TABLE 8-continued

| | Compositions for forming organic film | First baking condition | Second baking condition | Geometry after substrate etching and transferring |
|---|---|---|---|---|
| Example 4-15 | UDL-15 | 180° C. for 60 sec. | 350° C. for 60 sec. | Vertical |
| Example 4-16 | UDL-16 | 180° C. for 60 sec. | 350° C. for 60 sec. | Vertical |
| Example 4-17 | UDL-17 | 180° C. for 60 sec. | 350° C. for 60 sec. | Vertical |
| Example 4-18 | UDL-18 | 180° C. for 60 sec. | 350° C. for 60 sec. | Vertical |
| Example 4-19 | UDL-19 | 180° C. for 60 sec. | 350° C. for 60 sec. | Vertical |
| Example 4-20 | UDL-20 | 180° C. for 60 sec. | 350° C. for 60 sec. | Vertical |
| Example 4-21 | UDL-21 | 180° C. for 60 sec. | 350° C. for 60 sec. | Vertical |
| Example 4-22 | UDL-22 | 180° C. for 60 sec. | 350° C. for 60 sec. | Vertical |
| Example 4-23 | UDL-23 | 180° C. for 60 sec. | 350° C. for 60 sec. | Vertical |
| Example 4-24 | UDL-24 | 180° C. for 60 sec. | 350° C. for 60 sec. | Vertical |
| Example 4-25 | UDL-25 | 180° C. for 60 sec. | 350° C. for 60 sec. | Vertical |
| Example 4-26 | UDL-26 | 180° C. for 60 sec. | 350° C. for 60 sec. | Vertical |
| Example 4-27 | UDL-27 | 180° C. for 60 sec. | 350° C. for 60 sec. | Vertical |
| Example 4-28 | UDL-28 | 180° C. for 60 sec. | 350° C. for 60 sec. | Vertical |
| Example 4-29 | UDL-29 | 180° C. for 60 sec. | 350° C. for 60 sec. | Vertical |
| Example 4-30 | UDL-30 | 180° C. for 60 sec. | 350° C. for 60 sec. | Vertical |
| Example 4-31 | UDL-31 | 180° C. for 60 sec. | 350° C. for 60 sec. | Vertical |
| Example 4-32 | UDL-32 | 180° C. for 60 sec. | 350° C. for 60 sec. | Vertical |
| Example 4-33 | UDL-33 | 180° C. for 60 sec. | 350° C. for 60 sec. | Vertical |
| Example 4-34 | UDL-34 | 180° C. for 60 sec. | 350° C. for 60 sec. | Vertical |
| Example 4-35 | UDL-35 | 180° C. for 60 sec. | 350° C. for 60 sec. | Vertical |
| Example 4-36 | UDL-36 | 180° C. for 60 sec. | 350° C. for 60 sec. | Vertical |
| Example 4-37 | UDL-37 | 180° C. for 60 sec. | 350° C. for 60 sec. | Vertical |
| Example 4-38 | UDL-38 | 180° C. for 60 sec. | 350° C. for 60 sec. | Vertical |
| Example 4-39 | UDL-39 | 180° C. for 60 sec. | 350° C. for 60 sec. | Vertical |
| Example 4-40 | UDL-40 | 180° C. for 60 sec. | 350° C. for 60 sec. | Vertical |
| Example 4-41 | UDL-41 | 180° C. for 60 sec. | 350° C. for 60 sec. | Vertical |
| Example 4-42 | UDL-42 | 180° C. for 60 sec. | 350° C. for 60 sec. | Vertical |
| Example 4-43 | UDL-43 | 180° C. for 60 sec. | 350° C. for 60 sec. | Vertical |
| Example 4-44 | UDL-44 | 180° C. for 60 sec. | 350° C. for 60 sec. | Vertical |
| Example 4-45 | UDL-45 | 180° C. for 60 sec. | 350° C. for 60 sec. | Vertical |
| Example 4-46 | UDL-45 | 350° C. for 60 sec. | — | Vertical |

As shown in Table 8, in any of Examples 4-1 to 4-46, which uses the inventive compositions for forming an organic film (UDL-1 to 45), the resist upper layer film pattern is finally and favorably transferred to the $SiO_2$ wafer substrate. It has been confirmed that the inventive composition for forming an organic film is suitably used for fine processing with the multilayer resist method even on the stepped substrate.

From the above, it has been revealed that the inventive composition for forming an organic film containing the inventive planarizing agent for forming an organic film has the excellent planarizing ability, and thereby the inventive composition is extremely useful as the organic film material used for the multilayer resist process. It has been also revealed that the inventive patterning process using the above inventive composition can form a fine pattern with high precision even on a substrate with a body to be processed having a step.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A composition for forming an organic film, comprising:

a resin for forming an organic film;

a planarizing agent for forming an organic film; and a solvent, wherein the resin for forming an organic film has at least one aromatic skeleton, wherein the planarizing agent for forming an organic film, consists of at least one aromatic-group-containing compound having a molecular weight represented by a molecular formula of 200 to 500, wherein the composition for forming an organic film is a blended composition formed by blending a preliminary composition containing the resin for forming an organic film and the solvent, with the planarizing agent for forming an organic film, wherein the preliminary composition has a complex viscosity of 1.0 Pa·3 s or more in a temperature range of 175° C. or higher, and the blended composition has a complex viscosity of less than 1.0 Pa·s in a temperature range of 175° C. or higher; and wherein the planarizing agent for forming an organic film is one or more compounds selected from the general formulae (I) or (II), (I)

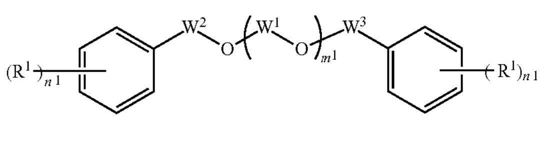

wherein $R^1$ each independently represents a hydrogen atom, a hydroxy group, or an optionally substituted organic group having 1 to 10 carbon atoms: $W^1$ represents a phenylene group or a divalent group represented by the following general formula (I-1); $W^2$ and $W^3$ represent a single bond or any one divalent group represented by the following general formula (I-2); $m^1$ represents an integer of 2 to 10: and $n^1$ each independently represents an integer of 0 to 5; and when $W^2$ and $W^3$ are both carbonyl groups in the formula (I-2), $W^1$ represents a phenylene group and $m^1$ is 2 or 3, (I-1)

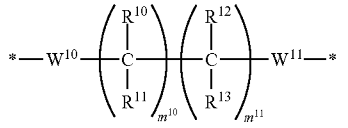

wherein “*” represents a bonding position; $R^{10}$, $R^{11}$, $R^{12}$, and $R^{13}$ represent a hydrogen atom, a hydroxy group, or an organic group having 1 to 10 carbon atoms; $W^{10}$ and $W^{11}$ each independently represent a single bond or a carbonyl group; $m^{10}$ and $m^{11}$ represent an integer of 0 to 10, and $m^{10}+m^{11}\geq 1$, (I-2)

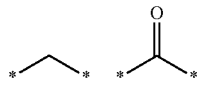

wherein “*” represents a bonding position, (II)

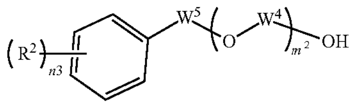

wherein $R^2$ each independently represents a hydrogen atom or an optionally substituted organic group having 1 to 10 carbon atoms; $W^4$ represents a divalent group represented by the following general formula (II-1); W5 represents a single bond or any one divalent group represented by the following general formula (II-2); $m^2$ represents an integer of 5 to 10; and $n^3$ represents an integer of 0 to 5, (II-1)

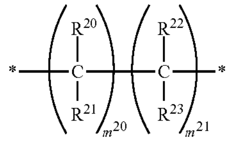

wherein “*” represents a bonding position; $R^{20}$, $R^{21}$, $R^{22}$, and $R^{23}$ represent a hydrogen atom, a hydroxy group, or an organic group having 1 to 10 carbon atoms; $m^{20}$ and $m^{21}$ represent an integer of 0 to 10; and $m^{20}+m^{21}\geq 1$, (II-2)

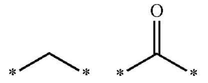

wherein “** represents a bonding position.

2. The composition for forming an organic film according to claim 1, wherein the resin for forming an organic film has at least one aromatic skeleton selected from the group consisting of benzene, naphthalene, and fluorene.

3. A method for forming an organic film functioning as an organic planarizing film used in a semiconductor device manufacturing process, comprising:

applying the composition for forming an organic film according to claim 1 on a substrate to be processed by spin-coating; and heat-treating the substrate coated with the composition for forming an organic film within a range of a temperature of 100° C. or higher and 600° C. or lower for 10 to 600 seconds to form a cured film.

4. A method for forming an organic film functioning as an organic planarizing film used in a semiconductor device manufacturing process, comprising:

applying the composition for forming an organic film according to claim 1 on a substrate to be processed by spin-coating;

heat-treating the substrate coated with the composition for forming an organic film within a range of a temperature of 100° C. or higher and 350° C. or lower for 10 to 600 seconds; and further heat-treating the substrate within a range of a temperature of 100° C. or higher and 600° C. or lower for 10 to 600 seconds to form a cured film.

5. The method for forming an organic film according to claim 3, wherein a substrate to be processed having a structure or step with 20 nm or more in height is used as the substrate to be processed.

6. A patterning process comprising:

forming an organic film on a body to be processed by using the composition for forming an organic film according to claim 1;

forming a resist intermediate film on the organic film by using a resist intermediate film material having a silicon atom;

forming a resist upper layer film on the resist intermediate film by using a resist upper layer film material composed of a photoresist composition;

forming a circuit pattern in the resist upper layer film;

transferring the pattern to the resist intermediate film by etching while using the resist upper layer film having the formed circuit pattern as a mask;

transferring the pattern to the organic film by etching while using the resist intermediate film having the transferred pattern as a mask; and further transferring the pattern to the body to be processed by etching while using the organic film having the transferred pattern as a mask.

7. A patterning process comprising:

forming an organic film on a body to be processed by using the composition for forming an organic film according to claim 1;

forming a resist intermediate film on the organic film by using a resist intermediate film material having a silicon atom;

forming an organic anti-reflective film or an adhesive film on the resist intermediate film;

forming a resist upper layer film on the organic anti-reflective film or the adhesive film by using a resist upper layer film material composed of a photoresist composition;

forming a circuit pattern in the resist upper layer film;

transferring the pattern to the organic anti-reflective film or the adhesive film, and the resist intermediate film by etching while using the resist upper layer film having the formed circuit pattern as a mask;

transferring the pattern to the organic film by etching while using the resist intermediate film having the transferred pattern as a mask; and further transferring the pattern to the body to be processed by etching while using the organic film having the transferred pattern as a mask.

8. A patterning process comprising:

forming an organic film on a body to be processed by using the composition for forming an organic film according to claim 1;

forming an inorganic hard mask selected from a silicon oxide film, a silicon nitride film, and a silicon oxynitride film on the organic film;

forming a resist upper layer film on the inorganic hard mask by using a resist upper layer film material composed of a photoresist composition;

forming a circuit pattern in the resist upper layer film;

transferring the pattern to the inorganic hard mask by etching while using the resist upper layer film having the formed circuit pattern as a mask;

transferring the pattern to the organic film by etching while using the inorganic hard mask having the transferred pattern as a mask; and further transferring the pattern to the body to be processed by etching while using the organic film having the transferred pattern as a mask.

9. A patterning process comprising:

forming an organic film on a body to be processed by using the composition for forming an organic film according to claim 1;

forming an inorganic hard mask selected from a silicon oxide film, a silicon nitride film, and a silicon oxynitride film on the organic film;

forming an organic anti-reflective film or an adhesive film on the inorganic hard mask;

forming a resist upper layer film on the organic anti-reflective film or the adhesive film by using a resist upper layer film material composed of a photoresist composition;

forming a circuit pattern in the resist upper layer film;

transferring the pattern to the organic anti-reflective film or the adhesive film, and the inorganic hard mask by etching while using the resist upper layer film having the formed circuit pattern as a mask;

transferring the pattern to the organic film by etching while using the inorganic hard mask having the transferred pattern as a mask; and further transferring the pattern to the body to be processed by etching while using the organic film having the transferred pattern as a mask.

10. The patterning process according to claim 8, wherein the inorganic hard mask is formed by a CVD method or an ALD method.

11. The patterning process according to claim 6, wherein the circuit pattern is formed by a lithography using light having a wavelength of 10 nm or more and 300 nm or less, a direct writing with electron beam, nanoimprinting, or a combination thereof.

12. The patterning process according to claim 6, wherein the circuit pattern is developed with an alkaline development or an organic solvent.

13. The patterning process according to claim 6, wherein the body to be processed is a semiconductor device substrate or a film formed on the semiconductor device substrate which is any of a metal film, a metal carbide film, a metal oxide film, a metal nitride film, a metal oxycarbide film, and a metal oxynitride film.

14. The patterning process according to claim 13, wherein a metal constituting the body to be processed is silicon, titanium, tungsten, hafnium, zirconium, chromium, germanium, copper, silver, gold, aluminum, indium, gallium, arsenic, palladium, iron, tantalum, iridium, molybdenum, or an alloy thereof.

* * * * *